(12) United States Patent
Mori et al.

(10) Patent No.: US 9,793,080 B2
(45) Date of Patent: Oct. 17, 2017

(54) ELECTROMECHANICAL POWER SWITCH INTEGRATED CIRCUITS AND DEVICES AND METHODS THEREOF

(71) Applicant: INOSO, LLC, Austin, TX (US)

(72) Inventors: Kiyoshi Mori, Missouri City, TX (US); Ziep Tran, Austin, TX (US); Giang Trung Dao, Milpitas, CA (US); Michael Edward Ramon, Austin, TX (US)

(73) Assignee: INOSO, LLC, Austin, TX (US)

( * ) Notice: Subject to any disclaimer, the term of this patent is extended or adjusted under 35 U.S.C. 154(b) by 0 days.

(21) Appl. No.: 15/240,799

(22) Filed: Aug. 18, 2016

(65) Prior Publication Data
US 2017/0053764 A1   Feb. 23, 2017

Related U.S. Application Data

(60) Provisional application No. 62/206,712, filed on Aug. 18, 2015, provisional application No. 62/328,525, filed on Apr. 27, 2016.

(51) Int. Cl.
*B81B 3/00* (2006.01)
*H01H 59/00* (2006.01)
(Continued)

(52) U.S. Cl.
CPC ....... *H01H 59/0009* (2013.01); *B81B 3/0086* (2013.01); *H01H 1/0094* (2013.01); *H01H 49/00* (2013.01)

(58) Field of Classification Search
CPC ............ B81C 1/00246; H01H 59/0009; H01H 2001/0063
See application file for complete search history.

(56) References Cited

U.S. PATENT DOCUMENTS 6,833,597 B2   12/2004   Blasko, III
7,618,837 B2   11/2009   Yan
(Continued)

FOREIGN PATENT DOCUMENTS

CN   WO 2012094946 A1 *  7/2012   ............. H03K 19/20

OTHER PUBLICATIONS

Nathanael, Rhesa, et al. "4-terminal relay technology for complementary logic." Electron Devices Meeting (IEDM), 2009 IEEE International. IEEE, 2009.*
(Continued)

*Primary Examiner* — Victor A Mandala
*Assistant Examiner* — Regan J Rundio
(74) *Attorney, Agent, or Firm* — Haynes and Boone, LLP

(57) ABSTRACT

An electromechanical power switch device and methods thereof. At least some of the illustrative embodiments are devices including a semiconductor substrate, at least one integrated circuit device on a front surface of the semiconductor substrate, an insulating layer on the at least one integrated circuit device, and an electromechanical power switch on the insulating layer. By way of example, the electromechanical power switch may include a source and a drain, a body region disposed between the source and the drain, and a gate including a switching metal layer. In some embodiments, the body region includes a first body portion and a second body portion spaced a distance from the first body portion and defining a body discontinuity therebetween. Additionally, in various examples, the switching metal layer may be disposed over the body discontinuity.

30 Claims, 56 Drawing Sheets

(51) Int. Cl.
*H01L 27/10* (2006.01)
*H01H 49/00* (2006.01)
*H01H 1/00* (2006.01)

(56) References Cited

U.S. PATENT DOCUMENTS

| | | | |
|---|---|---|---|
| 8,238,074 B2 | 8/2012 | Steeneken | |
| 8,466,760 B2 | 6/2013 | Foster | |
| 8,611,137 B2* | 12/2013 | Liu | H01L 27/101 326/40 |
| 9,608,082 B2* | 3/2017 | Hutzler | H01L 29/4236 |
| 2007/0134835 A1* | 6/2007 | Fukuda | H01H 59/0009 438/48 |
| 2010/0075481 A1 | 3/2010 | Yang | |
| 2010/0273286 A1 | 10/2010 | Liang | |
| 2011/0265574 A1 | 11/2011 | Yang | |
| 2014/0300404 A1* | 10/2014 | Gaddi | H01G 5/18 327/382 |

OTHER PUBLICATIONS

Henry and Nazhandali, "From Transistors to MEMS: Throughput-Aware Power Gating in CMOS Circuits", Design, Automation & Test in Europe Conference & Exhibition (DATE), 2010, pp. 130-135, Digital Object Identifier: 10.1109/DATE.2010.5457224.

Henry, Lyerly, Nazhandali, Fruehling, and Peroulis, "MEMS-Based Power Gating for Highly Scalable Periodic and Event-Driven Processing", 24th International Conference on VLSI Design, 2011, pp. 286-291, Digital Object Identifier: 10.1109/VLSID.2011.66.

Henry, Srivastav, and Nazhandali, "A case for NEMS-based functional-unit power gating of low-power embedded microprocessors", 48th Design Automation Conference (DAC), 2011, pp. 872-877.

Shobak, Ghoneim, El Boghdady, Halawa, Iskander, and Anis, "Power gating of VLSI circuits using MEMS switches in low power applications", International Conference on Microelectronics (ICM), 2011, pp. 1-5, Digital Object Identifier: 10.1109/ICM.2011.6177407.

Kam, Chen, and Liu, "Reliable micro-electro-mechanical (MEM) switch design for ultra-low-power logic", IEEE International Reliability Physics Symposium (IRPS), 2013, pp. 6A.1.1-6A.1.5, Digital Object Identifier: 10.1109/IRPS.2013.6532044.

Henry and Nazhandali, "From Transistors to NEMS: Highly Efficient Power-Gating of CMOS Circuits", ACM Journal on Emerging Technologies in Computing Systems (JETC), Feb. 2012, vol. 8, Issue 1, Article No. 2, New York, NY, Digital Object Identifier: 10.1145/2093145.2093147.

Witvrouw, "CMOS-MEMS Integration: Why, How and What?", International Conference on Computer-Aided Design (ICCAD), 2006, pp. 826-827, Digital Object Identifier: 10.1109/ICCAD.2006.320128.

Raychowdhury, Il Kim, Peroulis, and Roy, "Integrated MEMS Switches for Leakage Control of Battery Operated Systems", IEEE Custom Integrated Circuits Conference (CICC), 2006, pp. 457-460, Digital Object Identifier: 10.1109/CICC.2006.320821.

Fedder, "Integrated MEMS in Conventional CMOS", Robotics Institute, 1997, Paper 309, http://repository.cmu.edu/robotics/309.

Fariborzi, Spencer, Karkare, Jeon, Nathanael, Wang, Chen, Kam, Pott, Liu, Alon, Stojanovic, and Markovic, "Analysis and demonstration of MEM-relay power gating", IEEE Custom Integrated Circuits Conference (CICC), 2010, pp. 1-4, Digital Object Identifier: 10.1109/CICC.2010.5617380.

Chong, Lee, Mitra, Howe, and Wong, "Integration of Nanoelectromechanical Relays With Silicon nMOS", IEEE Transactions on Electron Devices, 2012, pp. 255-258, vol. 59, Issue 1, Digital Object Identifier: 10.1109/TED.2011.2172946.

Chong, Lee, Parizi, Provine, Mitra, Howe, and Wong, "Integration of nanoelectromechanical (NEM) relays with silicon CMOS with functional CMOS-NEM circuit", IEEE International Electron Devices Meeting (IEDM), 2011, pp. 30.5.1-30.5.4, Digital Object Identifier: 10.1109/IEDM.2011.6131645.

Dadgour and Banerjee, "Design and Analysis of Hybrid NEMS-CMOS Circuits for Ultra Low-Power Applications", 44th ACM/IEEE Design Automation Conference (DAC), 2007, pp. 306-311.

Franke, Heck, King, and Howe, "Polycrystalline silicon-germanium films for integrated microsystems", Journal of Microelectromechanical Systems, 2003, pp. 160-171, vol. 12, Issue 2, Digital Object Identifier: 10.1109/JMEMS.2002.805051.

Gillot, Lagoutte, Charvet, Souchon, and Sillon, "Wafer Level Thin Film Encapsulation for MEMS", Conference on High Density Microsystem Design and Packaging and Component Failure Analysis, 2005, pp. 1-4, Digital Object Identifier: 10.1109/HDP.2005.251432.

Sugizaki, Nakao, Higuchi, Miyagi, Obata, Inoue, Endo, Shimooka, Kojima, Mori, and Shibata, "Novel wafer-level CSP for stacked MEMS / IC dies with hermetic sealing", 58th Electronic Components and Technology Conference (ECTC), 2008, pp. 811-816, Digital Object Identifier: 10.1109/ECTC2008.4550068.

Witvrouw, Mehta, Verbist, Du Bois, Van Aerde, Ramos-Martos, Ceballos, Ragel, Mora, Lagos, Arias, Hinojosa, Spengler, Leinenbach, Fuchs, and Kronmuller, "Processing of MEMS gyroscopes on top of CMOS ICs", IEEE International Solid-State Circuits Conference (ISSCC), 2005, pp. 88-89, vol. 1, Digital Object Identifier: 10.1109/ISSCC.2005.1493882.

Hongwei, Qu, "CMOS MEMS Fabrication Technologies and Devices", Micromachines, 2016, pp. 1-21, vol. 7, Issue 14.

Chiou, Jin-Chern, Hung, Chen-Chun, Shieh, Li-Jung and Tsai, Zhao-Long, "Novel electrostatic MOEMS phase shifter array using CMOS-MEMS process", J.Micro/Nanolith. MEMS MOEMS; 6pps., Jan.-Mar. 2010, vol. 9, Issue 1.

Dopovich, Mikhail, "High Performance Power Distribution Networks with On-Chip Decoupling Capacitors for Nanoscale Integrated Circuits", Department of Electrical and Computer Engineering, The College School of Engineering and Applied Sciences, University of Rochester, Rochester, New York, 2007.

* cited by examiner

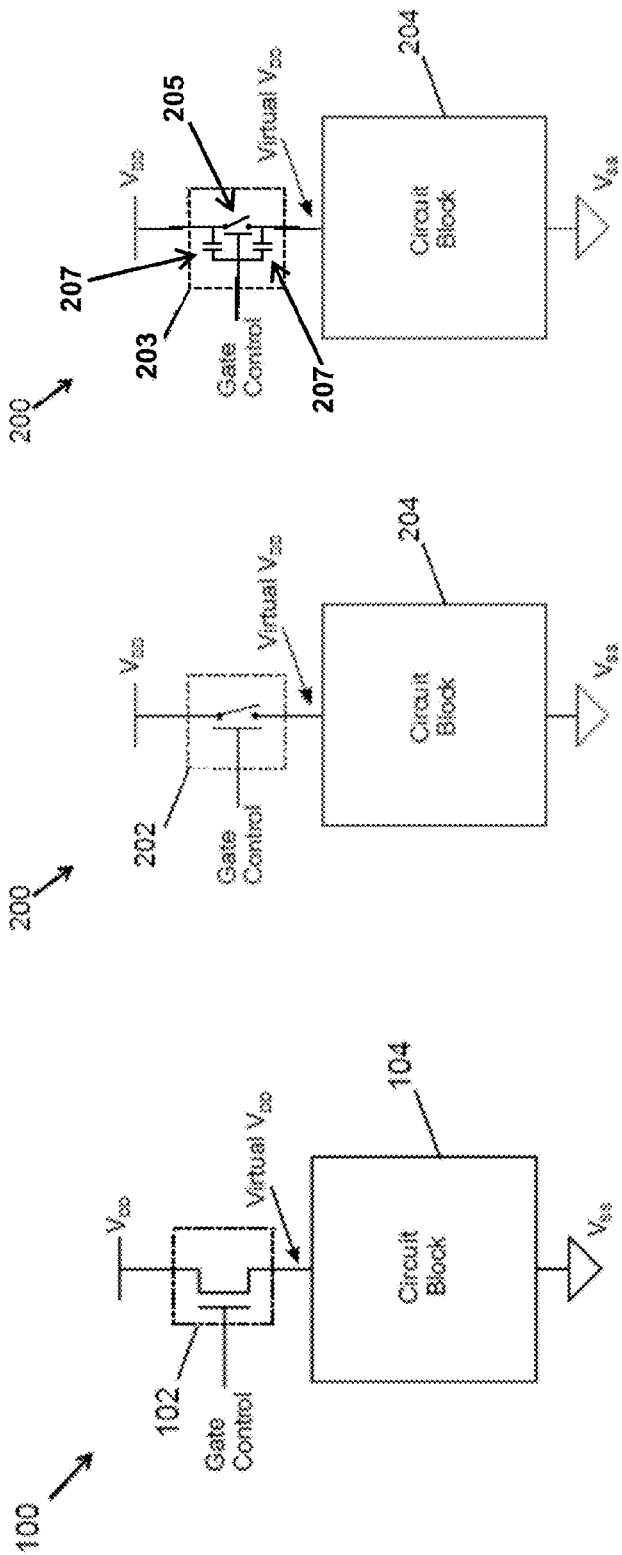

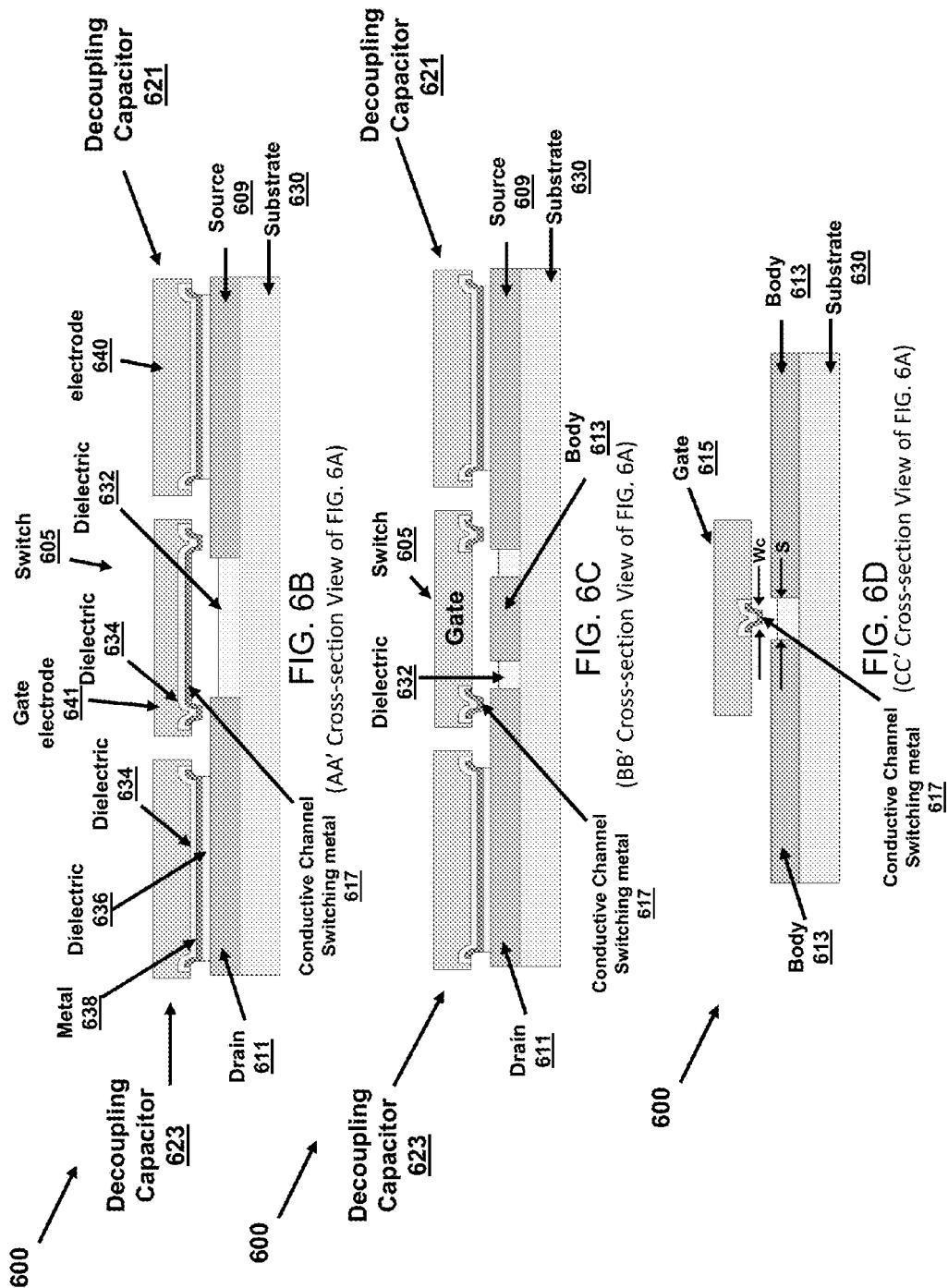

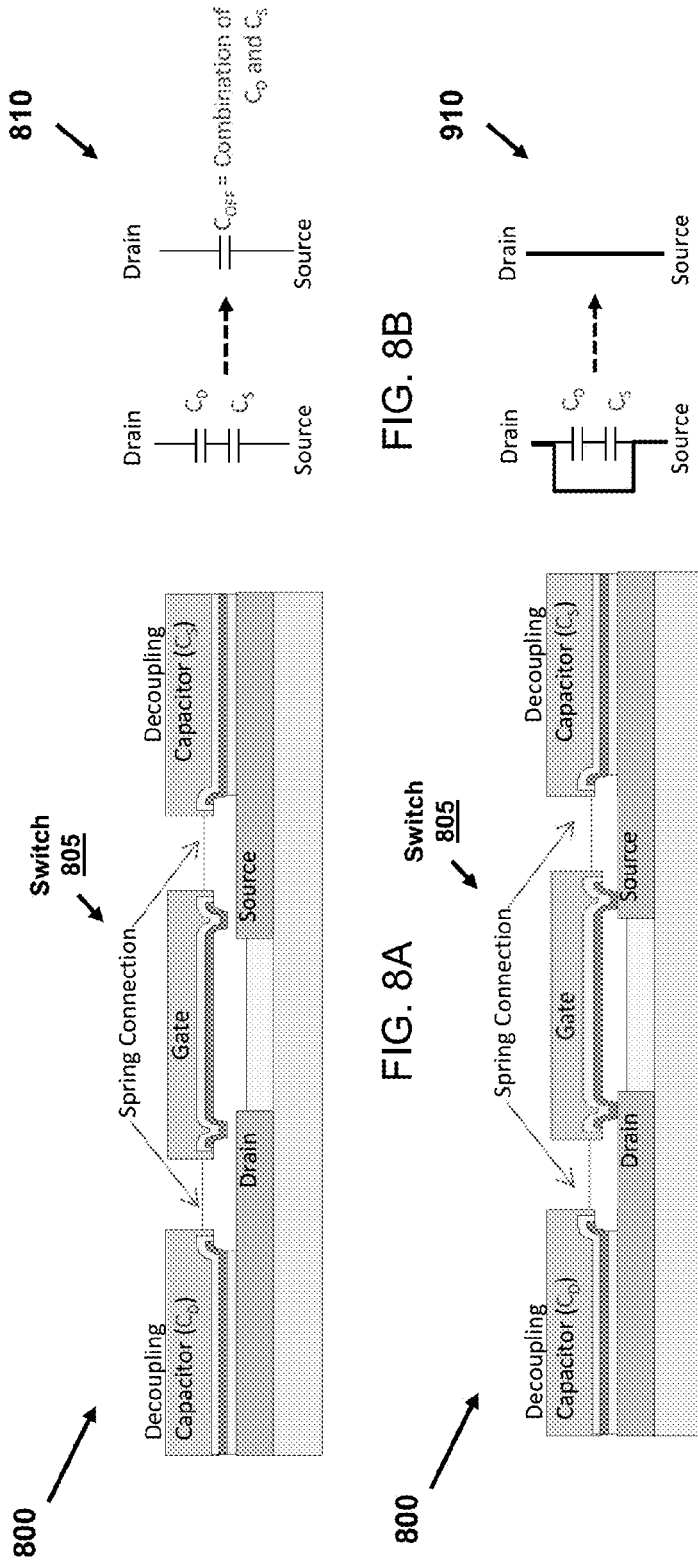

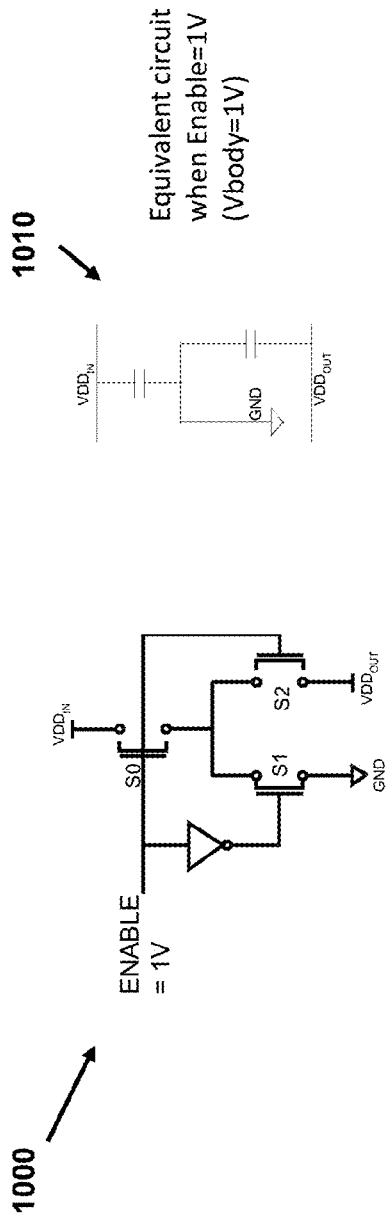

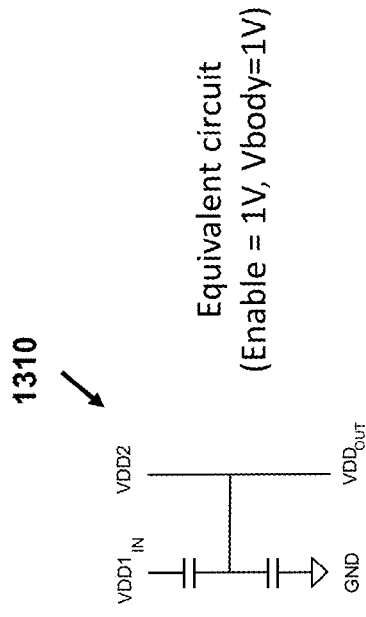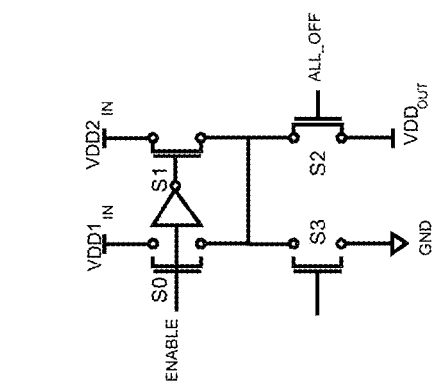
FIG. 13A    FIG. 13B
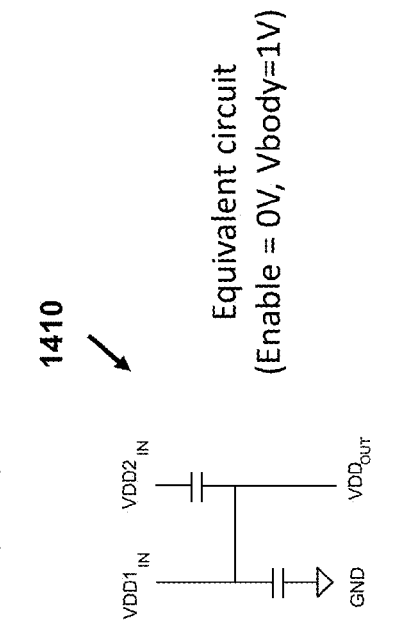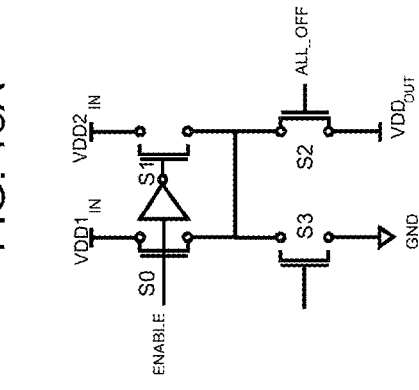
FIG. 14A    FIG. 14B

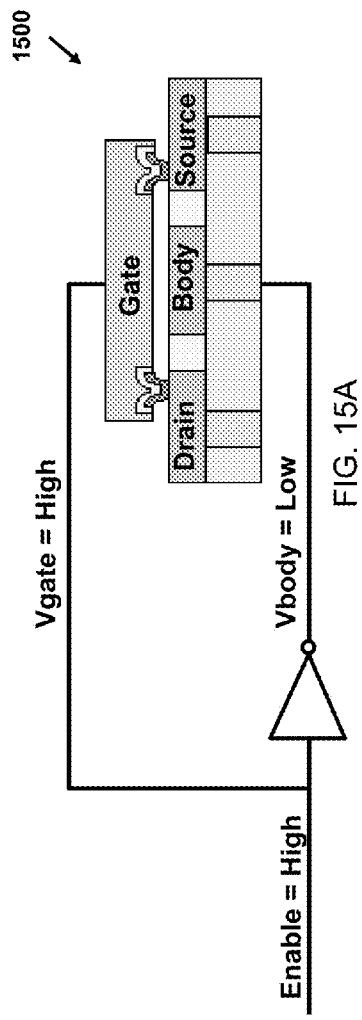
FIG. 15A
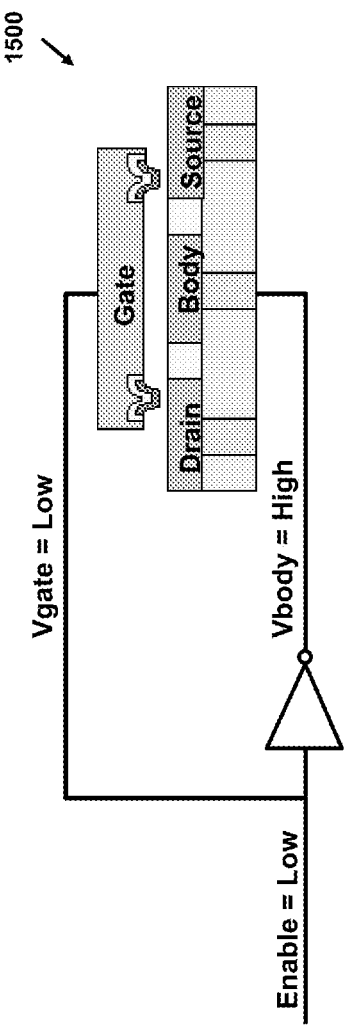
FIG. 15B
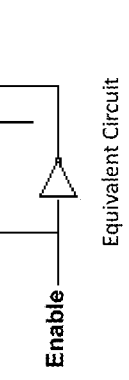
FIG. 15D
Equivalent Circuit
FIG. 15C

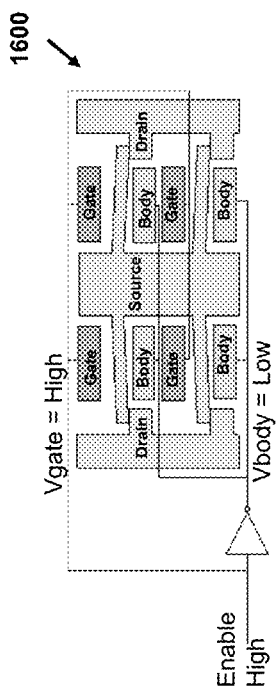
FIG. 16A
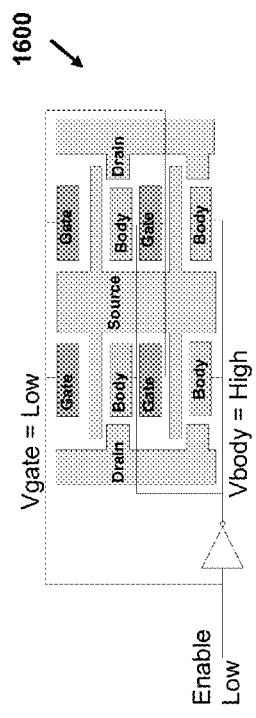
FIG. 16B
FIG. 16C
FIG. 16D

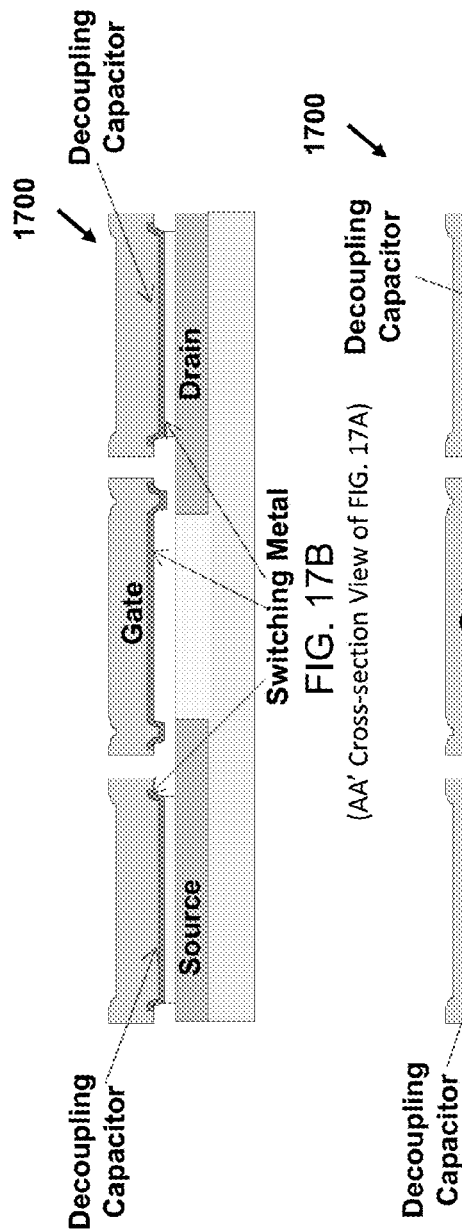
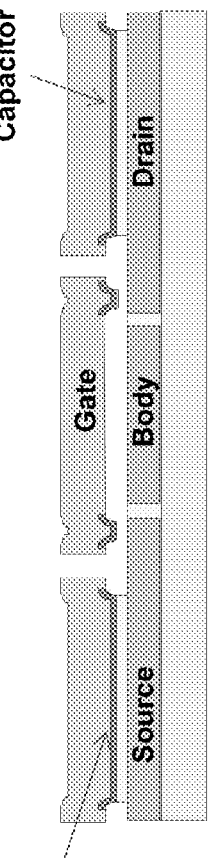
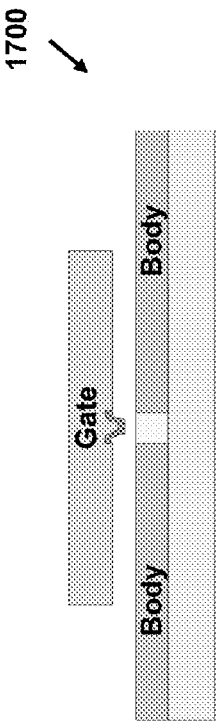
FIG. 17B (AA' Cross-section View of FIG. 17A)
FIG. 17C (BB' Cross-section View of FIG. 17A)
FIG. 17D (CC' Cross-section View of FIG. 17A)

Top View of an Integrated Circuit with 4 I-MEMS switches.

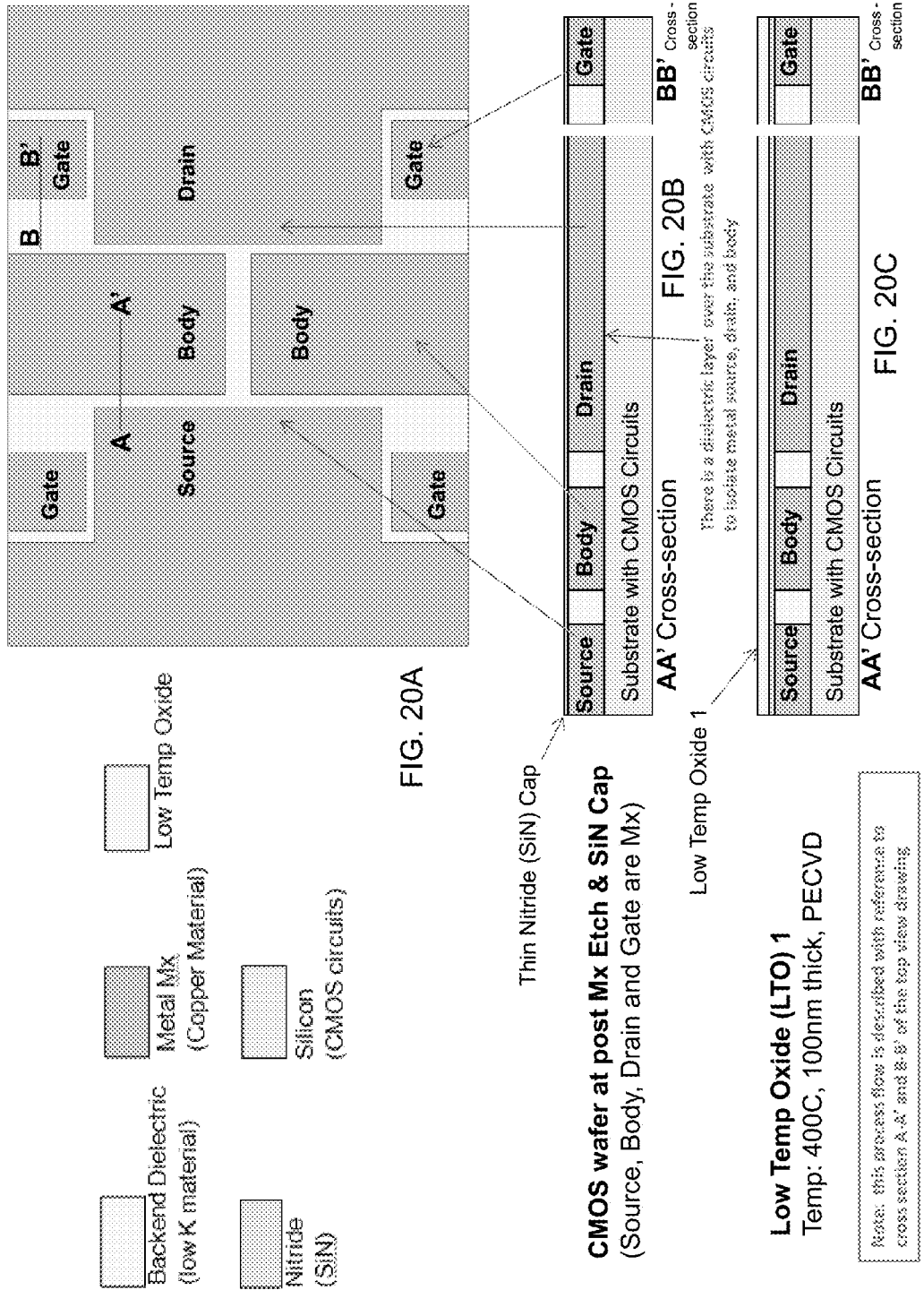

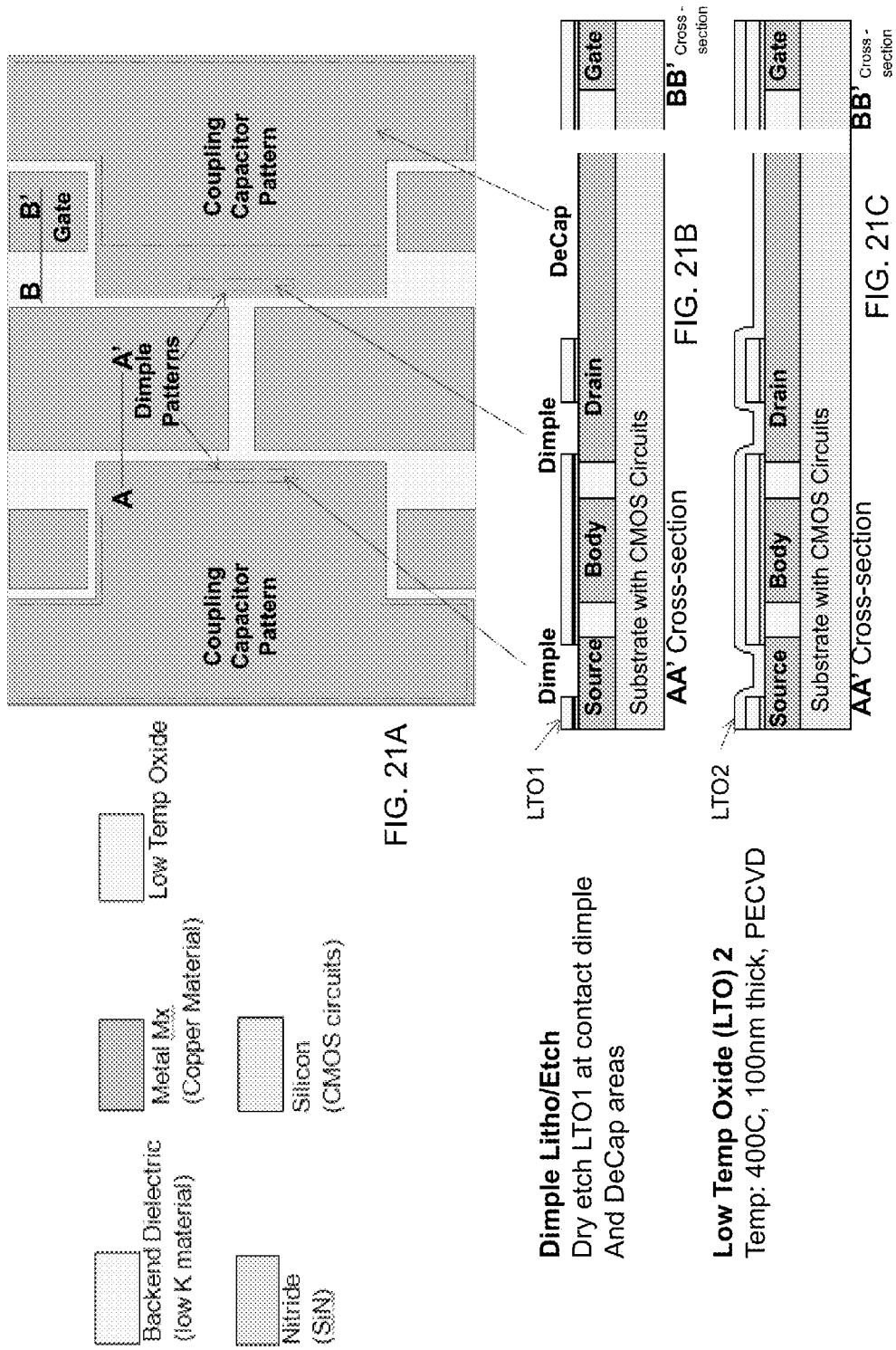

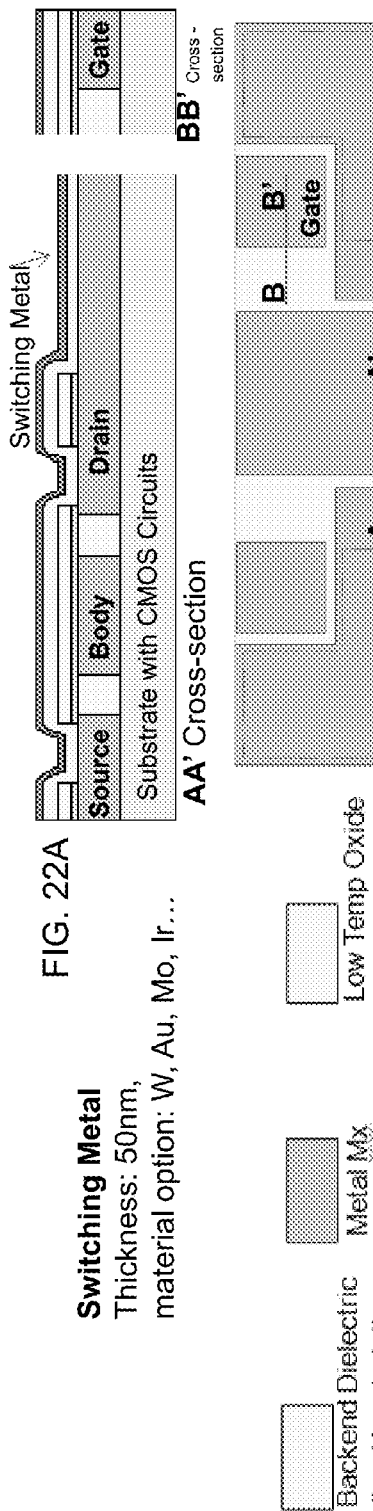
FIG. 22A
FIG. 22B
FIG. 22C

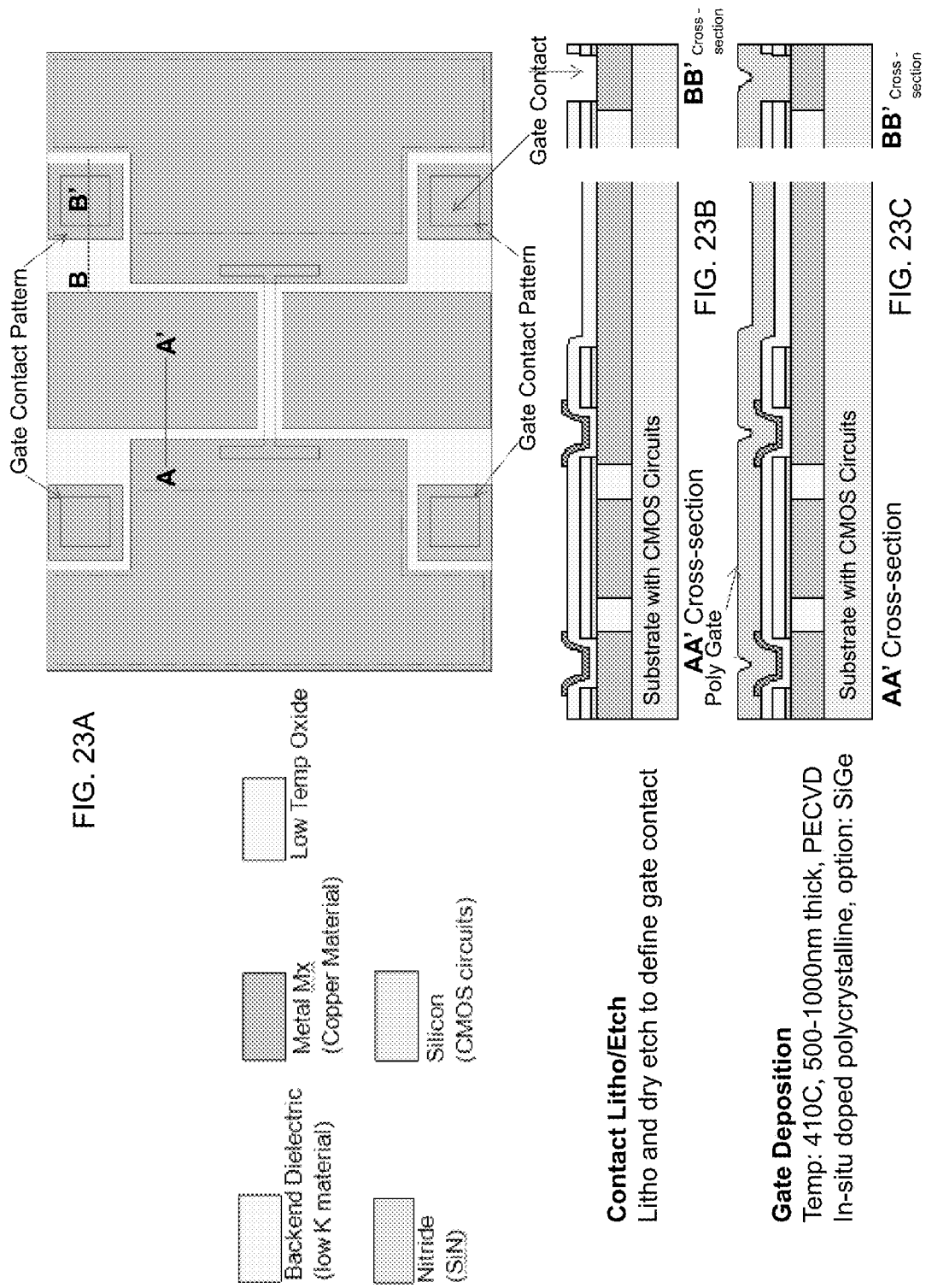

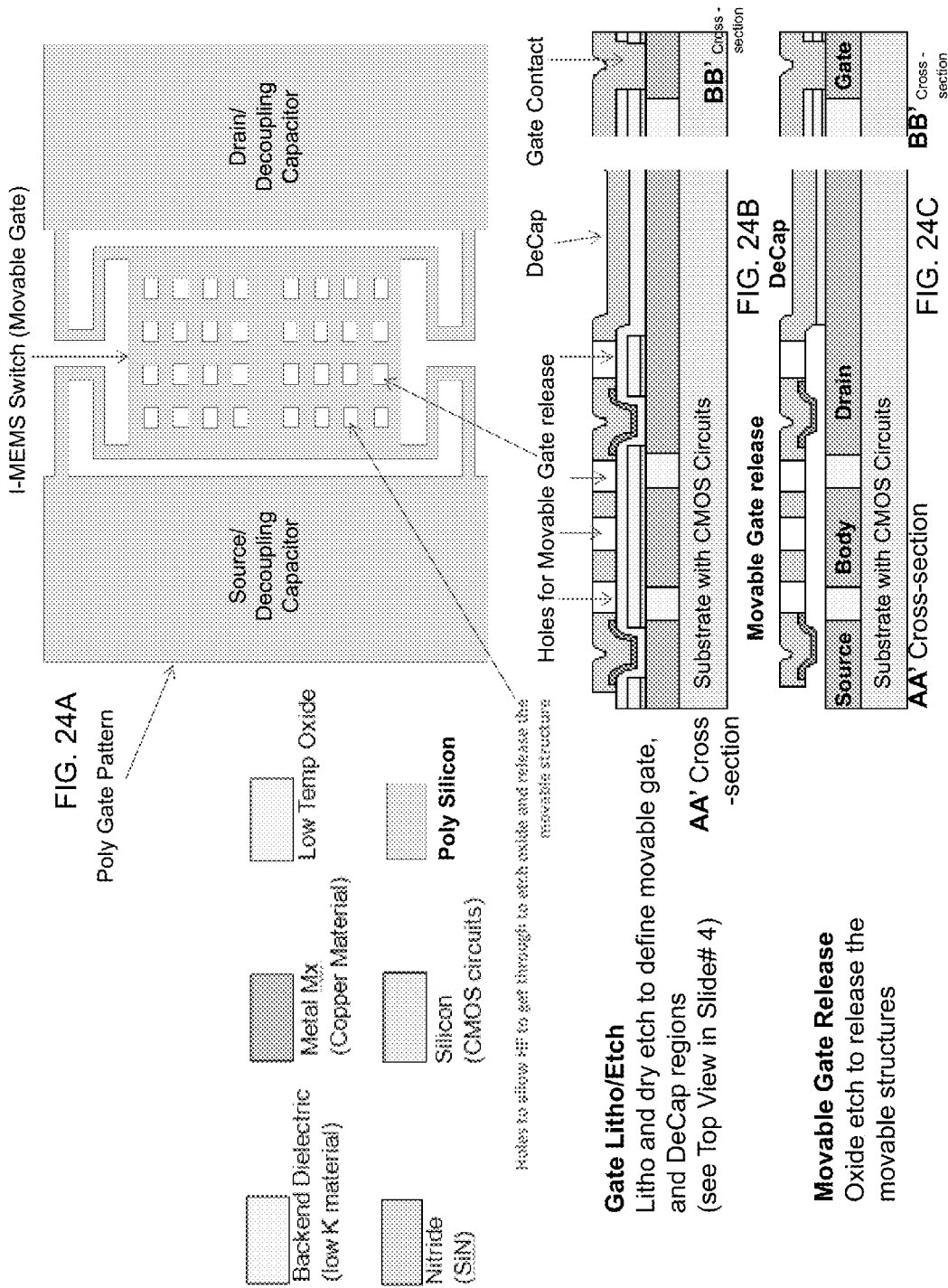

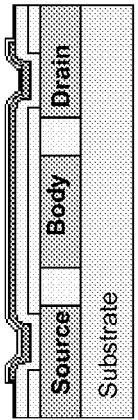
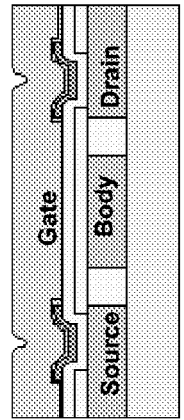
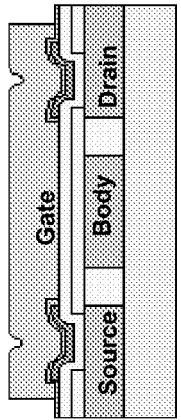
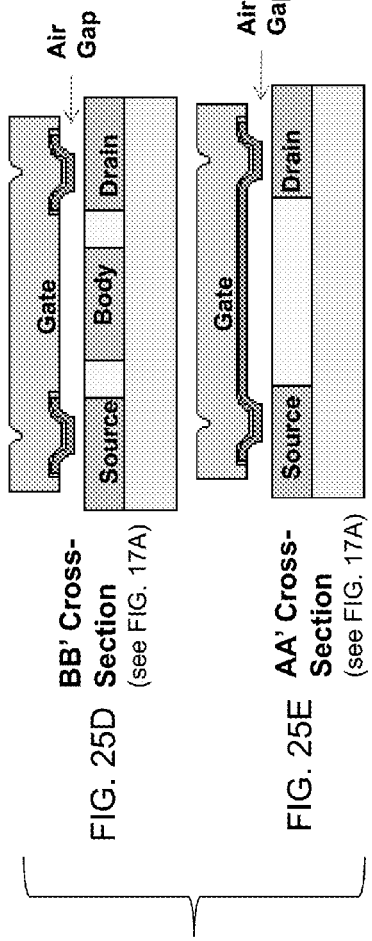
4-Terminals OPTION
FIG. 25A
Gate Oxide
Temp: 400C, 100nm thick, PECVD
Option: 50nm thick, ALD
FIG. 25B
Gate Deposition
Temp: 410C, 500-1000nm thick, PECVD
In-situ doped polycrystalline, option: SiGe
FIG. 25C
Gate Litho/Etch
Litho and dry etch to define gate region
FIG. 25D
BB' Cross-Section
(see FIG. 17A)
FIG. 25E
AA' Cross-Section
(see FIG. 17A)
Gate Release
Oxide etch to release the movable structures

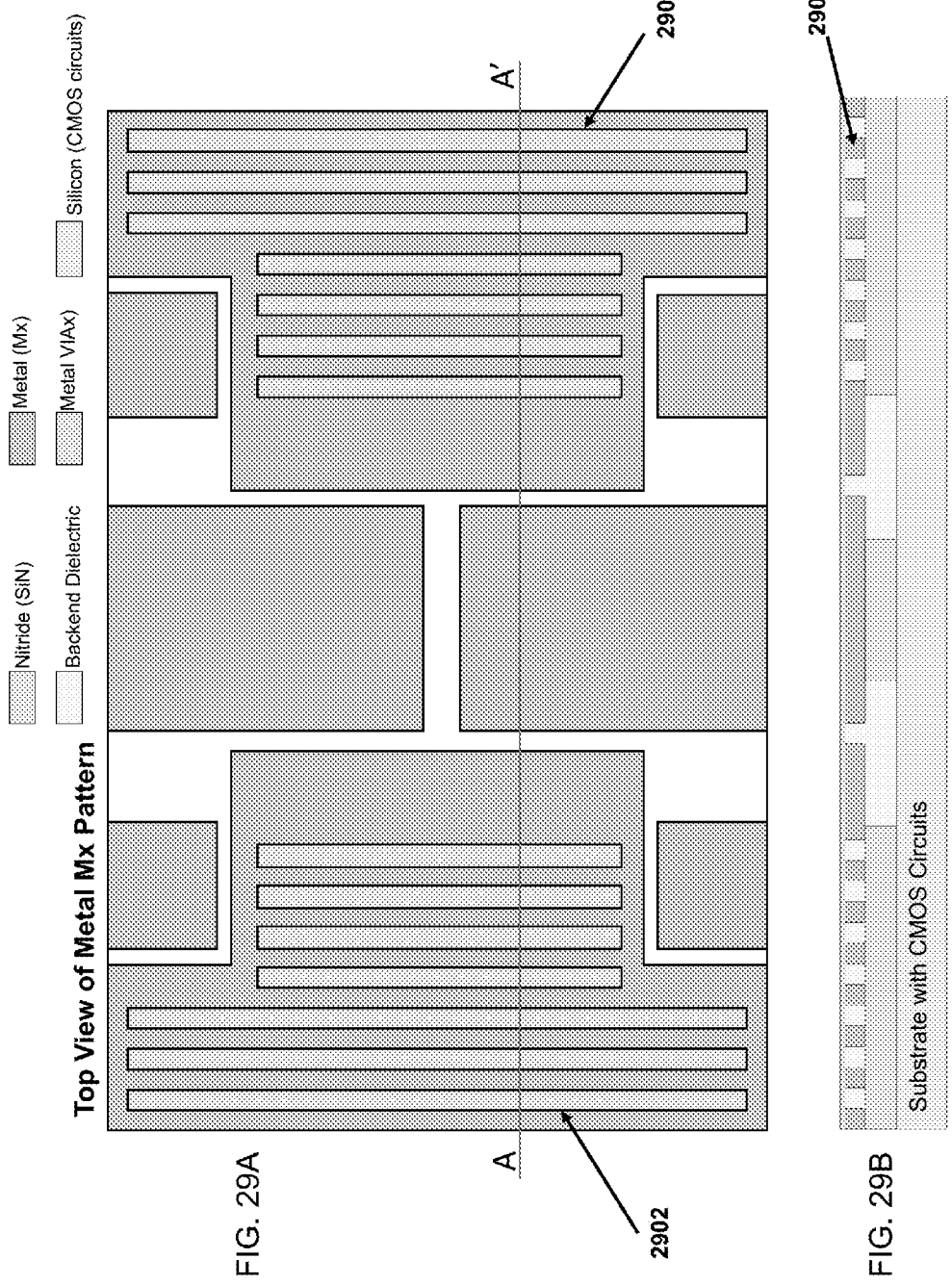

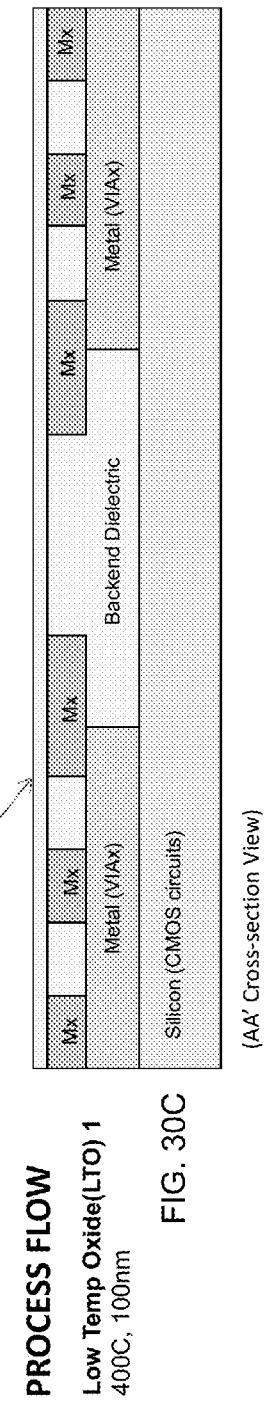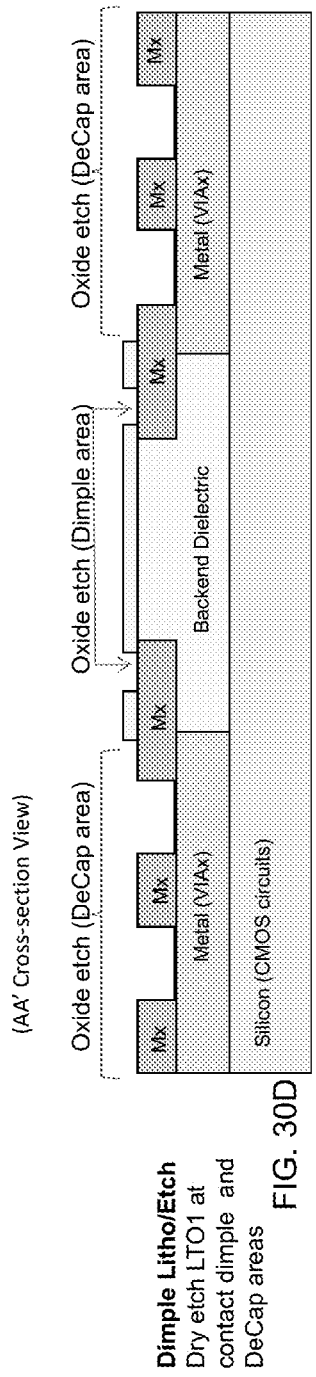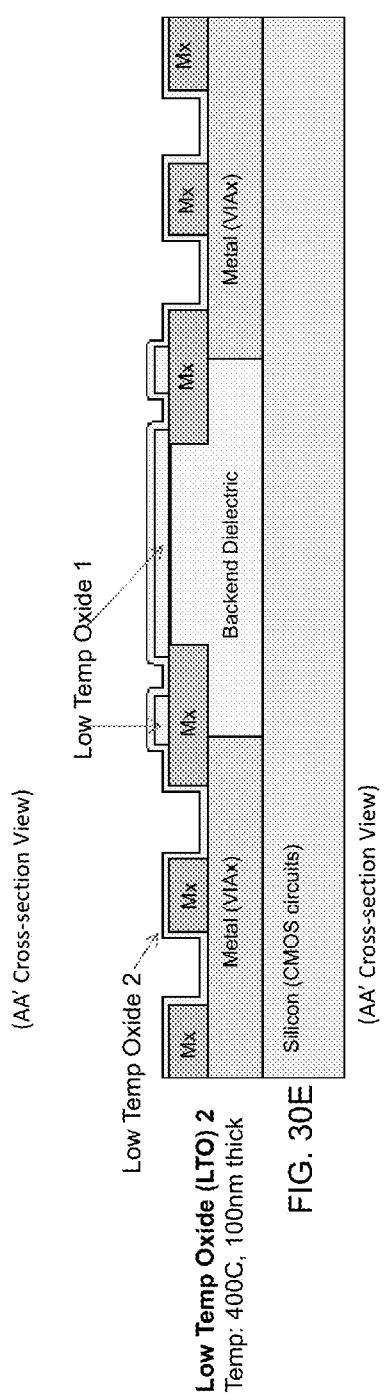

Switching Metal
Thickness: 50nm,
material option: W, Au, Mo, Ir...

Switching Metal Litho/Etch

Gate Deposition
Temp: 410C, 500-1000nm
In-situ doped polycrystalline,
option: SiGe

Gate Litho/Etch
Litho and dry etch to define movable gate, and DeCap regions

Movable Gate Release
Oxide etch to release the movable structures

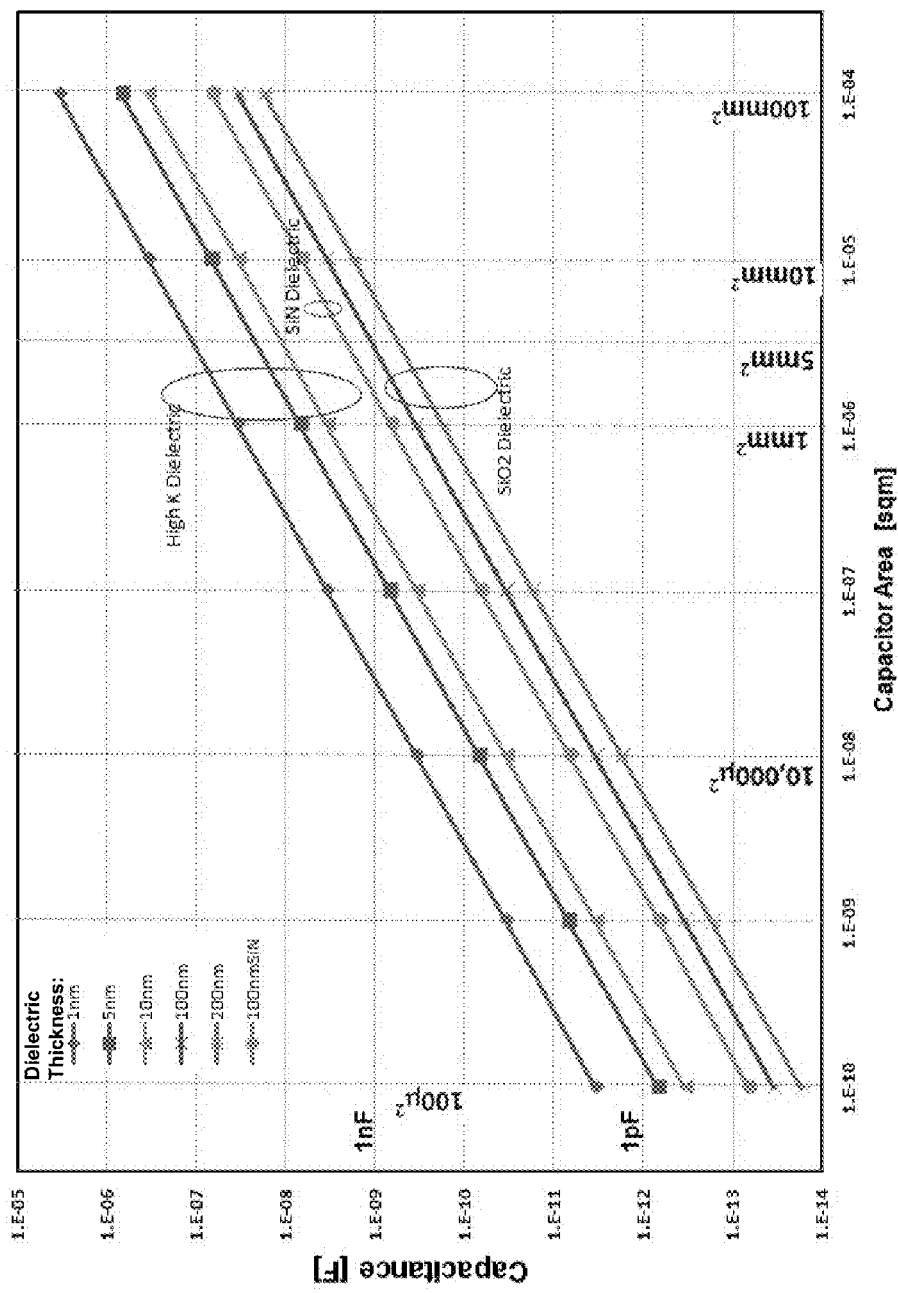

The General Properties of Si, Ge, SiGe, SiO₂ and Si₃N₄
June 2002

Virginia Semiconductor
1501 Powhatan Street, Fredericksburg, VA 22401-4647 USA
Phone: (540) 373-2900, FAX (540) 371-0371
www.virginiasemi.com  tech@virginiasemi.com

C. The Basic Properties of SiO₂ and Si₃N₄

| Insulator | $SiO_2$ | $Si_3N_4$ |
|---|---|---|
| Structure | Amorphous | Amorphous |
| Melting Point (°C) | ~1600 | - |
| Density (g/cm³) | 2.2 | 3.1 |
| Refractive index | 1.46 | 2.05 |
| Dielectric constant (permittivity) | 3.9 | 7.5 |
| Dielectric strength (V/cm) | $10^7$ | $10^7$ |
| Infrared absorption band (μm) | 9.3 | 11.5 – 12.0 |
| Energy gap | 9 | ~5.0 |
| Thermal Expansion coefficient (°C⁻¹) | $5 \times 10^{-7}$ | - |
| Thermal conductivity (W/cm-K) | 0.014 | - |
| dc resistivity (Ω-cm) at 25 °C at 500 °C | $10^{14}$-$10^{16}$ - | ~$10^{14}$ ~$2 \times 10^{13}$ |

FIG. 33

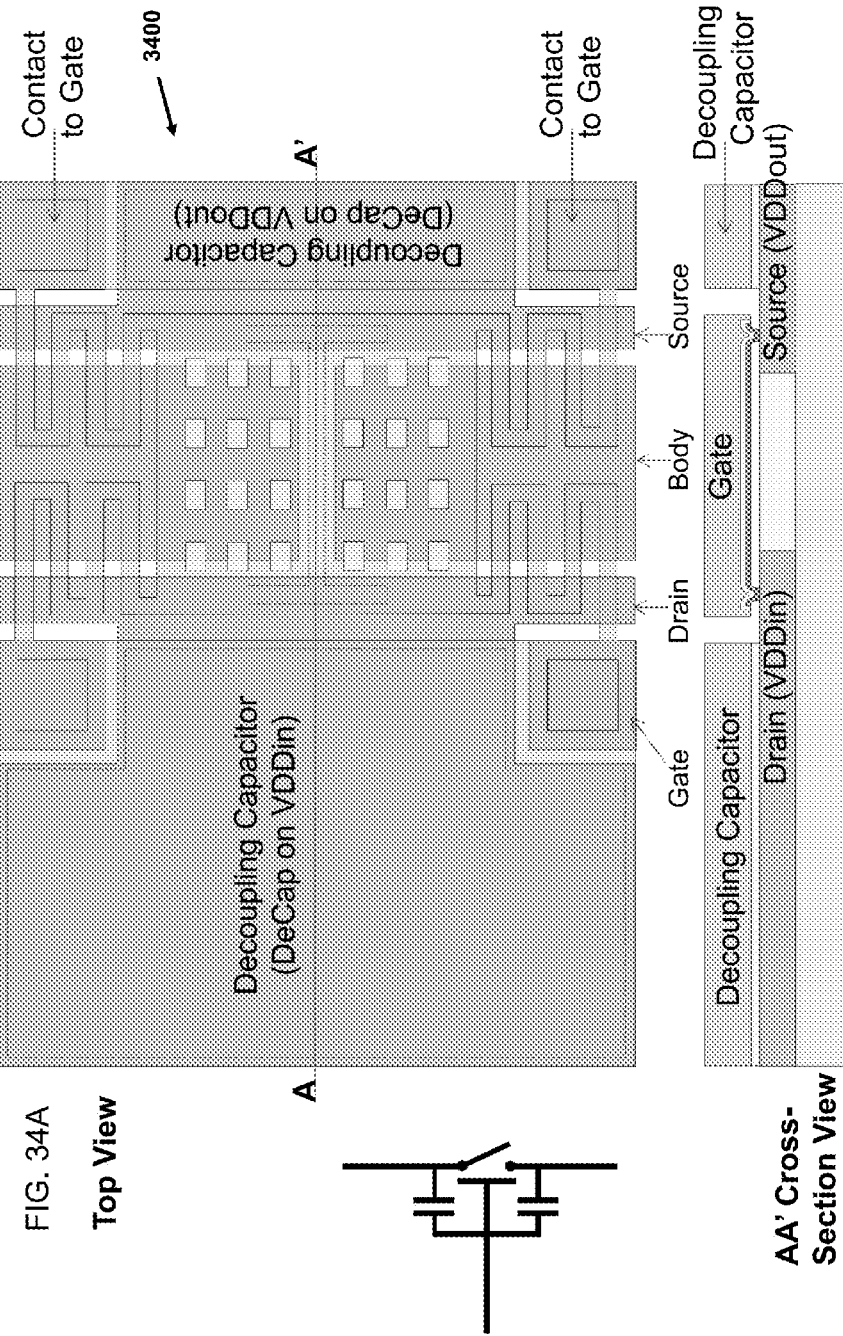

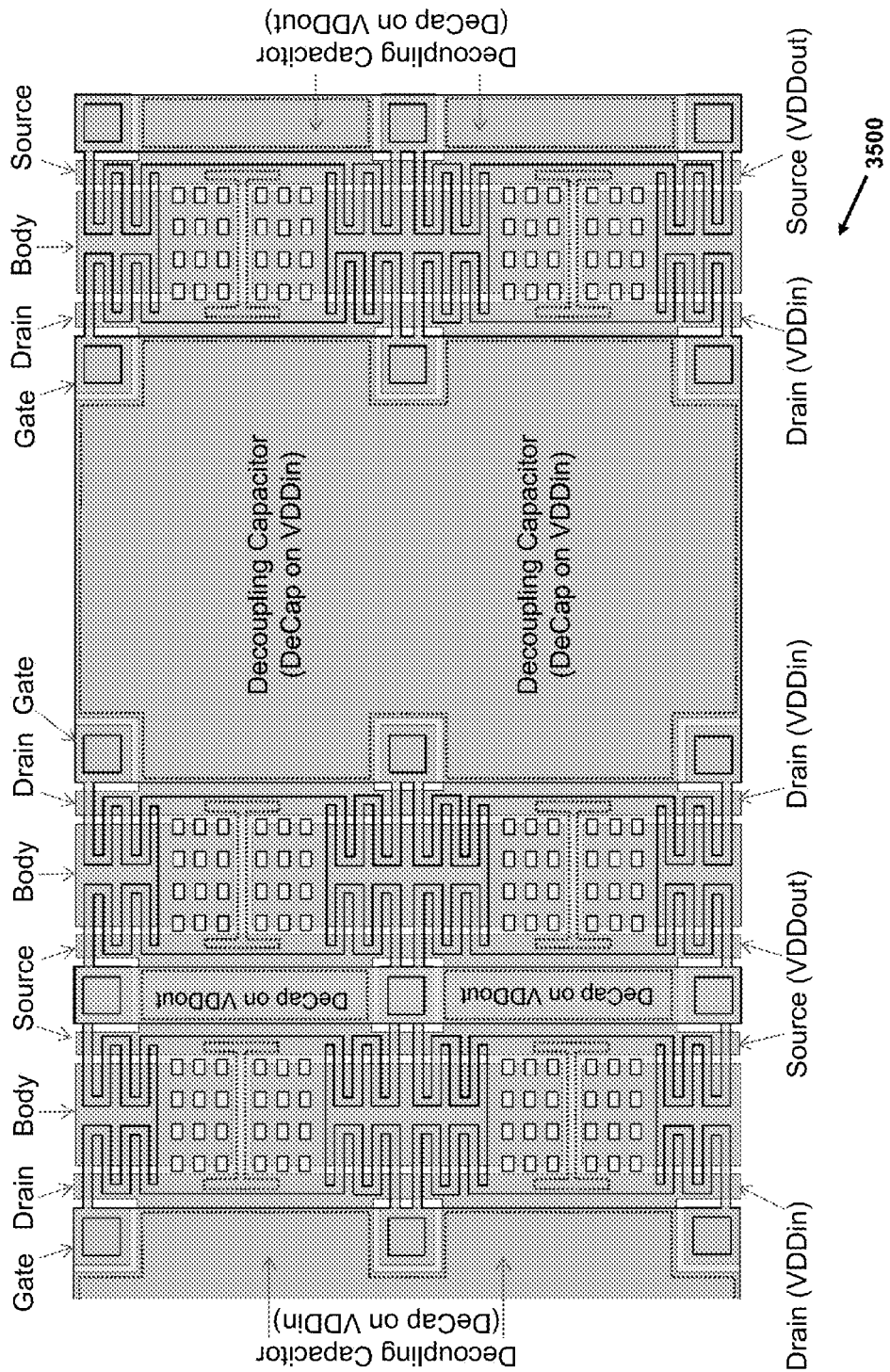
FIG. 35 Integrated Circuit with Multi I-MEMS and Decoupling Capacitors

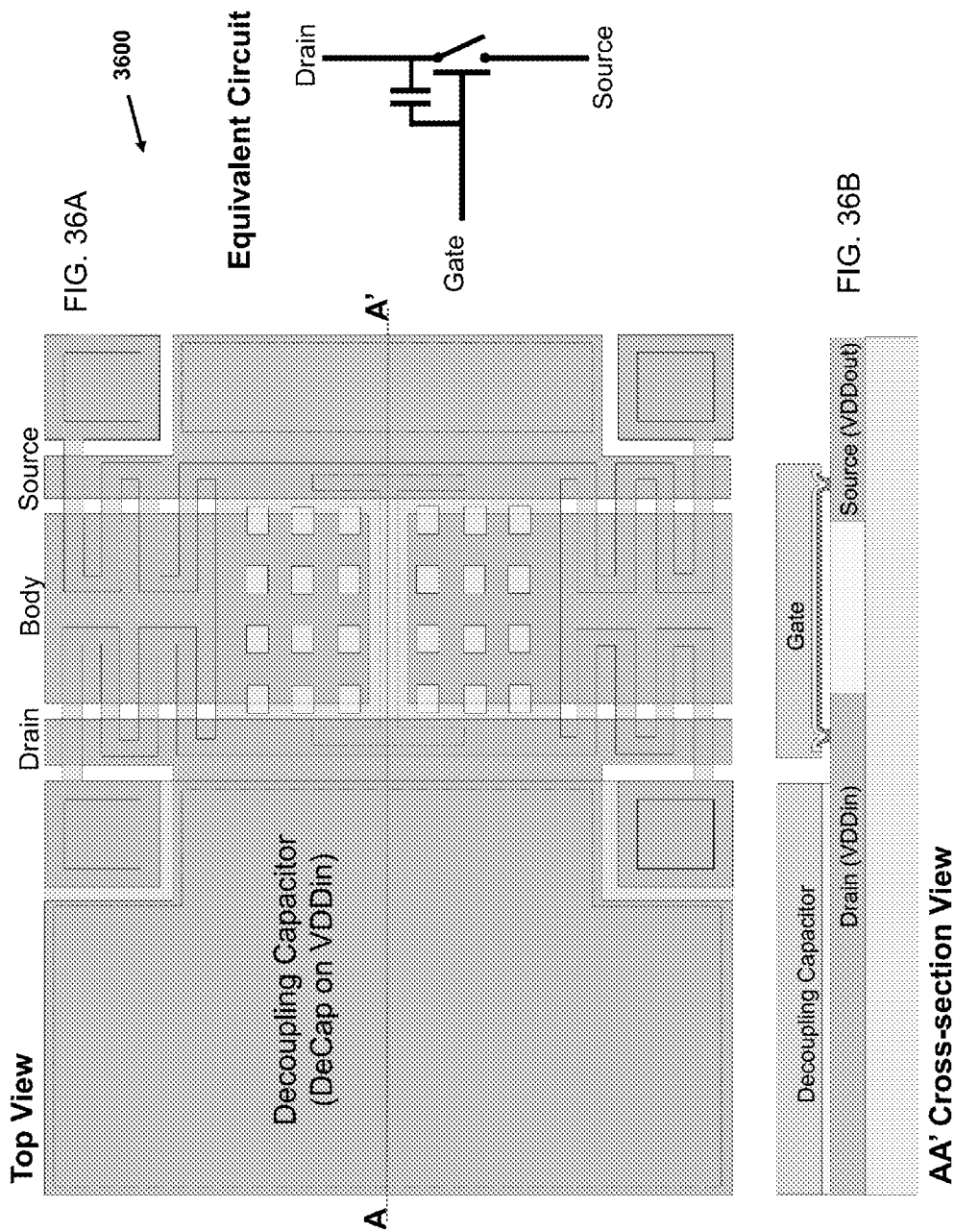

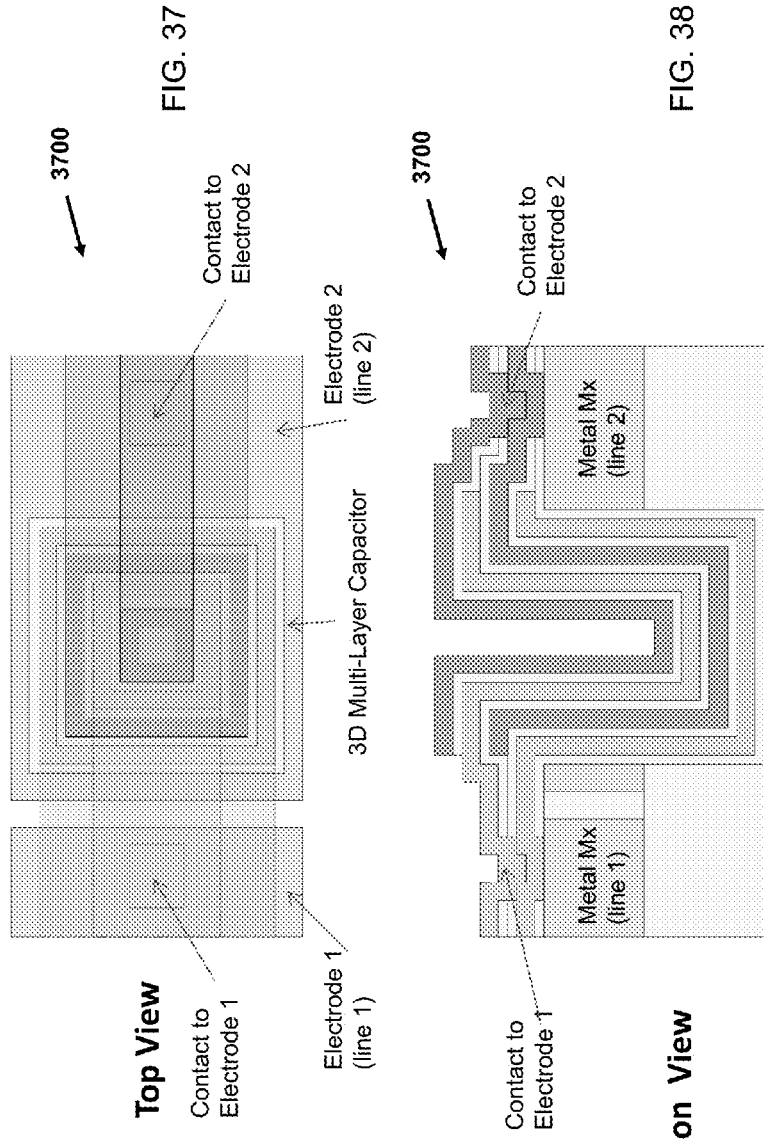
FIG. 37 — 3D Multi-Layer Capacitor (I-CAP) Structure, Top View
FIG. 38 — Cross-section View

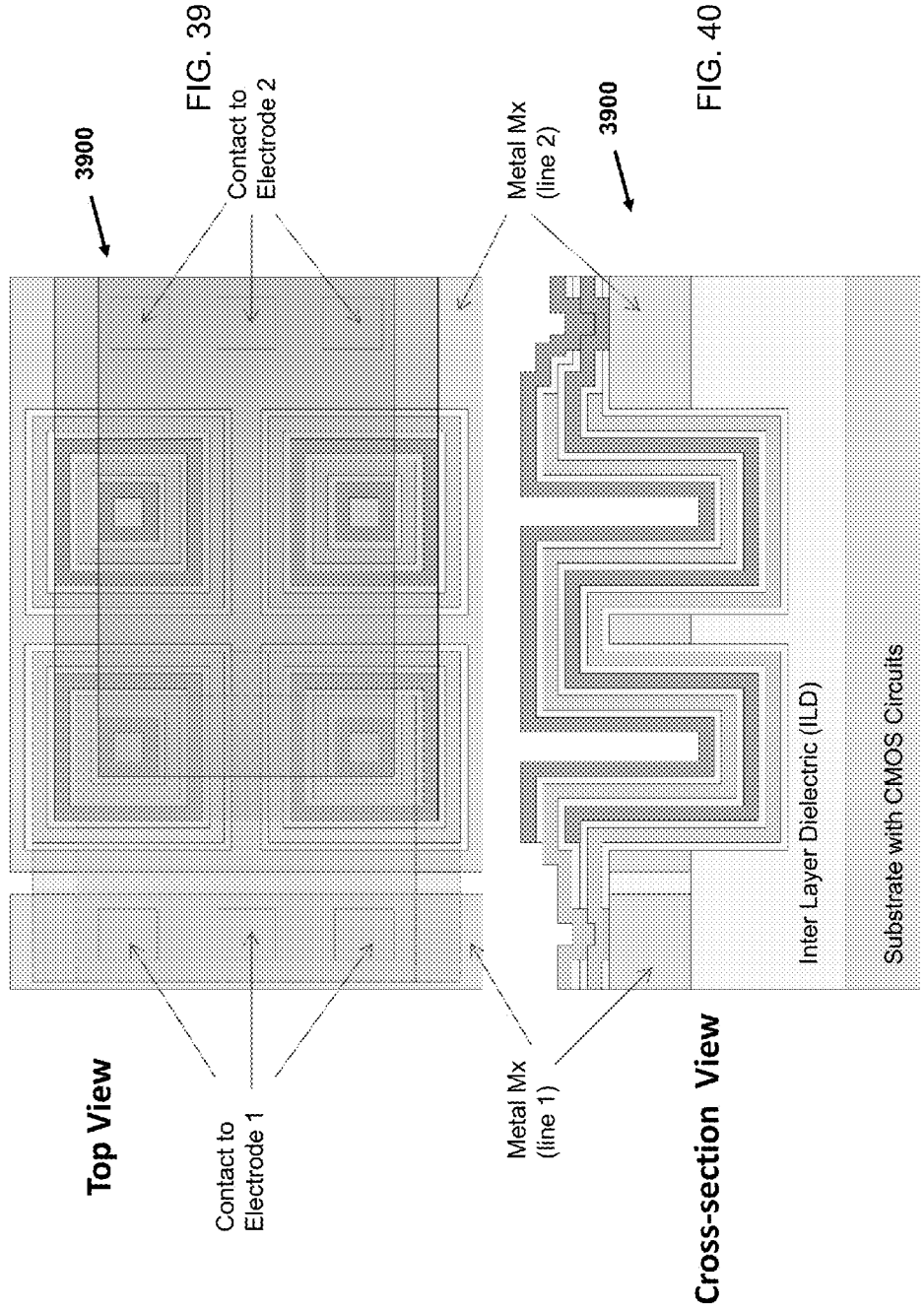

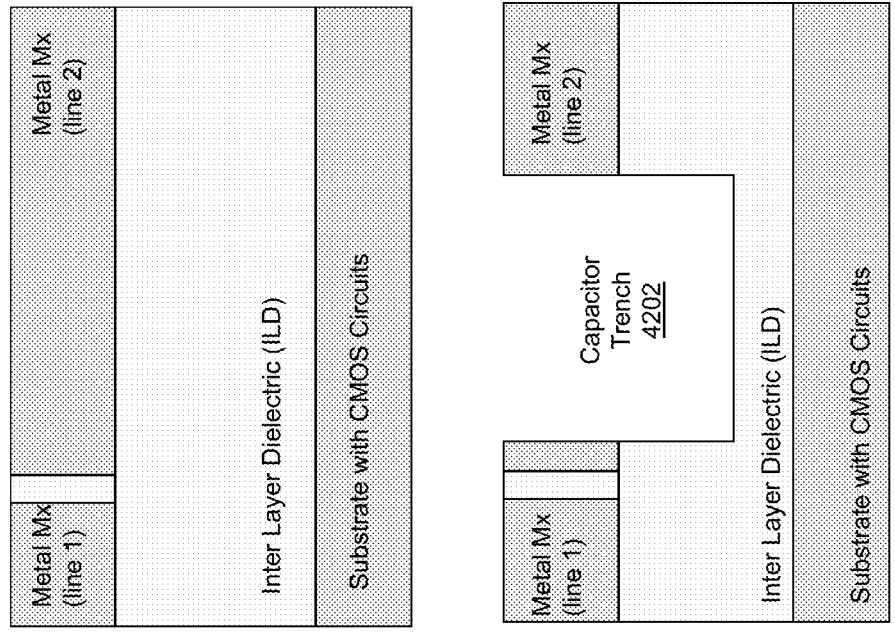

Step 2
1st Dielectric deposit, follow with Electrode 1 contact litho and etch
(Dielectric materials: SiO2, Si3N4, High K etc..., Thickness= 5 to 50nm)

Step 3
1st electrode metal deposit, follow with litho and etch
(Materials: TiN, HfN, etc..., Thickness= 40 to 50nm)

Step 4
2nd Dielectric deposit, follow with
Electrode 2 contact litho and etch
(Dielectric materials: SiO2, Si3N4, High K
etc..., Thickness= 5 to 50nm)

Step 5
2nd electrode metal deposit, follow with
litho and etch
(Materials: TiN, HfN, etc..., Thickness= 40
to 50nm)

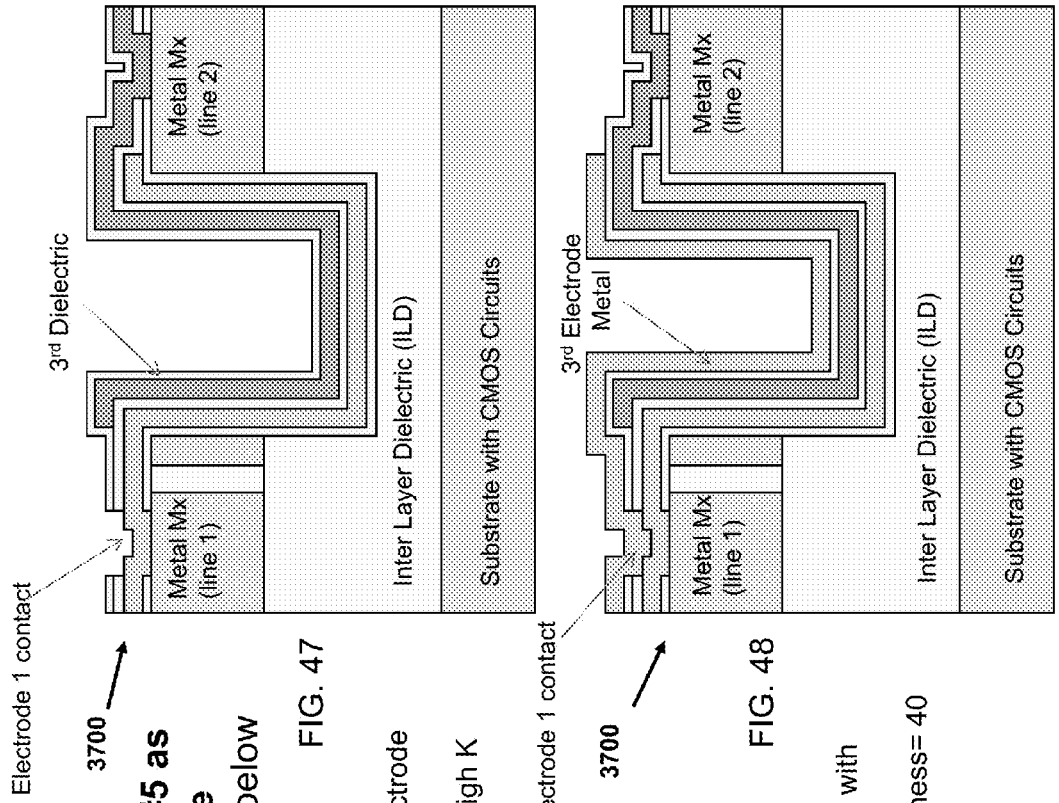

Step 8
$4^{th}$ Dielectric deposit, follow with Electrode 1 contact litho and etch
(Dielectric materials: SiO2, Si3N4, High K etc..., Thickness= 5 to 50nm)

Step 9
$4^{th}$ electrode metal deposit, follow with litho and etch
(Materials: TiN, HfN, etc..., Thickness= 40 to 50nm)

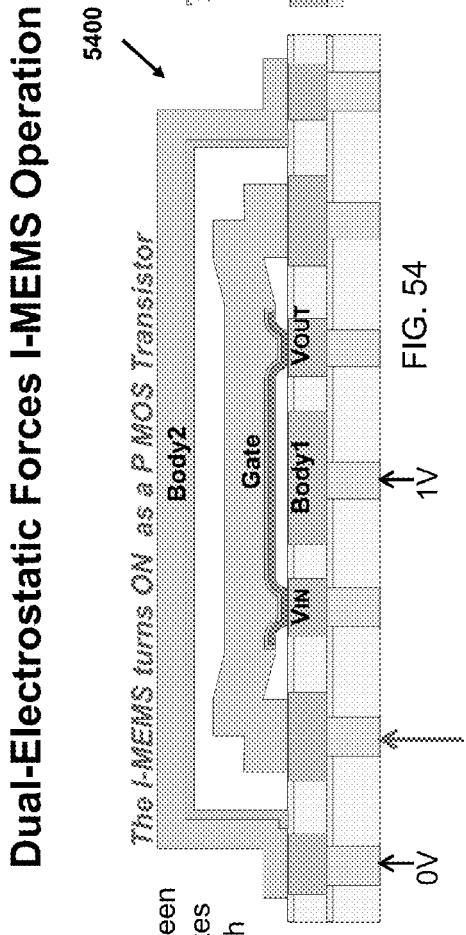
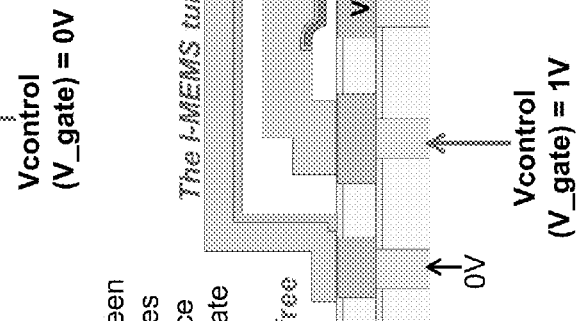
FIG. 54
FIG. 55

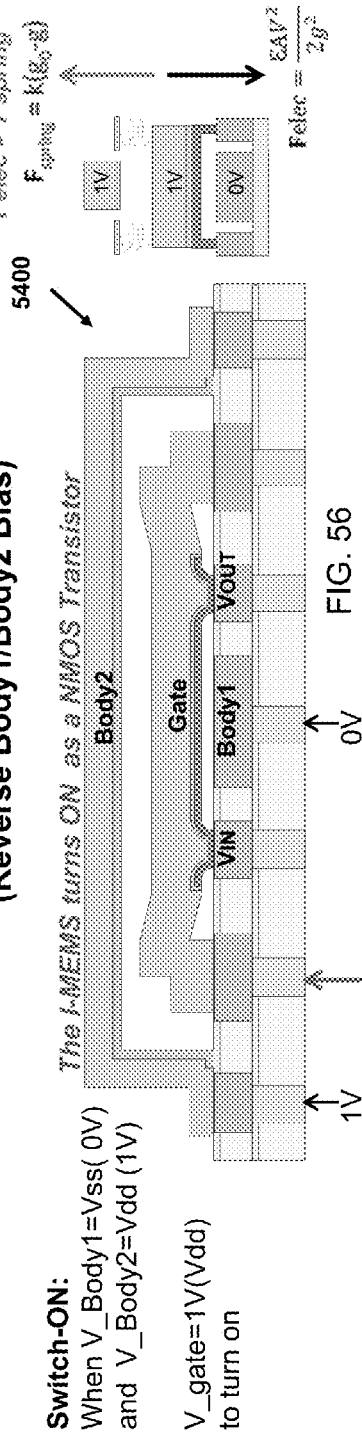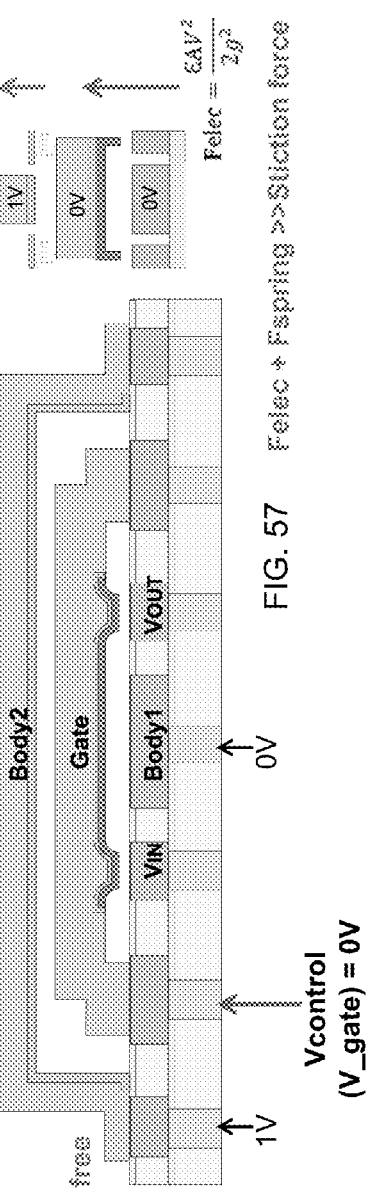
FIG. 56
FIG. 57

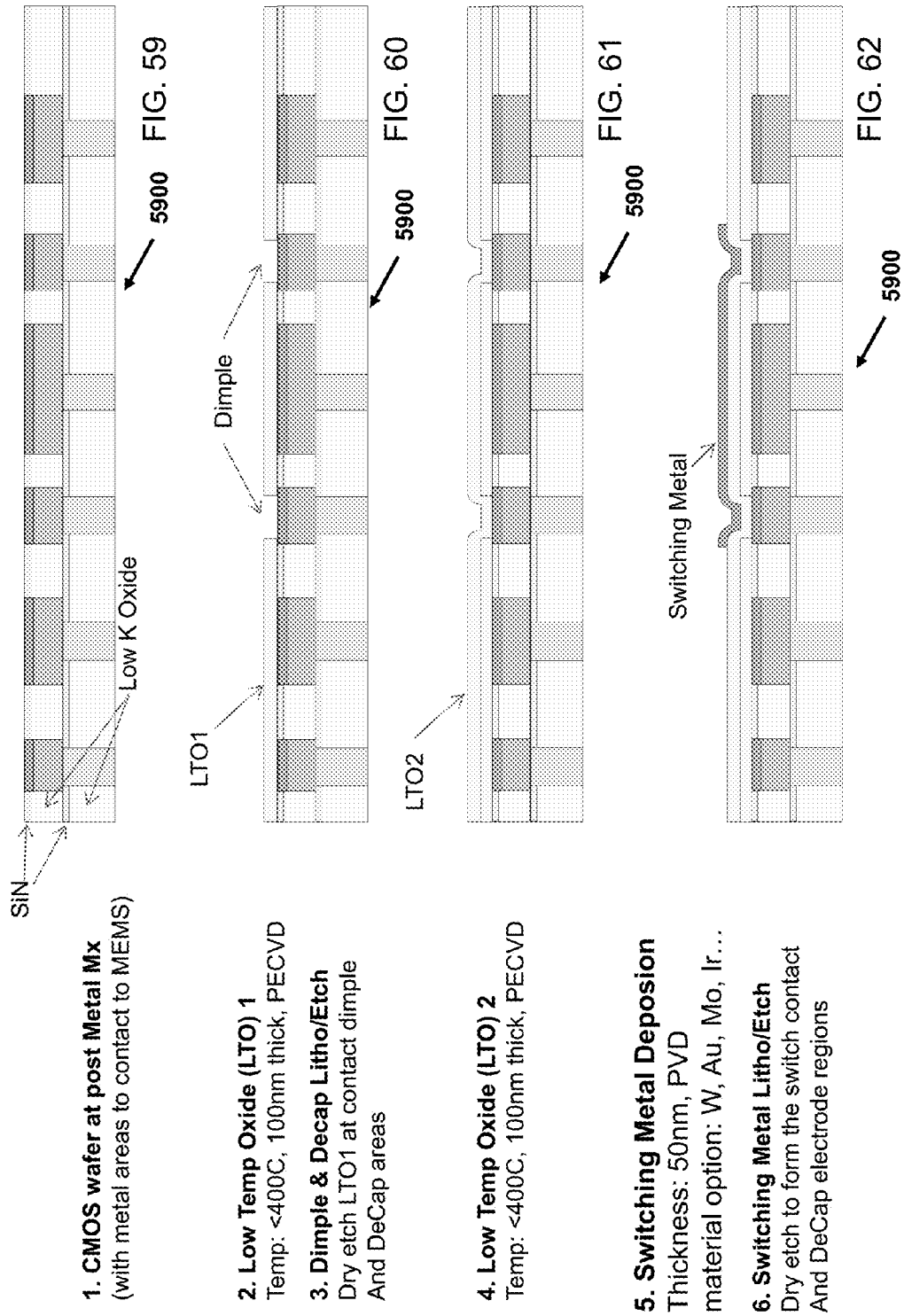

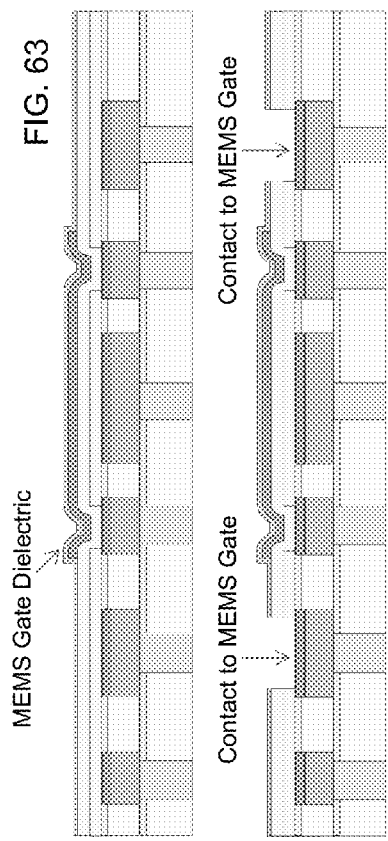

MEMS Gate Dielectric

Contact to MEMS Gate

Contact to MEMS Gate

MEMS Gate

Movable MEMS Gate

7. MEMS Gate Dielectric
SiO2 or SiN, Temp: <400C, 100nm thick, PECVD
Option: 50nm thick, ALD

8. Contact Litho/Etch
Litho and dry etch to define I-MEMS gate contact

9. Poly MEMS Gate Deposition
Temp: <400C, 500-1000nm thick, PECVD, In-situ doped polycrystalline, option: SiGe, Ge, PVD

10. MEMS Gate Litho/Etch
Litho and dry etch to define movable gate, and DeCap regions

11. Movable MEMS Gate Release
Oxide etch to release the movable structures

12. Sacrificial layer 1 Deposition
Oxide (SiO2), Temp: <400C, 3-5 μm thick,
PECVD

13, CMP (Chemical Mechanical Polishing)
Etch Oxide, stop at Poly MEMS Gate
CMP equipment

14. Sacrificial Layer 1 Litho/Etch
Define the area for MEMS switch capping

Sacrificial Layer 2

15. Sacrificial layer 2 Deposition
Oxide (SiO2), Temp: 400C, 0.2-0.5 μm thick,
PECVD Sacrificial Layer 2
Sacrificial Layer 1

16. Sacrificial Layer 2 Litho/Etch
Define the room for MEMS switch

Capping Layer

17. Capping Layer Deposition
SiN or AlN, Temp: 400C, 0.2-0.5 μm thick,
Sputter

18. Capping Layer Litho/Etch
Cap pattern to protect the switch area

19. Top Body Deposition
Polysilicon, Temp: <400C, 500-1000nm thick,
PECVD, In-situ doped polycrystalline,
option: SiGe, Ti, PVD

20. Top Body Litho/Etch
Litho and dry etch to define the top body pattern

21. Sacrificial oxide etch
Vapor HF etch (steam etching)
Vapor Etcher

22. Back-end Dielectric Deposition
Low K material, Temp: <400C, 500-1000nm thick,
PECVD, In-situ doped polycrystalline,
option: SiO2, SiN,

ELECTROMECHANICAL POWER SWITCH INTEGRATED CIRCUITS AND DEVICES AND METHODS THEREOF

CROSS REFERENCE TO RELATED APPLICATION

The present application claims benefit of both U.S. Provisional Patent Application No. 62/206,712, filed Aug. 18, 2015 and U.S. Provisional Patent Application No. 62/328, 525, filed Apr. 27, 2016, and is also related to U.S. patent application Ser. No. 13/975,216, filed Aug. 23, 2013, now U.S. Pat. No. 8,786,130, the entire disclosures of which are incorporated herein by reference.

BACKGROUND

1. Technical Field

The present invention generally relates to semiconductor devices. More particularly, the present invention relates to the integration of micro-electromechanical systems (MEMS) or nano-electromechanical systems (NEMS) with metal-oxide-semiconductor (MOS) devices and processes.

2. Description of the Related Art

The ever increasing demand of small, portable multifunctional electronic devices has led to the continued proliferation of smart phones, personal computing devices, personal audio devices (e.g., MP3 players), as well as biomedical and security devices. Such devices are expected to support and perform a greater number of increasingly complex and sophisticated functions while consuming less and less power. Such electronic devices rely on limited power sources (e.g., batteries and/or alternative energy harvesting systems) while providing ever-increasing processing capabilities and storage capacity.

In an attempt to reduce overall integrated circuit (IC) power consumption, various power gating techniques have been introduced to disable current flow to IC devices and circuitry when not in use, for example, when the device is in a non-operation mode so as to reduce standby consumed power. One common power gating technique includes using MOS transistors to switch connections to power or ground networks ON and OFF. The power gating technique can be understood with reference to FIG. 1, which shows a MOS power gate 102 coupled to a circuit block 104, where the MOS power gate 102 controls the power supplied to the circuit block 104 from a voltage supply ($V_{DD}$) by way of the gate control signal at an input of the MOS power gate 102. For example, in some cases, when the gate control signal is low (logic 0), the MOS power gate 102 is ON, and a virtual $V_{DD}$ coupled to the circuit block 104 is approximately equal to $V_{DD}$. Alternatively, in some cases, when the gate control signal is high (logic 1), the MOS power gate 102 is OFF, and the virtual $V_{DD}$ is approximately zero, thus effectively turning off of the power supplied to the circuit block 104. While the example of FIG. 1 shows the MOS power gate 102 connected between the circuit block 104 and the power network ($V_{DD}$), the MOS power gate 102 could also be coupled between the circuit block 104 and a ground connection ($V_{SS}$). Power gating of electronic devices becomes particularly important for devices that rely on limited power sources, spend a majority of their time in an OFF state or sleep mode (i.e., a non-operation mode), and which only operate on periodic and/or event-driven schedules, such as for example, motion-detecting security systems and biological implants which may only infrequently collect/analyze data or provide a drug release, among others.

The most common way to implement power gates has been through the use of MOS transistors, as illustrated in FIG. 1. However, as the minimum feature size of MOS devices has continuously decreased in an effort to meet stringent demands on device performance and power consumption, the OFF state leakage current has increased, and is rapidly approaching ON state current levels. This increased OFF state leakage, together with the fact that many electronic devices are spending a majority of their time in a non-operation mode, results in a dominant source of power consumption being the OFF state leakage occurring while the device is in a non-operation mode. Moreover, the voltage drop present in MOS devices while in an ON state can significantly degrade device performance, particularly in aggressively scaled and embedded IC devices.

SUMMARY

The problems noted above are solved in large part by use of an electromechanical power switch (e.g., a MEMS/NEMS device) for controlling power to monolithically-integrated circuit (IC) devices, as detailed in U.S. patent application Ser. No. 13/975,216, entitled "METHOD OF FORMING AN ELECTROMECHANICAL POWER SWITCH FOR CONTROLLING POWER TO INTEGRATED CIRCUIT DEVICES AND RELATED DEVICES", filed Aug. 23, 2013, now U.S. Pat. No. 8,786, 130, the entire disclosure of which is incorporated herein by reference.

Additional problems presented by existing power gating processes and devices are solved by embodiments of the present disclosure. For example, at least some of the illustrative embodiments of the present disclosure include using such monolithically integrated MEMS (I-MEMS) and/or integrated NEMS (I-NEMS) devices as integrated decoupling capacitors. In some examples, a given I-MEMS/I-NEMS device may be used as a power gate during a first time and as a decoupling capacitor during a second time. In some embodiments, conversion of the I-MEMS/I-NEMS device between the power gate and decoupling capacitor function may be performed automatically (e.g., via a control circuit, software, etc.) or manually (e.g., via user input). In some cases, a plurality of I-MEMS/I-NEMS devices may be implemented simultaneously, and the function of each of the I-MEMS/I-NEMS devices may be individually controlled. Thus, for examples, some embodiments may include one or more I-MEMS/I-NEMS devices functioning as power gate devices, while simultaneously including one or more I-MEMS/I-NEMS devices functioning as decoupling capacitors.

Other illustrative embodiments include using redundant I-MEMS/I-NEMS devices to serve as redundant power gates. For example, a given IC device (e.g., CPU, GPU, etc.) may include a first set of I-MEMS/I-NEMS devices that serve as a primary power gate and decoupling capacitor(s) and a second set of I-MEMS/I-NEMS devices that serve as a secondary power gate and decoupling capacitor(s). In some cases, the secondary power gate may be used when the primary power gate fails. In some embodiments, when the secondary power gate is not in use, the secondary power gate may be converted to use as a decoupling capacitor.

Yet other illustrative embodiments include using a plurality of I-MEMS/I-NEMS devices to enable a multi-supply I-MEMS/I-NEMS switch, which includes a power gating schemes that would not be practical with conventional MOS technology. For example, in some embodiments, the plurality of I-MEMS/I-NEMS devices may be used as power gates to control power to/from a plurality of power supplies. In various embodiments, such multi-supply I-MEMS/I-NEMS switches may be alternately used as decoupling capacitors and/or combined with additional I-MEMS/I-NEMS devices used as decoupling capacitors.

Still other illustrative embodiments include using I-MEMS/I-NEMS devices to enable an anti-stiction switching method as well as a 3-D decoupling capacitor. It is understood that the above summary contains simplifications, generalizations and omissions of detail and is not intended to be a comprehensive description of the claimed subject matter but, rather, is intended to provide a brief overview of some of the functionality associated therewith. Other systems, methods, functionality, features and advantages of the claimed subject matter will be or will become apparent to one with skill in the art upon examination of the following figures and detailed written description.

BRIEF DESCRIPTION OF THE DRAWINGS

For a more detailed description of the various embodiments, the detailed written description can be read in conjunction with the accompanying figures. It will be appreciated that for simplicity and clarity of illustration, elements illustrated in the figures have not necessarily been drawn to scale. For example, the dimensions of some of the elements are exaggerated relative to other elements. Embodiments incorporating teachings of the present disclosure are shown and described with respect to the figures presented herein, in which:

FIG. 1 shows a schematic diagram of a MOS power gate coupled to a circuit block;

FIG. 2A shows a schematic diagram of an electromechanical power gate coupled to a circuit block, in accordance with some embodiments;

FIG. 2B shows a schematic diagram of an electromechanical power gate, with integrated decoupling capacitors, coupled to a circuit block, in accordance with some embodiments;

FIGS. 6A, 6B, 6C, and 6D illustrate a MEMS/NEMS device having integrated decoupling capacitors, according to some embodiments;

FIGS. 8A/8B and 9A/9B illustrate an example of a device, such as the device of FIGS. 6A, 6B, 6C, and 6D, in operation as well as equivalent circuits corresponding to a particular operational state, according to some embodiments;

FIGS. 10A/10B and 11A/11B illustrate an example of using devices of the present disclosure to implement a dual power-gate/decoupling capacitor circuit, according to some embodiments;

FIGS. 13A/13B and 14A/14B illustrate examples of using devices of the present disclosure to implement a multiple power supply switch circuit, according to some embodiments;

FIGS. 15A/15B and 16A/16B illustrate examples of using devices of the present disclosure to implement an anti-stiction switching circuit, according to some embodiments, FIGS. 15C/16C illustrate an equivalent circuit of a conventional MEMS/NEMS device, and FIGS. 15D/16D illustrate an equivalent circuit of a MEMS/NEMS device corresponding to embodiments of the present disclosure;

FIGS. 17A, 17B, 17C, and 17D illustrate a MEMS/NEMS device having integrated decoupling capacitors, including a plurality of openings/holes, according to some embodiments;

FIGS. 20A, 20B, 20C, 21A, 21B, 21C, 22A, 22B, 22C, 23A, 23B, 23C, 24A, 24B, and 24C include top-down and cross-section views of an embodiment of a MEMS/NEMS device having integrated decoupling capacitors according to aspects of the method of FIG. 19;

FIGS. 25A, 25B, 25C, 25D, and 25E illustrate a method of fabrication of a 4-terminal MEMS/NEMS device, according to some embodiments;

FIGS. 29A, 29B, 30A, 30B, 30C, 30D, 30E, 30F, 30G, 30H, 30J, and 30K include top-down and cross-section views of an embodiment of a MEMS/NEMS device having integrated decoupling capacitors, with a plurality of 3-D features, according to aspects of the method of FIG. 28;

FIGS. 31 and 32 illustrate capacitance values versus capacitor area, for capacitors having a variety of oxide thickness and a variety of dielectric materials, in accordance with some embodiments;

FIG. 33 provides a table showing properties of SiO2 and Si3N4, which are two of a plurality of materials that may be used in the implementation of one or more of the embodiments of the present disclosure;

FIGS. 34A/34B illustrate a MEMS/NEMS device having integrated decoupling capacitors, including an input decoupling capacitor having a larger area than an output decoupling capacitor, according to some embodiments;

FIG. 35 shows a top-view of a device which may include an array of embedded/integrated electromechanical power switches and a plurality of integrated decoupling capacitors, including an input decoupling capacitor having a larger area than an output decoupling capacitor, according to some embodiments;

FIGS. 36A/36B illustrate a MEMS/NEMS device having integrated decoupling capacitors, including an input decoupling capacitor while not including an output decoupling capacitor, according to some embodiments;

FIGS. 37/38 illustrate a top-view and cross-section view, respectively, of a 3D (e.g., vertical) multi-layer capacitor, according to some embodiments;

FIGS. 39/40 illustrate a top-view and cross-section view, respectively, of an array of 3D (e.g., vertical) multi-layer capacitors, according to some embodiments;

FIGS. 41, 42, 43, 44, 45, 46, 47, 48, 49, and 50 illustrate a process flow which may be used to fabricate a multi-layer capacitor, such as the multi-layer capacitor of FIGS. 37/38, according to some embodiments;

FIGS. 52, 53, 54, 55, 56, 57, and 58 illustrate the structure and operation of various embodiments of a MEMS/NEMS device useful for implementing a dual electrostatic forces (e.g., dual eForces) I-MEMS/I-NEMS structure;

FIGS. 59, 60, 61, 62, 63, 64, 65, 66, 67, 68, 69, 70, 71, 72, 73, 74, 75, and 76 illustrate a process flow which may be used to fabricate dual eForces MEMS/NEMS devices and/or circuits; and

DETAILED DESCRIPTION

Figure 2C:
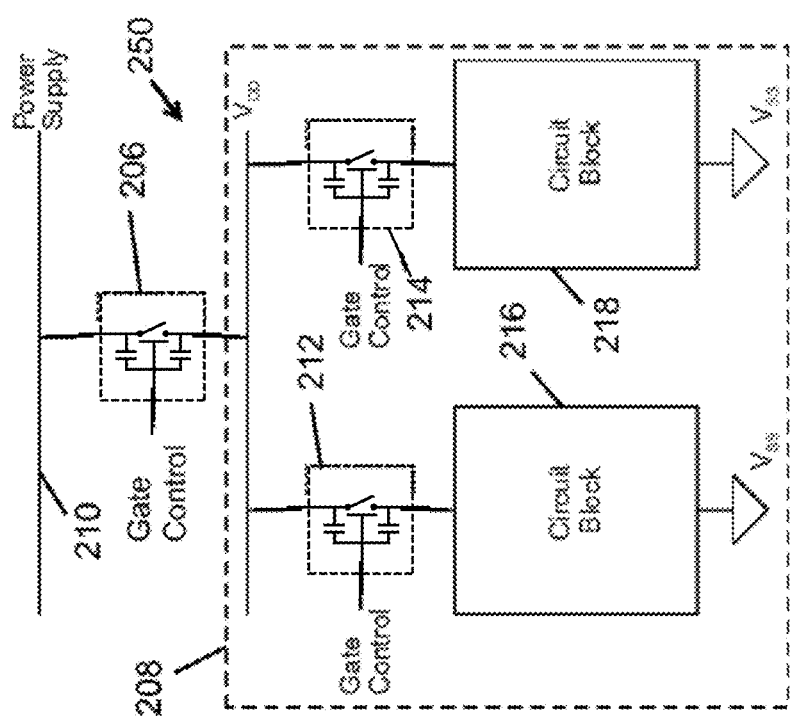
FIG. 2C shows a schematic diagram of an electromechanical power gate, with integrated decoupling capacitors, coupled to a circuit block and/or an integrated circuit (IC) device, in accordance with some embodiments.

The following discussion is directed to various embodiments which provide a method, a device, and a system for controlling power to an integrated circuit (IC) device. Although one or more of these embodiments may be preferred, the embodiments disclosed should not be interpreted, or otherwise used, as limiting the scope of the disclosure, including the claims, unless otherwise specified. In addition, one skilled in the art will understand that the following description has broad application, and the discussion of any embodiment is meant only to be exemplary of that embodiment, and not intended to intimate that the scope of the disclosure, including the claims, is limited to that embodiment. Also, layers and/or elements depicted herein are illustrated with particular dimensions and/or orientations relative to one another for purposes of simplicity and ease of understanding, and actual dimensions and/or orientations of the layers and/or elements may differ substantially from that illustrated herein.

Certain terms are used throughout the following description and claims to refer to particular system components. As one skilled in the art will appreciate, various companies may refer to a component by different names. This document does not intend to distinguish between components that differ in name but not function. In the following discussion and in the claims, the terms "including" and "comprising" are used in an open-ended fashion, and thus should be interpreted to mean "including, but not limited to . . . ". Also, the term "couple" or "couples" is intended to mean either an indirect or direct connection. Thus, if a first device couples to a second device, that connection may be through a direct connection, or through an indirect connection via other devices and connections. Unless otherwise stated, when a layer is said to be "deposited over the substrate" or "formed over the substrate", it means that the layer is deposited or formed over any topography that already exists on the substrate.

The subject matter disclosed herein is directed to methods associated with formation of an electromechanical power switch (e.g., a MEMS- and/or NEMS-based switch), which in some cases may be used as a decoupling capacitor and/or used in tandem with another MEMS/NEMS switch that is used as a decoupling capacitor. Such switches and decoupling capacitors may be used for controlling power to an IC device, such as a complementary metal-oxide-semiconductor (CMOS) device, a bipolar-CMOS (BiCMOS) device, an n-type MOS (NMOS) device, a p-type (PMOS) device, and more generally for controlling power to any of a plurality of circuit blocks including at least one of the above-mentioned IC devices, such as a logic circuit, a central processing unit (CPU), a graphics processing unit (GPU), a microcontroller unit (MCU), a radio frequency (RF) circuit, an analog circuit, a memory, a memory controller, and an input/output (I/O) interface, among others. As used herein, the term "controlling power" (e.g., to an IC device and/or circuit block) is equivalently used to mean "gating a voltage supply" (e.g., to an IC device and/or circuit block). Thus, for example, an electromechanical switch that controls power to an IC device and/or circuit block is understood equivalently as an electromechanical switch that gates a voltage supply to the IC device and/or circuit block.

The potential performance gains afforded by MEMS/NEMS devices, including near infinite OFF state resistance, low ON state resistance afforded by ohmic metal-metal contacts, and the increased device density due to small device footprints have continued to drive significant interest in CMOS-MEMS/NEMS integration. Various CMOS-MEMS/NEMS integration schemes have been reported, including a hybrid fabrication approach as well as a variety of monolithic (i.e., single substrate) approaches. In the hybrid approach, CMOS and MEMS/NEMS ICs are each fabricated separately and bonded, and electrical connections between the two ICs are then made. The hybrid approach suffers from high assembly and packaging costs, as well as significant performance-limiting parasitic resistance, largely due to bond pads and bonding wires used for the interconnection between the separate CMOS and MEM/NEMS ICs. Moreover, using separate substrates for each of the CMOS and MEMS/NEMS ICs makes it very challenging to increase device density. Monolithic integration of CMOS and MEMS/NEMS ICs can improve overall device performance, for example, by reducing parasitic resistance, among others. Monolithic integration can also improve on-chip device density. Exemplary methods of monolithic integration include formation of CMOS devices using standard semiconductor processing techniques, followed by formation of a MEMS structure. However, the monolithic integration schemes studied thus far have largely been narrowly focused on specific types of MEMS devices (e.g., high aspect ratio MEMS devices, MEMS inertial sensors, etc.). Moreover, with regards to power gating techniques, the IC industry still heavily relies on leaky MOS-based power gates. Thus, an improved power gating method utilizing an electromechanical power gate (e.g., a MEMS and/or NEMS-based power gate) for controlling power to any of a plurality of circuit blocks is needed. Moreover, methods and devices for ensuring signal integrity (e.g., in a power distribution system) are also needed, and are addressed by embodiments of the present disclosure, as described below.

As illustrated in FIG. 1, a power switch can be used to implement a power gating technique, wherein the standby consumed power is reduced by using power gating transistors to switch off inactive or non-operational IC devices or circuitry. Further, as traditional MOS-based power gates suffer from significant power consumption due to the OFF state leakage of the MOS device, there is a need for an alternative power gating technique that does not rely on leaky MOS-based power gates. Such an alternative exists in the form of using an electromechanical switch as the power gate, as illustrated in FIG. 2A. The structure of the electromechanical switch of FIG. 2A, as well as the methods of making and using the electromechanical switch, are described in U.S. patent application Ser. No. 13/975,216, entitled "METHOD OF FORMING AN ELECTROMECHANICAL POWER SWITCH FOR CONTROLLING POWER TO INTEGRATED CIRCUIT DEVICES AND RELATED DEVICES", filed Aug. 23, 2013, now U.S. Pat. No. 8,786,130, the entire disclosure of which is incorporated herein by reference.

By way of example, the electromechanical switch 202 may be coupled to a circuit block 204, where the electromechanical switch 202 and the circuit block 204 are monolithically integrated on the same substrate. Moreover, the electromechanical switch 202 controls the power supplied to the circuit block 204 from the voltage supply ($V_{DD}$) by way of a gate control signal at an input of the electromechanical switch 202. In various embodiments, the circuit block 204 includes at least one of a logic circuit, a CPU, a GPU, an MCU, an RF circuit, an analog circuit, a memory, a memory controller, an I/O interface, a cache, a network interface, and/or subsystems of these devices/circuits. In other embodiments, the circuit block 204 includes any of a plurality of IC devices, such as a CMOS device, a BiCMOS device, an NMOS device, and/or a PMOS device, a logic circuit, a CPU, a GPU, an MCU, an RF circuit, an analog circuit, a memory, a memory controller, an I/O interface, a cache, a network interface, a very large scale integration (VLSI) chip, an ultra large scale integration (ULSI) chip, or a system-on-a-chip (SOC), among others. The electromechanical switch 202 operates by actuation of a cantilever to close an air gap and provide contact between two metal electrodes. For purposes of this disclosure, the terms "electromechanical switch" or "electromechanical power gate" are meant to include MEMS-based switches and MEMS-based power gates, as well as NEMS-based switches and NEMS-based power gates. In an exemplary example, when the gate control signal is activated, the electromechanical switch 202 is ON, causing the two metal electrodes of the electromechanical switch 202 to contact one another, and a virtual $V_{DD}$ coupled to the circuit block 204 is approximately equal to $V_{DD}$. When in contact, the two metal electrodes provide a very low-resistance contact which minimizes parasitic voltage drop across the electromechanical switch 202. In an alternative embodiment, when the gate control signal is not activated, the electromechanical switch 202 is OFF, and the virtual $V_{DD}$ is zero. Moreover, when the electromechanical switch is in an OFF state, an air gap between the two metal electrodes provides a near infinite OFF-state resistance and thus essentially zero OFF-state current, which is unachievable with MOS devices, and thus completely turning off of the power supplied to the circuit block 204. While the example of FIG. 2A shows the electromechanical switch 202 between the circuit block 204 and the power network ($V_{DD}$), the electromechanical switch 202 could also be coupled between the circuit block 204 and a ground connection ($V_{SS}$).

As discussed above, electromechanical power switches (e.g., FIG. 2A) can be used to implement a power gating technique, and thus may be part of a power distribution system (PDS). In general, a power distribution system (PDS) may be used to supply/distribute power (e.g., via one or more power supplies) across internal connections of an integrated circuit (IC), through an IC package, through a printed circuit board (PCB), through a backplane, and/or through inter-system connections, among others. A key consideration of any PDS is signal integrity (i.e., the quality of an electrical signal, such as a power supply signal). In some examples, inadequate signal integrity of a PDS may lead to degraded device and/or circuit performance, as well as device and/or circuit failure. At least some methods of achieving signal integrity include the use of decoupling capacitors (e.g., in a PDS system). In various examples, decoupling capacitors may be used to reduce switching noise in the PDS. In some cases, noise caused by other circuit elements may be shunted through a decoupling capacitor, reducing the effect of the noise on the IC. Decoupling capacitors may be used to reduce noise from any of a variety of sources. For example, in a radio frequency (RF) circuit, electrical noise may be generated by oscillators, amplifier circuits, and/or other circuit elements as known in the art. In a digital circuit environment, electrical noise may be generated by switching (e.g., including power gate switching), by power supplies, and by regulators, among others. In digital ICs, for example, electrical noise may lead to detection of a false-high and/or false-low signal, as well as voltage droop, resistive/inductive delays, as well as other issues as known in the art. Methods for achieving signal integrity, including the use of decoupling capacitors, can be used to reduce such electrical noise and provide clean logic states (i.e., clean logic '0' and logic '1' states). In some examples, electrical noise may be viewed as a voltage ripple (or voltage drop across an ideal capacitor), at a given current 'I', where such a ripple voltage may be defined by the equation: $V=I/\omega C$. Thus, to a first-order, an increase in capacitance 'C' (e.g., provided by a decoupling capacitor) will result in a reduction in the ripple voltage when an IC device draws current. Additional discussion related to decoupling capacitors is provided in the publication by Yun Chase entitled "Introduction to Choosing MLC Capacitors for Bypass/Decoupling Applications", AVX Corporation, Datasheet S-ITCMLC2.5M201-N, 2004, the entirety of which is incorporated herein by reference.

With reference now to FIG. 2B, illustrated therein is a circuit block 203 including an electromechanical switch 205, and integrated decoupling capacitors 207, that may be coupled to the circuit block 204, where the circuit block 203 and the circuit block 204 are monolithically integrated on the same substrate. Similar to the example of FIG. 2A, the electromechanical switch 205 of the circuit block 203 (shown in FIG. 2B) may control the power supplied to the circuit block 204 from the voltage supply ($V_{DD}$) by way of a gate control signal at an input of the electromechanical switch 205, while also reducing electrical noise and providing improved signal integrity by use of the integrated decoupling capacitors 207. In at least some embodiments, the electromechanical switch 205 may operate similarly to the electromechanical switch 202, as discussed above. In some embodiments, the electromechanical power switch 205 may itself be used alternately as either a power switch or as a decoupling capacitor. In some cases, one or both of the integrated decoupling capacitors 207 may be used alternately as either a power switch or as a decoupling capacitor. In some examples, one or both of the integrated decoupling capacitors 207 may include dedicated decoupling capacitors to be used in tandem with electromechanical switch 205. While the example of FIG. 2B shows the circuit block 203 between the circuit block 204 and the power network ($V_{DD}$), the circuit block 203 could also be coupled between the circuit block 204 and a ground connection ($V_{SS}$).

Expanding on the example of FIG. 2B, FIG. 2C illustrates a system 250 which shows an embodiment where a circuit block 206, including an electromechanical switch and decoupling capacitor(s), is coupled to an IC device 208, where the circuit block 206 and the IC device 208 are monolithically integrated on the same substrate. Moreover, the circuit block 206 controls the power supplied to the IC device 208 from a power supply 210 by way of a gate control signal at an input of the electromechanical switch of the circuit block 206, while the decoupling capacitors of the circuit block 206 reduce electrical noise. In various embodiments, the IC device 208 includes at least one of a logic circuit, a CPU, a GPU, an MCU, an RF circuit, an analog circuit, a memory, a memory controller, an I/O interface, a cache, a network interface, and/or subsystems of these devices/circuits. In other embodiments, the IC device 208 includes any of a plurality of IC devices, such as a CMOS device, a BiCMOS device, an NMOS device, and/or a PMOS device, among others. Furthermore, the IC device 208 may include a very large scale integration (VLSI) chip, an ultra large scale integration (ULSI) chip, or a system-on-a-chip (SOC), among others. Moreover, the circuit block 206 may be coupled to a plurality of circuit blocks 212, 214 within the IC device 208, wherein each of the circuit blocks 212, 214 may also include an electromechanical switch and decoupling capacitor(s), and where circuit block 212 is coupled to a circuit block 216 and circuit block 214 is coupled to a circuit block 218. The circuit block 212 may control the power supplied to the circuit block 216 from the voltage supply ($V_{DD}$) by way of a gate control signal at an input of the electromechanical switch of the circuit block 212, while the decoupling capacitors of the circuit block 212 reduce electrical noise. Likewise, the circuit block 214 may control the power supplied to the circuit block 218 from the voltage supply ($V_{DD}$) by way of a gate control signal at an input of the electromechanical switch of the circuit block 214, while the decoupling capacitors of the circuit block 214 reduce electrical noise. Thus, as shown in FIG. 2C, each of the plurality of electromechanical switches of the circuit blocks 212, 214 may control the power supplied to individual circuit blocks within the IC device 208, and the electromechanical switch of the circuit block 206 may control the power supplied to the overall IC device 208. While the example of FIG. 2C discusses embodiments where the circuit block 206 and the IC device 208 are monolithically integrated on the same substrate, those skilled in the art will recognize that some embodiments, for example using the hybrid approach, may be implemented where the circuit block 206 and the IC device 208 are each fabricated separately and bonded, and electrical connections between the circuit block 206 and the IC device 208 are subsequently made.

Figure 3:
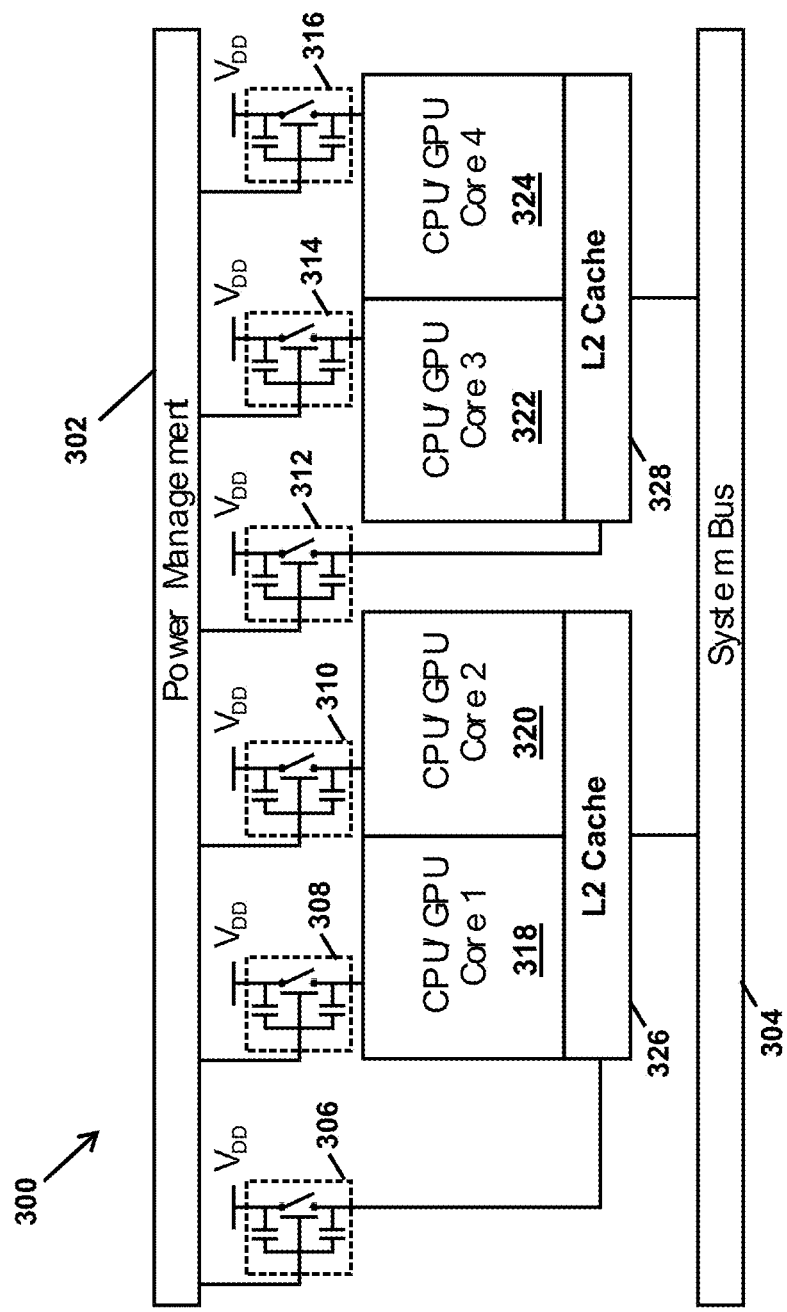
FIG. 3 illustrates a schematic representation of an exemplary CPU/GPU power management system according to some embodiments.

FIG. 3 depicts a schematic representation of an exemplary CPU/GPU power management system 300, which may be part of a data processing system as described below with reference to FIG. 4, and which is useful for implementing MEMS/NEMS-based power gating, while using integrated decoupling capacitors. In some embodiments, the power management system 300 may be a power distribution system (PDS) and/or may form part of a PDS. The CPU/GPU power management system 300 may include a plurality of CPU/GPU cores 318, 320, 322, 324. CPU/GPU cores 318, 320 are coupled to L2 cache 326, and CPU/GPU cores 322, 324 are coupled to L2 cache 328. Each of the CPU/GPU cores 318, 320, 322, 324 may communicate with an external computer and/or data processing system by way of a system bus 304.

As shown in FIG. 3, a voltage supply $V_{DD}$ connects to each of the CPU/GPU cores and L2 caches through a MEMS/NEMS-based electromechanical switch. More specifically, the voltage supply $V_{DD}$ connects to each of the CPU/GPU cores and L2 caches through a circuit block that includes both a MEMS/NEMS-based electromechanical switch as well as one or more decoupling capacitors. For example, a circuit block 306 (including an electromechanical switch and decoupling capacitors) is coupled to the L2 cache 326, a circuit block 308 (including an electromechanical switch and decoupling capacitors) is coupled to the CPU/GPU core 318, a circuit block 310 (including an electromechanical switch and decoupling capacitors) is coupled to the CPU/GPU core 320, a circuit block 312 (including an electromechanical switch and decoupling capacitors) is coupled to the L2 cache 328, a circuit block 314 (including an electromechanical switch and decoupling capacitors) is coupled to the CPU/GPU core 322, and a circuit block 316 (including an electromechanical switch and decoupling capacitors) is coupled to the CPU/GPU core 324.

In various embodiments, at least one of the circuit blocks 306, 308, 310, 312, 314, 316 is monolithically integrated on the same substrate as the CPU/GPU core and/or L2 cache to which it is coupled. In some embodiments, activation (i.e., actuation) of each of the electromechanical switches within each of the circuit blocks 306, 308, 310, 312, 314, 316 may be controlled by a power management unit 302. In some embodiments, the power management unit 302 includes a power switch circuit. The power switch circuit may include any of a plurality of IC devices, such as CMOS, BiCMOS, NMOS, and/or PMOS devices, among others. Further, in some embodiments, the power switch circuit may be monolithically integrated on the same substrate as the electromechanical switch and/or circuit block to which it is coupled. In various embodiments, power consumption within the CPU/GPU power management system 300 can be reduced by shutting off power to one or more of the CPU/GPU cores and/or L2 caches, for example, during periods of inactivity and/or non-operation. Illustratively, in response to a signal from the power management unit 302, one or more of the electromechanical switches within the circuit blocks 306, 308, 310, 312, 314, 316 may be actuated in such a way so as to turn off power to one or more of the CPU/GPU cores and/or L2 caches. In some embodiments, an entire CPU/GPU core is shut off by way of one of the electromechanical switches within the circuit blocks 306, 308, 310, 312, 314, 316. In other embodiments, at least one CPU/GPU core internal component, such as an arithmetic logic unit (ALU), a control unit (CU), and/or a register, is shut off by way of one of the electromechanical switches within the circuit blocks 306, 308, 310, 312, 314, 316.

In the various examples discussed above, in addition to controlling a voltage supply to one or more of the CPU/GPU cores and/or L2 caches by way of the electromechanical switches within the circuit blocks to which they are connected, the decoupling capacitors within each of the respective circuit blocks may simultaneously be effectively employed to reduce electrical noise. Additionally, for example in embodiments where one or both of the integrated decoupling capacitors within the circuit blocks 306, 308, 310, 312, 314, 316 are capable of being used alternately as either a power switch or as a decoupling capacitor, the selected configuration (i.e., either decoupling capacitor or power switch) may be selected in response to a signal received by the power management unit 302. While FIG. 3 shows each of the circuit blocks 306, 308, 310, 312, 314, 316 coupled between the voltage supply $V_{DD}$ and one of the CPU/GPU cores or L2 caches, one or more of the circuit blocks 306, 308, 310, 312, 314, 316 could instead be coupled between a ground connection (not shown) and one of the CPU/GPU cores or L2 caches.

Figure 4:
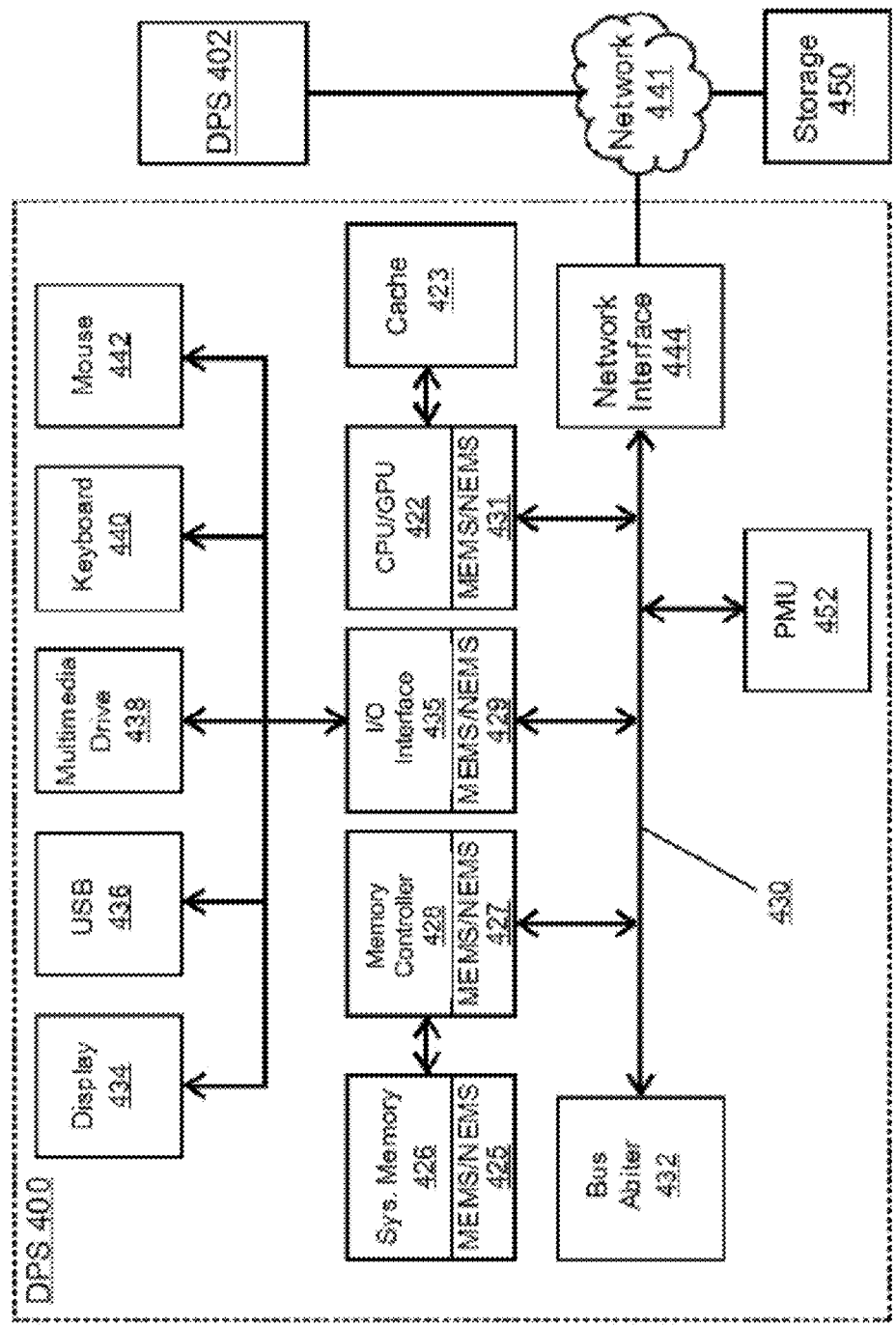
FIG. 4 provides a block diagram representation of an example data processing system within which one or more of the described embodiments may be practiced.

Expanding the discussion as related to FIG. 3, FIG. 4 illustrates a block diagram representation of an example data processing system (DPS) 400, as utilized within some embodiments. The DPS 400 is useful for implementing MEMS/NEMS-based power gating, for example while using integrated decoupling capacitors, where power to one or more DPS circuit blocks is controlled by a MEMS/NEMS device (that may be used in tandem with one or more decoupling capacitors) and a power management unit, as described below. As used herein, the term "data processing system," is intended to include any type of computing device or machine that is capable of receiving, storing and running a software product including not only computer systems, but also devices such as communication devices (e.g., routers, switches, pagers, telephones, electronic books, electronic magazines and newspapers, etc.) and personal and home consumer devices (e.g., handheld computers, Web-enabled televisions, home automation systems, multimedia viewing systems, etc.).

As shown in FIG. 4, a DPS 400 may comprise a CPU/GPU 422 including a MEMS/NEMS circuit block 431, a system memory 426 including a MEMS/NEMS circuit block 425, where the system memory 426 is coupled to a memory controller 428 which includes a MEMS/NEMS circuit block 427, and a system interconnect 430 that couples the memory controller 428 to the CPU/GPU 422 and other components of the DPS 400. In various embodiments, each of the MEMS/NEMS circuit blocks 431, 425, 427 may include one or more electromechanical switches and one or more decoupling capacitors, as described above. The system interconnect 430 in an embodiment can be an address and data bus. Commands on the system interconnect 430 are communicated to various system components under the control of a bus arbiter 432.

The DPS 400 can further include cache memory 423 for high speed storage of frequently used data. The cache memory 423 can be connected to or communicatively coupled to the CPU/GPU 422. While the cache memory 423 is shown operatively connected to the CPU/GPU 422, the cache memory 423 can also operatively be a part of the system memory 426.

The DPS 400 further includes computer readable storage media, such as one or more multimedia drives 438, including for example hard disk drives. Multimedia drives 438 provide non-volatile storage for the DPS 400. The DPS 400 also includes one or more user interface devices, which allow a user to provide input and receive output from the DPS 400. For example, user interface devices can include displays 434, keyboards 440, universal serial bus (USB) ports 436, and pointing devices such as a mouse 442. The multimedia drives 438 and the various user interface devices can be communicatively coupled to the system interconnect 430 by an I/O interface 435 which includes a MEMS/NEMS circuit block 429. In some embodiments, the MEMS/NEMS circuit block 429 may also include one or more electromechanical switches and one or more decoupling capacitors, as described above. Although the description of computer readable storage media above refers primarily to a hard disk, it should be appreciated by those skilled in the art that other types of media which are readable by a computer, such as removable magnetic disks, CD-ROM disks, magnetic cassettes, flash memory cards, digital video disks, Bernoulli cartridges, and other later-developed hardware, may also be used in the exemplary computer operating environment.

In some embodiments, actuation of electromechanical switches within each of the MEMS/NEMS circuit blocks 425, 427, 429, 431 may be controlled by a power management unit (PMU) 452, which is communicatively coupled to each of the MEMS/NEMS circuits blocks 425, 427, 429, 431 by way of the system interconnect 430. In some embodiments, the power management unit 452 includes a power switch circuit. The power switch circuit may include any of a plurality of IC devices, such as CMOS, BiCMOS, NMOS, and/or PMOS devices, among others. Moreover, each of the electromechanical switches of each of the MEMS/NEMS circuit blocks 425, 427, 429, 431 may be used to control power grid connectivity of the circuit blocks to which each of the electromechanical switches are coupled, for example, to reduce power consumption during periods of inactivity and/or non-operation. At the same time, each of the one or more decoupling capacitors within each of the MEMS/NEMS circuit blocks 425, 427, 429, 431 may be used to reduce electrical noise to between each of the MEMS/NEMS circuit blocks 425, 427, 429, 431 and the DPS 400 circuit blocks to which each of the MEMS/NEMS circuit blocks 425, 427, 429, 431 are coupled. For example, the electromechanical switch of the MEMS/NEMS circuit block 425 can be used to control power to the system memory 426, while the decoupling capacitors of the MEMS/NEMS circuit block 425 reduce electrical noise. Similarly, the electromechanical switch of the MEMS/NEMS circuit block 427 can be used to control power to the memory controller 428, while the decoupling capacitors of the MEMS/NEMS circuit block 427 reduce electrical noise. Likewise, the electromechanical switch of the MEMS/NEMS circuit block 429 can be used to control power to the I/O interface 435, while the decoupling capacitors of the MEMS/NEMS circuit block 429 reduce electrical noise. Also, the electromechanical switch of the MEMS/NEMS circuit block 431 can be used to control power to the CPU/GPU 422 as well as to the cache memory 423, as discussed with reference to FIG. 3, while the decoupling capacitors of the MEMS/NEMS circuit block 431 reduce electrical noise. In some embodiments, the entire CPU/GPU 422 may be shut off by way of the electromechanical switch of the MEMS/NEMS circuit block 431. In other embodiments, at least one CPU/GPU internal component, such as an ALU, a CU, and/or a register, is shut off by way of the electromechanical switch of the MEMS/NEMS circuit block 431. Illustratively, in response to a signal from the power management unit 452, one or more of the electromechanical switches within the MEMS/NEMS circuit blocks 425, 427, 429, 431 may be actuated in such a way so as to turn off power to one or more of the system memory 426, the memory controller 428, the I/O interface 435, and the CPU/GPU 422. Additionally, for example in embodiments where one or more of the integrated decoupling capacitors within the MEMS/NEMS circuit blocks 425, 427, 429, 431 are capable of being used alternately as either a power switch or as a decoupling capacitor, the selected configuration (i.e., either decoupling capacitor or power switch) may be selected in response to a signal received by the power management unit 452. While the description of FIG. 4 has described using a MEMS/NEMS-based power gating technique, with integrated decoupling capacitors, for a specific subset of circuit blocks of the DPS 400, namely the system memory 426, the memory controller 428, the I/O interface 435, and the CPU/GPU 422, it will be appreciated that power supplied to other functional blocks within the DPS 400, such as for example the bus arbiter 432, the network interface 444, and each of the I/O devices including the display 434, the USB port 436, the multimedia drive 438, the keyboard 440, and the mouse 442, may similarly be controlled by using a MEMS/NEMS-based power gating technique and utilizing integrated coupling capacitors, as described herein.

The DPS 400 may also operate in a networked environment using logical connections to one or more remote computers or hosts, such as a DPS 402. The DPS 402 may be a computer, a server, a router or a peer device and typically includes many or all of the elements described relative to the DPS 400. In a networked environment, program modules employed by the DPS 400, or portions thereof, may be stored in a remote memory storage device 450. The logical connections depicted in FIG. 4 can include connections over a network 441. In one embodiment, the network 441 may be a local area network (LAN). In alternative embodiments, the network 441 may include a wide area network (WAN). The DPS 400 is connected to the network 441 through an input/output interface, such as a network interface 444. It will be appreciated that the network connections shown are exemplary and other means of establishing a communications link between the computers may be used.

The electromechanical switches and integrated decoupling capacitors used to implement the various MEMS/NEMS-based power gating embodiments as shown in FIGS. 2B, 2C, 3, and 4 can be monolithically integrated with any of a plurality of circuit blocks in accordance with a variety of methods, as discussed below, using standard semiconductor processing techniques, such as for example, photolithography, etching processes (e.g., wet, dry, and/or plasma etching), deposition processes, and/or other standard processes. Moreover, the electromechanical switches and decoupling capacitors discussed herein may include a plurality of configurations, structural features, and materials such as metal, polycrystalline silicon (poly-Si), dielectrics, and/or other materials well known in the art. For example, in some embodiments, the electromechanical switches may include a vertical structure, where a MEMS/NEMS structural layer (e.g., a cantilever) is actuated in a vertical direction. In other embodiments, the electromechanical switches may include a lateral structure, where the MEMS/NEMS structural layer is actuated in a horizontal direction. In some embodiments, the decoupling capacitors may include MEMS/NEMS devices configured to operate as decoupling capacitors, as discussed below. In some cases, the decoupling capacitors may include dedicated decoupling capacitors used in tandem with one or more MEMS/NEMS electromechanical switches. The discussion of specific processes, configurations, structural features, and/or materials used in the formation of the electromechanical switches and decoupling capacitors discussed herein is not meant to be limiting, and the choice of specific processes, device configurations, structural features, and/or materials may vary depending, for example, on the type of MEMS, NEMS, and/or capacitor device that is desired.

Figure 5:
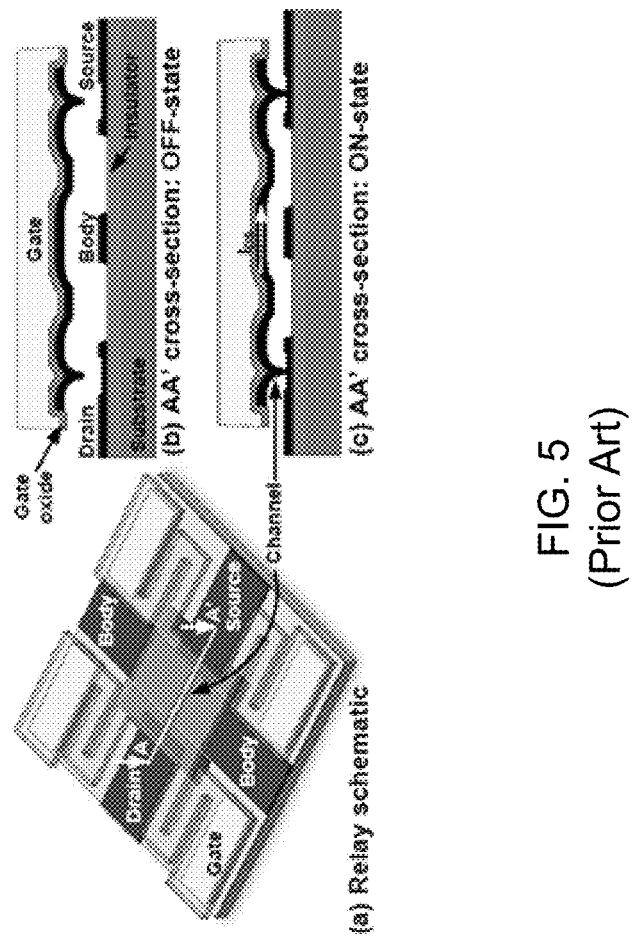
FIG. 5 shows a schematic diagram of a four-terminal (4T) electromechanical switch and cross-section diagrams illustrating the operation of the 4T switch.

In addition to the advantages discussed above, further advantages and benefits of embodiments of the present disclosure will become apparent to those skilled in the art upon reading the discussion that follows, including the description of FIGS. 5-33 below. For example, with reference to FIG. 5, illustrated therein is a schematic diagram of a four-terminal (4T) electromechanical switch, as well as cross-section diagrams illustrating the operation of the 4T switch. In some embodiments, such a 4T electromechanical structure is employed (e.g., as opposed to a 3-terminal structure) in order to reduce an operation voltage (e.g., threshold voltage, $V_{TH}$) of the electromechanical switch. As illustrated in FIG. 5, when the device is OFF (i.e., when a gate-to-body voltage $V_{GB}$ is less than $V_{TH}$), an air gap separates a device channel from the source and drain, ensuring no current flow. As further illustrated in FIG. 5, when the device is ON (i.e., when $V_{GB}$ is equal to or greater than $V_{TH}$), an electrostatic force causes the gate to be deflected downward such that the channel comes into contact with the source/drain electrodes, thereby providing a conductive current path. As also shown in FIG. 5, and in some embodiments of the present disclosure, the gate may include a folded-flexure design (e.g., a spring-like design) in order to relieve residual stress within the gate.

Of particular interest, FIG. 5 also shows the gate electrode overlapping the body. In operation, consider an example where the body voltage $V_B$ is equal to the supply voltage $V_{DD}$ and the gate voltage $V_G$ is equal to zero. In such a biasing configuration, the gate (and conductive channel) may be pulled down to contact the source/drain, thereby turning the device ON. However, consider also that the drain voltage $V_D$ is also equal to $V_{DD}$, and thus when the device is ON, the voltage of the channel may be substantially equal to the body voltage $V_B$. In this case, and in particular due to the overlap between the gate electrode and the body, the gate (and conductive channel) may inadvertently be pushed up away from the source/drain contacts, thereby turning the device OFF when it should be ON. By way of example, such behavior (e.g., due to the overlap between the gate electrode and the body) may be referred to as being caused by parasitic electrostatic forces.

In addition, still referring to FIG. 5, when the device is intentionally switched OFF (e.g., $V_G$ is equal to $V_B$), the gate (and conductive channel) are forced upward by the spring force of the electromechanical device. However, due to stiction (i.e., static friction forces), the surfaces along which the conductive channel contacts the source/drain electrodes may become inadvertently stuck to one another (i.e., they may not disconnect), thereby causing the device to remain ON when it should be OFF. Also, as discussed above, different electromechanical switch devices may be used for a variety of different circuit blocks. In some cases, actuating a particular electromechanical switch (e.g., belonging to a first circuit block) ON or OFF, may cause electrical noise and/or electrical spikes in the power lines of other circuit blocks.

Thus, embodiments of the present disclosure provide methods, devices, and systems for overcoming the shortcomings of existing solutions, including those problems discussed in relation to FIG. 5. For example, embodiments of the present disclosure provide electromechanical switch devices where the gate electrode (and conductive channel) do not overlap the body, thereby avoiding the effect of the parasitic electrostatic forces discussed above. In addition, embodiments of the present disclosure provide methods and devices including MEMS/NEMS integrated decoupling capacitors to reduce electrical noise, as discussed above. In some embodiments, an integrated MEMS/NEMS device may be converted between functioning as a power gate and a decoupling capacitor. Other embodiments include using redundant integrated MEMS/NEMS devices to serve as redundant power gates. In other embodiments, a plurality of integrated MEMS/NEMS devices may be used to enable a multi-power supply MEMS/NEMS switch. In some examples, such multi-supply MEMS/NEMS switches may be alternately used as decoupling capacitors and/or combined with additional MEMS/NEMS devices used as decoupling capacitors. In some embodiments, embodiments integrate MEMS/NEMS devices may be used to enable an anti-stiction switching method as well as a 3-D decoupling capacitor, as discussed below. It is understood that embodiments of the present disclosure offer advantages over the existing art, and various embodiments may offer different advantages; however, not all advantages are necessarily discussed herein, and no particular advantage is required for all embodiments. One of ordinary skill in the art in possession of this disclosure will appreciate that the methods and structures described herein may be equally applicable to other types of devices without departing from the scope of the present disclosure. Moreover, other embodiments and advantages will be evident to those skilled in the art upon reading the present disclosure.

With reference to the discussion below, first some of the various embodiments (e.g., various devices, circuits, structures, etc.) of the present disclosure will be discussed with reference to FIGS. 6A, 6B, 6C, 6D, 7, 8A-8B, 9A-9B, 10A-10B, 11A-11B, 12, 13A-13B, 14A-14B, 15A-15B, and 16A-16B. Thereafter, a discussion of methods of fabrication, related devices, and other aspects of the present disclosure will be given with reference to FIGS. 17-33. While certain examples are discussed herein for purposes of understanding the various aspects of the present disclosure, those skilled in the art will readily appreciate that the present embodiments are not limited by those examples, and that the methods, devices, circuits, structures, etc. may be modified and/or altered in various ways without departing from the scope and spirit of the present disclosure.

Referring now to the examples of FIGS. 6A, 6B, 6C, and 6D, illustrated therein is an embodiment of a MEMS/NEMS device having integrated decoupling capacitors. In the various embodiments described herein, the MEMS/NEMS device and decoupling capacitors may be monolithically integrated on a substrate including one or more IC devices. In some examples, at least some of the monolithic integration processes described herein may be similar to that described in U.S. Pat. No. 8,786,130, which as discussed above, is incorporated herein by reference in its entirety.

Figure 6A:
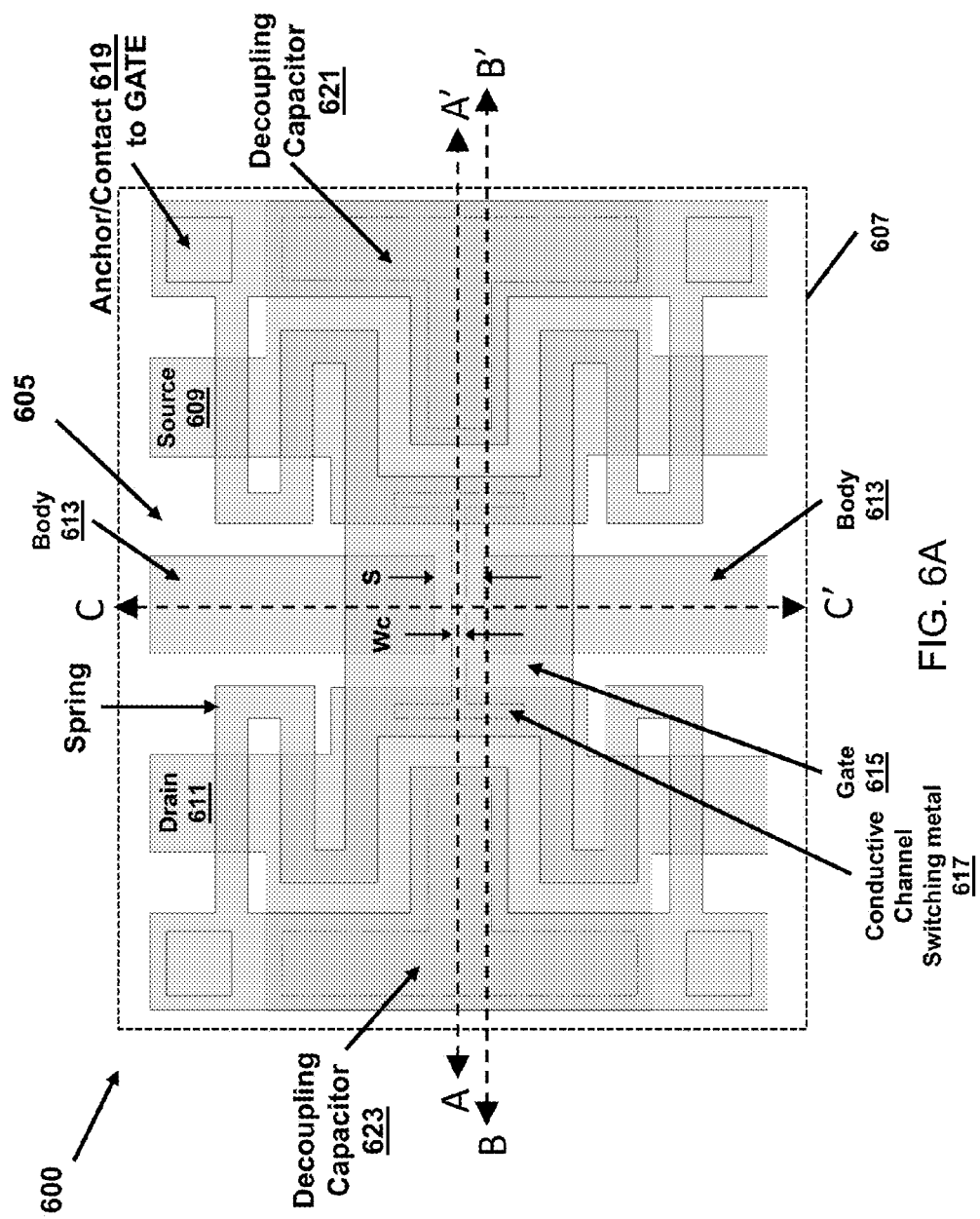

FIG. 6A shows a top-view of a device 600 including an embedded/integrated electromechanical power switch (e.g., MEMS/NEMS device) 605 including a source 609, a drain 611, a body 613, and a gate 615. As discussed above, in some embodiments, the gate 615 may include a folded-flexure design (e.g., a spring-like design) in order to relieve residual stress within the gate 615. Anchors/contacts 619 to the gate 615 are also shown. As shown, the device 600 also includes a plurality of integrated decoupling capacitors 621, 623, which are described in more detail below. In addition, in various embodiments, the body 613 may include a discontinuity (e.g., as shown underneath the gate 615) having a spacing 'S', where at least part of a conductive channel switching metal 617, coupled to the gate 615 (e.g., with a dielectric interposed therebetween), is disposed to pass through the spacing 'S' of the body 613 discontinuity and is configured to have a width 'Wc' that is less than the spacing 'S' of the body 613 discontinuity. Thus, there is no overlap between the gate electrode (conductive channel) and the body, and parasitic electrostatic forces are thereby avoided. In some examples, such a design may be referred to as a "split-body" design.

In some embodiments, the electromechanical power switch 605 may be formed within an area defined by a DPS circuit block 607 in accordance with some embodiments. For example, in some embodiments at least one electromechanical power switch, such as the electromechanical power switch 605, and at least one circuit block, such as the circuit block 607, to which the electromechanical power switch 605 is coupled, are formed within an area on a front surface of a semiconductor substrate. In various embodiments, the area on the front surface of the semiconductor substrate is defined by an area bounded by the circuit block 607. Additionally, in some embodiments, an array of embedded electromechanical power switches (e.g., such as the switch 605) may be formed within a DPS. In various examples, any number of a plurality of electromechanical switches may be formed throughout the DPS, and formation of such a plurality of electromechanical switches is not constrained to an area defined by a DPS circuit block, as discussed above.

FIG. 6B shows a cross-section view of the device 600, along section AA' of FIG. 6A, showing the switch 605 and the decoupling capacitors 621, 623 formed over a semiconductor substrate 630. In various embodiments, any of a plurality of IC devices may be formed within an IC device layer of the semiconductor substrate 630, according to standard semiconductor processing techniques. In some embodiments, the semiconductor substrate 630 includes a silicon (Si) substrate. In other embodiments, the semiconductor substrate 630 may include, for example, a germanium (Ge) substrate, a silicon-germanium (SiGe) substrate, a silicon-on-insulator (SOI) substrate, a silicon carbide (SiC) substrate, a gallium arsenide (GaAs) substrate, an indium arsenide (InAs) substrate, an indium gallium arsenide (InGaAs) substrate, an indium phosphide (InP), or another substrate as well known in the art. The IC devices formed within the IC device layer of the semiconductor substrate 630 may include any combination of a CMOS device, a BiCMOS device, an NMOS device, and/or a PMOS device, among others. Moreover, in some embodiments, at least some of the IC devices formed within the IC device layer of the substrate 630 may form a power switch circuit useful for controlling power to any of a plurality of circuit blocks, where at least some of the IC devices within the IC device layer of the substrate 630 may form circuit blocks such as a logic circuit, a CPU, a GPU, an MCU, an RF circuit, an analog circuit, a memory, a memory controller, and/or an I/O interface, among others. In some embodiments, the IC devices may be stacked within the IC device layer of the substrate 630.

In some embodiments, the formation of an embedded electromechanical power switch 605 and the decoupling capacitors 621, 623 includes the formation of a dielectric layer over the semiconductor substrate 630, for example to electrically isolate and/or protect IC devices within the substrate from the materials (e.g., metal) used to fabricate the switch 605 and the decoupling capacitors 621, 623. However, it will be understood that openings may be formed in such an isolating dielectric layer (e.g., by a patterning and etching process) in order to connect metal layers above the isolating dielectric layer to devices, circuits, and/or other metal layers or interconnects below the isolating dielectric layer. In various embodiments, such an insulating dielectric layer formed over the substrate 630 may include a silicon nitride layer, such as a plasma-enhanced chemical vapor deposition (PECVD) silicon nitride layer, a low-K backend dielectric, or other dielectric as known in the art. As shown in FIG. 6B, the device 600 includes a dielectric layer 632, the source 609, and the drain 611. In some examples, the dielectric 632 may include the isolating dielectric described above. In some embodiments, the dielectric 632 includes a back-end low-K dielectric material. In various embodiments, each of the source and drain 609, 611 may include a metal material such as copper; however other metals known in the art may be used as well. The metal material used to form the source and drain 609, 611 may be isolated from the substrate 630 by the insulating dielectric formed over the substrate 630, as described above.

Each of the decoupling capacitors 621, 623 may include a dielectric layer 636 over the source/drain 609, 611 a metal layer 638 over the dielectric layer 636, a dielectric layer 634 over the metal layer 638, and an electrode 640 over the dielectric layer 634. In some embodiments, the MEMS/NEMS switch 605 includes the conductive channel switching metal 617, a dielectric layer 634 over the switching metal 617, and a gate electrode 641 over the dielectric layer 634. In some embodiments, the switch 605 includes a mechanical structure, such as a cantilever, used to alternately open/close an air gap between at least two electrodes (e.g., which make electrical contact between ends of the switching metal 617 and each of the source and drain 609, 611) and alternately provide a very low-resistance contact or a near-infinite resistance contact. In addition, while the decoupling capacitors 621, 623 are shown as static capacitor structures, in some embodiments, one or both of the decoupling capacitors 621, 623 may be implemented as switches (similar to the switch 605) but may be configured to act as capacitors (e.g., in response to a signal received from the power management unit). For example, in a case where one or both of the decoupling capacitors 621, 623 are implemented as switches, the power management unit may configure one or both of the decoupling capacitors 621, 623 to remain in a closed (actuated) position and thus act as a capacitor (e.g., when using structure similar to the switch 605 to act as a capacitor, when the switch is closed, an air gap may serve as the capacitor dielectric).

Formation of the MEMS/NEMS switch 605, as well as each of the decoupling capacitors 621, 623, may include any of a plurality of processing steps, such as material deposition, photolithography to define patterns in the deposited layers, and etching processes to further define the patterned layers and release the at least one mechanical structure of the MEMS/NEMS structural layer. Such processing steps are described in more detail below, for example, with reference to FIGS. 19-24. In some embodiments, the device 600 may be capped by an encapsulation layer, such as a PECVD thin film layer, a silicon nitride layer, an oxide layer, and/or a combination of the two, among others.

FIG. 6C shows a cross-section view of the device 600, along section BB' of FIG. 6A, showing the switch 605 and the decoupling capacitors 621, 623 formed over a semiconductor substrate 630. As shown in FIG. 6A, section BB' is adjacent and parallel to section AA'. As shown in FIG. 6C, a portion of the body 613 is shown under the switch 605; however, the switching metal 617 does not overlap the body 613, and parasitic electrostatic forces are avoided.

FIG. 6D shows a cross-section view of the device 600, along section CC' of FIG. 6A, which is along the length of the discontinuous body 613. Thus, FIG. 6D illustrates an example of part of a conductive channel switching metal 617 coupled to the gate 615 (e.g., with a dielectric interposed therebetween) disposed within the spacing 'S' of the body 613 discontinuity, wherein the width 'Wc' of the conductive channel switching metal 617 is less than the spacing 'S' of the body 613 discontinuity. Thus, the switching metal 617 does not overlap the body 613, and parasitic electrostatic forces are avoided.

Figure 7:
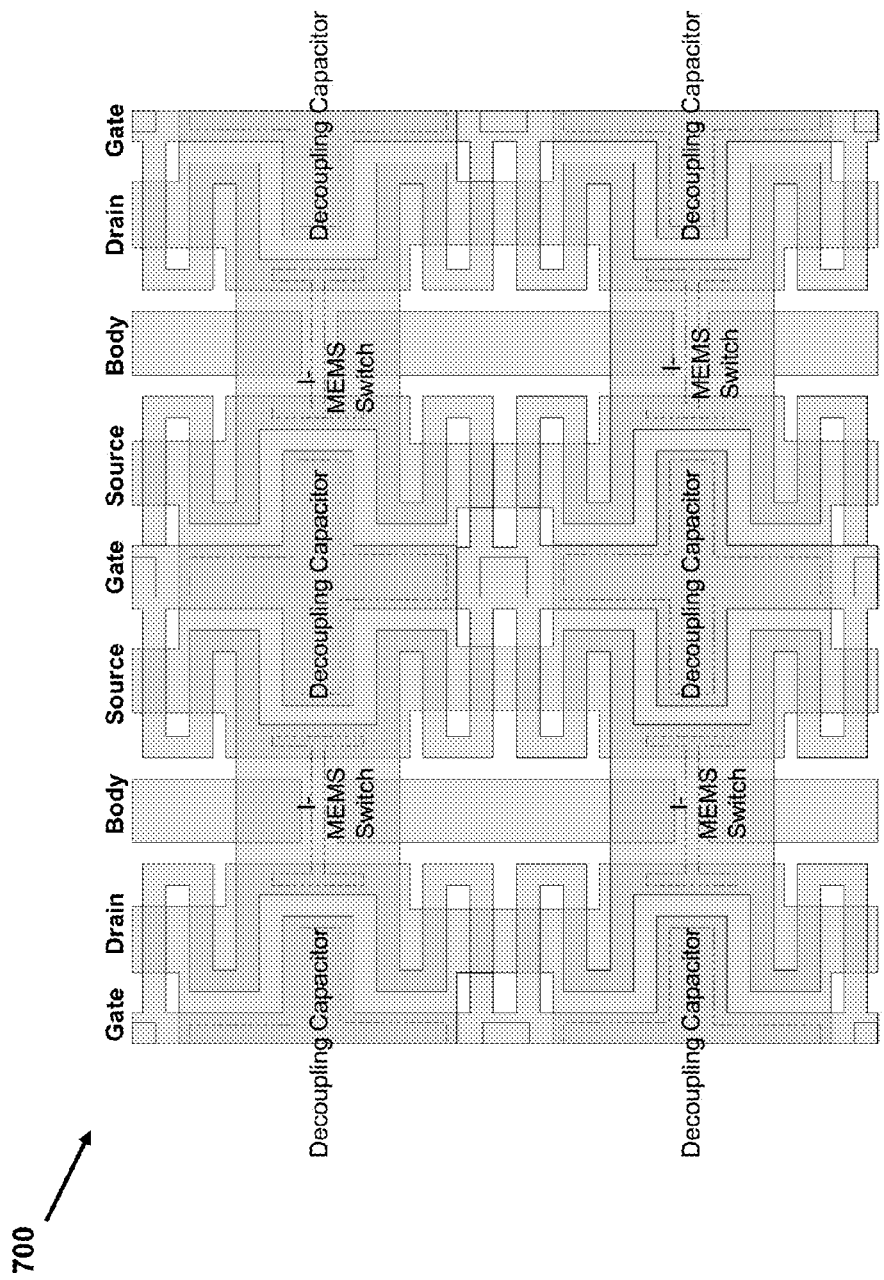
FIG. 7 shows a top-view of a device which may include an array of embedded/integrated electromechanical power switches and a plurality of integrated decoupling capacitors, according to some embodiments.

FIG. 7 shows a top-view of a device 700 which may include an array of embedded/integrated electromechanical power switches (e.g., MEMS/NEMS device) and a plurality of integrated decoupling capacitors. In various embodiments, the switches and decoupling capacitors of the device 700 may be substantially similar to the switch 605 and the decoupling capacitors 621, 623 of FIGS. 6A, 6B, 6C, and 6D, discussed above.

FIGS. 8A/8B and 9A/9B illustrate an example of a device 800 (e.g., which may be substantially the same as the device 600) in operation, together with an equivalent circuit corresponding to a particular operational state. FIGS. 8A/8B and 9A/9B also illustrate the idea that the integrated MEMS/NEMS devices of the present disclosure may be configured as either a power-switch or as a decoupling capacitor. For example, when the MEMS/NEMS switch is OPEN (i.e., in an OFF-state), it becomes a capacitor ($C_{OFF}$). Referring now to FIG. 8A, illustrated therein is the device 800 in an OFF state, where an air gap exists between the switching metal of the switch 805 of the device 800 and the source and drain of the device 800 such that no electrical connection is made, and the device 800 exhibits a near-infinite resistance. FIG. 8A also shows a 'spring connection', which is used to illustrate the folded-flexure gate, as described above. FIG. 8B shows an equivalent circuit 810 of the device 800 in an OFF state. In particular, the equivalent circuit 810 illustrates the circuit between the source and drain of the device 800, which includes the drain capacitance $C_D$ (e.g., gate-to-drain OFF-state capacitance) in series with the source capacitance $C_S$ (e.g., gate-to-source OFF-state capacitance). In some embodiments, the OFF-state capacitance ($C_D$ in series with $C_S$) may be represented as an equivalent OFF-state capacitance $C_{OFF}$, where $1/C_{OFF}=(1/C_D+1/C_S)$.

FIG. 9A shows the device 800 in an ON state, where the switch 805 has been actuated, and where a direct electrical connection exists between the switching metal of the switch 805 and the source and drain of the device 800 such the direct electrical connection provides a very low ON-state resistance. FIG. 9B shows an equivalent circuit 910 of the device 800 in an ON-state. In the ON-state, the drain and source may be connected directly to each other (e.g., bypassing $C_D$ and $C_S$), such that the equivalent circuit 910 may be represented as a short between the source and drain.

FIGS. 10A/10B and 11A/11B illustrate an example of using devices of the present disclosure to implement a dual power-gate/decoupling capacitor circuit, such as a circuit 1000. In some embodiments, such as illustrated in the examples of FIGS. 10A and 11A, the constituent circuit elements 'S0', 'S1', and 'S2' may all include switches (e.g., such as the switch 605), while not necessarily including separate, dedicated decoupling capacitors (e.g., such as the decoupling capacitors 621, 623). Rather, in some embodiments, the switches 'S0', 'S1', 'S2' may be appropriately configured (e.g., as either a power gate switch or as a capacitor) as needed for a given application. To be sure, in some embodiments, each of the switches 'S0', 'S1', 'S2' may alternately include a device such as the device 600, which also includes decoupling capacitors. As shown in FIGS. 10A and 11A, an inverter in also coupled between the gates of switches 'S0'/'S2' and switch 'S1'. Thus, as shown in the example of FIG. 10A, when an ENABLE signal is high (e.g., equal to 1V, equal to $V_{DD}$, or other high value) and $V_{BODY}$ is also high, switches 'S0' and 'S2' may be OFF (near infinite resistance) and switch 'S1' may be ON (very low resistance). FIG. 10B illustrates an equivalent circuit 1010 corresponding to the operational state shown in FIG. 10A. As illustrated in FIG. 10B, with 'S1' providing a ground connection, 'S0' and 'S2' become decoupling capacitors. Referring to the example of FIG. 11A, when an ENABLE signal is low (e.g., equal to 0V, equal to $V_{SS}$, or other low value) and $V_{BODY}$ is high, switches 'S0' and 'S2' may be ON (very low resistance) and switch 'S1' may be OFF (near infinite resistance). FIG. 11B illustrates an equivalent circuit 1110 corresponding to the operational state shown in FIG. 11A. As illustrated in FIG. 11B, with 'S2' providing a ground connection, 'S1' becomes a decoupling capacitor.

Figure 12:
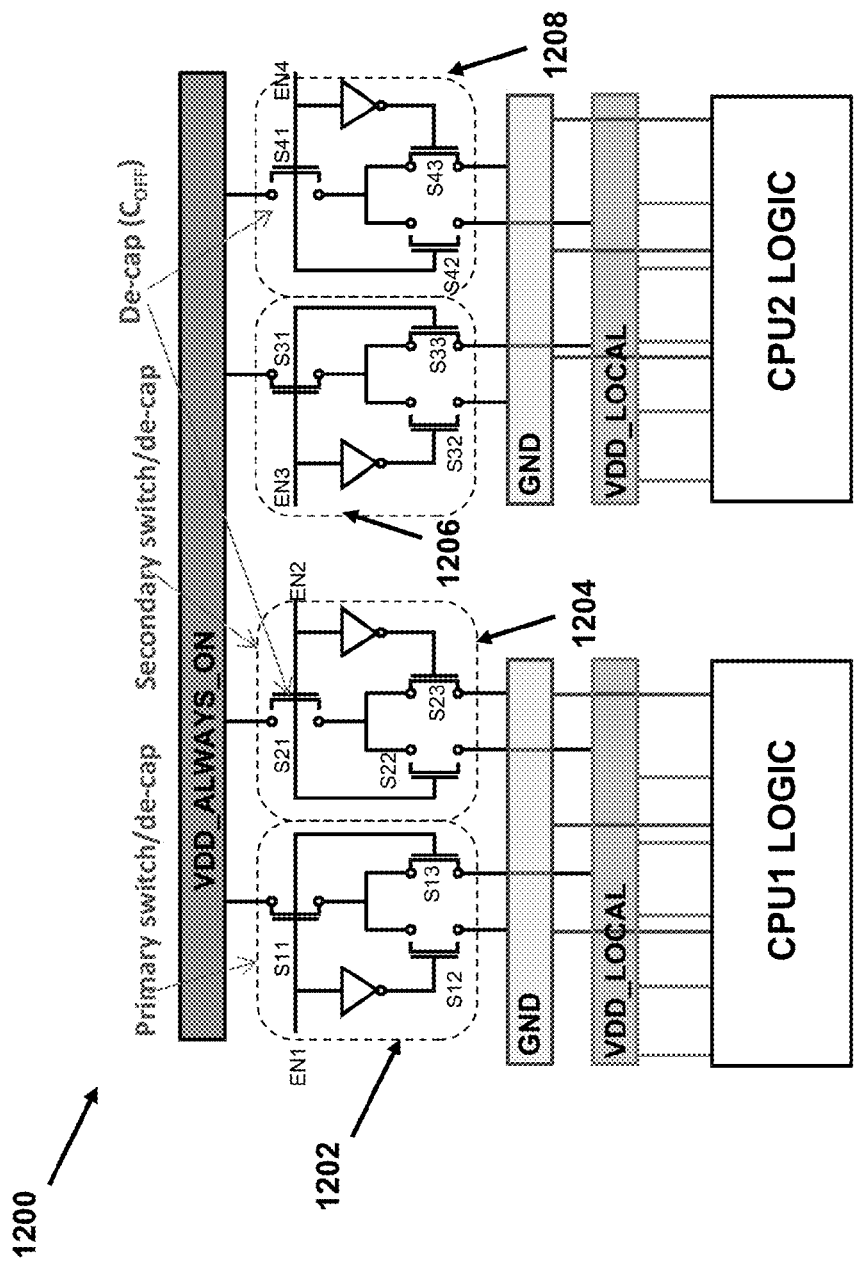
FIG. 12 illustrates an example of using devices of the present disclosure to implement a redundant integrated MEMS/NEMS power gating circuit, according to some embodiments.

FIG. 12 illustrates an example of using devices of the present disclosure to implement a redundant integrated MEMS/NEMS power gating circuit, such as a circuit 1200. In some embodiments, as shown in the example of FIG. 12, each of a plurality of CPUs (e.g., CPU 1 and CPU 2) has at least 2 sets of power-gate/decoupling capacitor logic (e.g., logic block 1202 and 1204) to provide a fail-safe redundancy solution. In some embodiments, the secondary set of logic (e.g., logic block 1204) may be used when the primary set of logic (e.g., lock block 1202) fails in some way (e.g., fails to turn ON at an appropriate time). In some embodiments, when not in use, the secondary set of logic may act as a decoupling capacitor, for example as described above with reference to FIGS. 10A/10B and 11A/11B. In such embodiments, the secondary set of logic, acting as a decoupling capacitor, may thus decouples the VDD_ALWAYS_ON rail from CPU1's switching noise, and hence provide AC coupling protection for CPU2. In some embodiments, for example, when CPU1 is OFF, its primary and secondary switch/decoupling capacitor logic blocks (e.g., logic blocks 1202, 1204) may act as decoupling capacitor(s) for the VDD_ALWAYS_ON rail, and thus reduce CPU2 dynamic IR-drop. Similar functionality may be implemented, for example, by logic blocks 1206 and 1208, shown in FIG. 12. Moreover, the redundant integrated MEMS/NEMS power gating circuit described above may be extended to any number of CPUs, GPUs, and/or other circuit blocks, without departing from the scope of the present disclosure.

FIGS. 13A/13B and 14A/14B illustrate examples of using devices of the present disclosure to implement a multiple power supply switch circuit, such as a circuit 1300, which includes two power supplies $V_{DD1}$ and $V_{DD2}$. While the present example includes two power supplies, it is understood than more than two power supplies may also be used without departing from the scope of the present disclosure. In some embodiments, such as illustrated in the examples of FIGS. 13A and 14A, the constituent circuit elements 'S0', 'S1', 'S2', and 'S3' may all include switches (e.g., such as the switch 605), while not necessarily including separate, dedicated decoupling capacitors (e.g., such as the decoupling capacitors 621, 623). Rather, in some embodiments, the switches 'S0', 'S1', 'S2', 'S3' may be appropriately configured (e.g., as either a power gate switch or as a capacitor) as needed for a given application. To be sure, in some embodiments, each of the switches 'S0', 'S1', 'S2', 'S3' may alternately include a device such as the device 600, which also includes decoupling capacitors. As shown in FIGS. 13A and 14A, an inverter in also coupled between the gates of switches 'S0' and 'S1'. Also, for both examples shown in FIGS. 13A and 14A, 'S2' may remain ON (very low resistance) and 'S3' may remain OFF (near infinite resistance). Now, as shown in the example of FIG. 13A, when an ENABLE signal is high (e.g., equal to 1V, equal to $V_{DD}$, or other high value) and $V_{BODY}$ is also high, switch 'S0' may be OFF (near infinite resistance) and switch 'S1' may be ON (very low resistance). FIG. 13B illustrates an equivalent circuit 1310 corresponding to the operational state shown in FIG. 13A. As illustrated in FIG. 13B, 'S1' and 'S2' provide a low resistance path between $V_{DD2}$ and $V_{DD\_OUT}$, while 'S0' and 'S3' act as capacitors. Referring to the example of FIG. 14A, when an ENABLE signal is low (e.g., equal to 0V, equal to $V_{SS}$, or other low value) and $V_{BODY}$ is high, switch 'S0' may be ON (very low resistance) and switch 'S1' may be OFF (near infinite resistance). FIG. 14B illustrates an equivalent circuit 1410 corresponding to the operational state shown in FIG. 14A. As illustrated in FIG. 14B, 'S0' and 'S2' provide a low resistance path between $V_{DD1}$ and $V_{DD\_OUT}$, while 'S1' and 'S3' act as capacitors.

FIGS. 15A/15B and 16A/16B illustrate examples of using devices of the present disclosure to implement an anti-stiction switching circuit, such as circuits 1500 and 1600. As discussed above with reference to FIG. 5, stiction (i.e., static friction forces) may cause surfaces along which the conductive channel contacts the source/drain electrodes to become inadvertently stuck to one another (i.e., they may not disconnect), thereby causing the device to remain ON when it should be OFF. Such stiction-related problems can occur in conventional MEMS/NEMS devices which solely rely on a spring force of the electromechanical device to shut off the MEMS/NEMS device. FIGS. 15A/15B illustrate a solution to overcome this issue using a planar integrated MEMS/NEMS device (e.g., a vertical switch), and FIGS. 16A/16B illustrate a solution using a lateral integrated MEMS/NEMS switch. Referring first to the example of FIGS. 15A/15B, an ENABLE signal is connected to the gate, and the ENABLE signal is also connected to the body through an inverter. Thus, as shown in FIG. 15A, when the ENABLE/gate voltage $V_{GATE}$ is HIGH, the body voltage $V_{BODY}$ is LOW, and the device is ON (very low resistance). As shown in FIG. 15B, when the ENABLE/gate voltage $V_{GATE}$ is LOW, the body voltage $V_{BODY}$ is HIGH, and the gate of the MEMS/NEMS device is pushed up (away) from the source/drain by the reverse bias (e.g., ENABLE=LOW), and the device is OFF (near infinite resistance). Thus, rather than relying solely on the spring force of the electromechanical device to shut off the MEMS/NEMS device, as in conventional MEMS/NEMS devices, the example of FIGS. 15A/15B provide an embodiment of a MEMS/NEMS device that shuts OFF when it should by application of an electrostatic force (e.g., the reverse bias), as discussed above. Similarly, referring to the example of FIGS. 16A/16B, an ENABLE signal is connected to the gate, and the ENABLE signal is also connected to the body through an inverter. Thus, as shown in FIG. 16A, when the ENABLE/gate voltage $V_{GATE}$ is HIGH, the body voltage $V_{BODY}$ is LOW, and the device is ON (very low resistance). As shown in FIG. 16B, when the ENABLE/gate voltage $V_{GATE}$ is LOW, the body voltage $V_{BODY}$ is HIGH, and the source beams of the lateral integrated MEMS/NEMS devices are pushed away from the drain contact by the reverse bias (e.g., ENABLE=LOW), and the device is OFF (near infinite resistance). Thus, rather than relying solely on the spring force of the electromechanical device to shut off the MEMS/NEMS device, as in conventional MEMS/NEMS devices, the example of FIGS. 16A/16B provide another embodiment of a MEMS/NEMS device that shuts OFF when it should by application of an electrostatic force (e.g., the reverse bias), as discussed above.

It will be understood that the examples of FIGS. 15A/15B and FIGS. 16A/16B are merely exemplary, and the solutions illustrated therein may be equally applied to any type of MEMS/NEMS device. Thus, in various embodiments, any type of MEMS/NEMS device that uses an electromechanical force (e.g., an applied voltage bias) to shut off the MEMS/NEMS device, rather than relying solely on the spring force of the electromechanical device, are within the scope of the present disclosure. To be sure, while some embodiments of the present disclosure may shut OFF a MEMS/NEMS device by application of an electrostatic force (e.g., the reverse bias), as discussed above, some examples may also shut OFF a MEMS/NEMS device by application of an electrostatic force (e.g., the reverse bias) in conjunction with utilization of the MEMS/NEMS spring force. For instance, while the examples of FIGS. 15A/15B and FIGS. 16A/16B illustrated using an electrostatic force to shut OFF the MEMS/NEMS devices shown therein, the examples of FIGS. 15A/15B and FIGS. 16A/16B may also take advantage of the MEMS/NEMS spring forces to assist in shutting OFF the device. For example, in some embodiments, when a MEMS/NEMS spring force is used together with an applied electrostatic force (e.g., applied voltage), the value of the applied electrostatic force (e.g., applied voltage) may be reduced. In general, application of an electrostatic force to assist in shutting OFF any type of MEMS/NEMS device would serve to improve device reliability, and would provide for MEMS/NEMS device scaling to very small geometries, where for example spring forces of such scaled devices may not be sufficient to reliably shut OFF the device.

As a further example of embodiments of the present disclosure as compared to conventional solutions, FIGS. 15C/16C illustrate an equivalent circuit of a conventional MEMS/NEMS device that relies solely on MEMS/NEMS spring forces (e.g., as seen by the ENABLE signal not being connected to the body through an inverter). Conversely, FIGS. 15D/16D illustrate an equivalent circuit of a MEMS/NEMS device corresponding to embodiments of the present disclosure (applicable to any type of MEMS/NEMS device, including those shown in FIGS. 15A/B and FIGS. 16A/16B), which include the ENABLE signal connected to the body through an inverter and thus employ electrostatic forces, with and/or without MEMS/NEMS spring forces, to shut OFF the MEMS/NEMS device.

Referring now to FIGS. 17-33, a discussion of at least some methods of fabrication, related devices, and other aspects of the present disclosure is provided below. Illustrated in FIGS. 17A, 17B, 17C, and 17D is an embodiment of a MEMS/NEMS device having integrated decoupling capacitors. The embodiments illustrated in FIGS. 17A, 17B, 17C, and 17D are substantially similar to the examples illustrated in FIGS. 6A, 6B, 6C, and 6D. However, as shown in the examples of FIGS. 17A, 17B, 17C, and 17D, the gate of the device 1700 may include a plurality of openings/holes 1702 (e.g., that may be formed in some cases by patterning and etching through the gate electrode). In some embodiments, the openings/holes 1702 may be useful in subsequent processing of the device 1700. For example, in some embodiments, the openings/holes 1702 may used to allow an etchant (e.g., a hydrofluoric acid HF etchant) to pass therethrough and etch an underlying oxide layer, thereby releasing the movable cantilever structure of the MEMS/NEMS device.

Figure 17A:
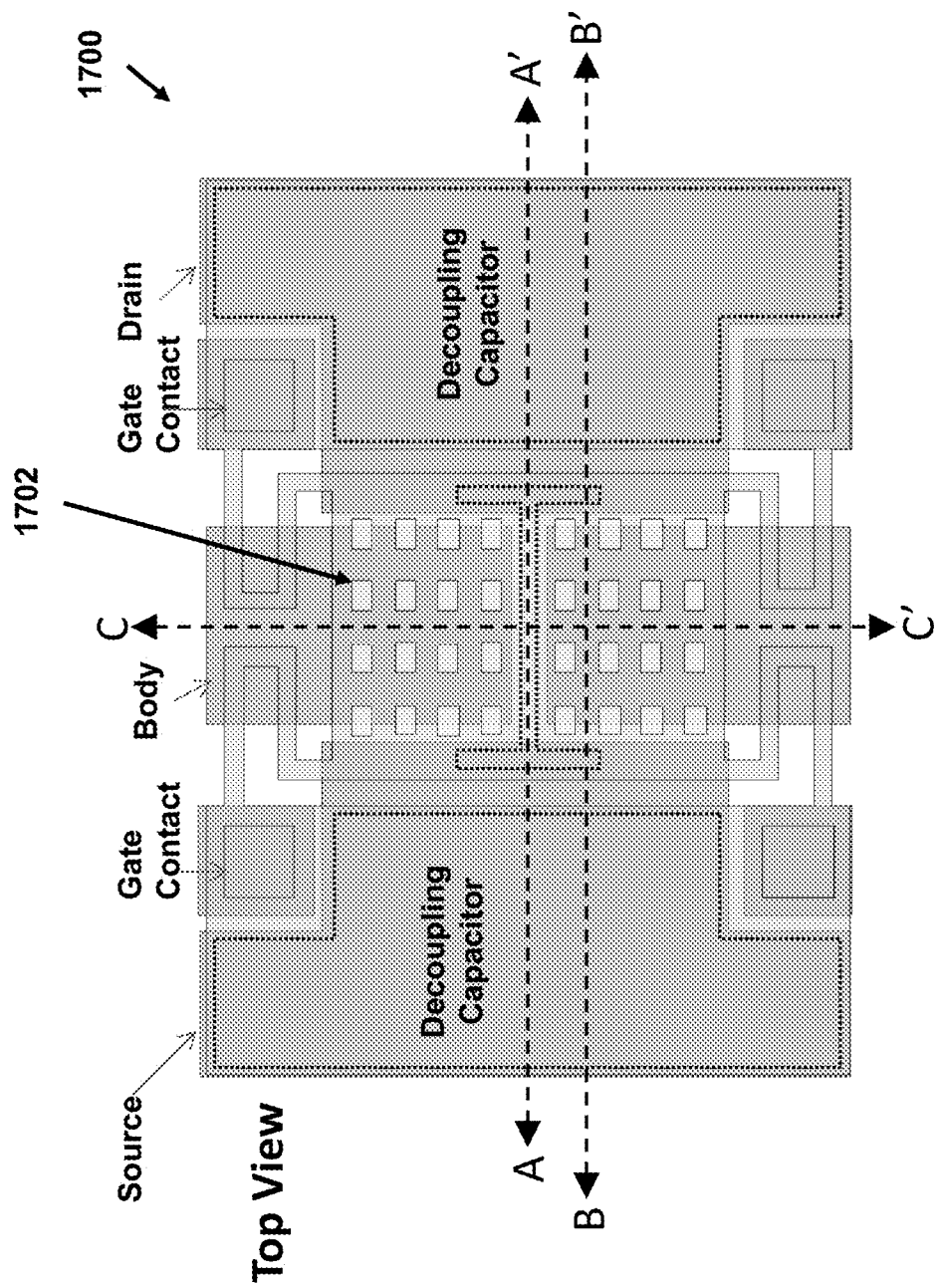
Figure 18:
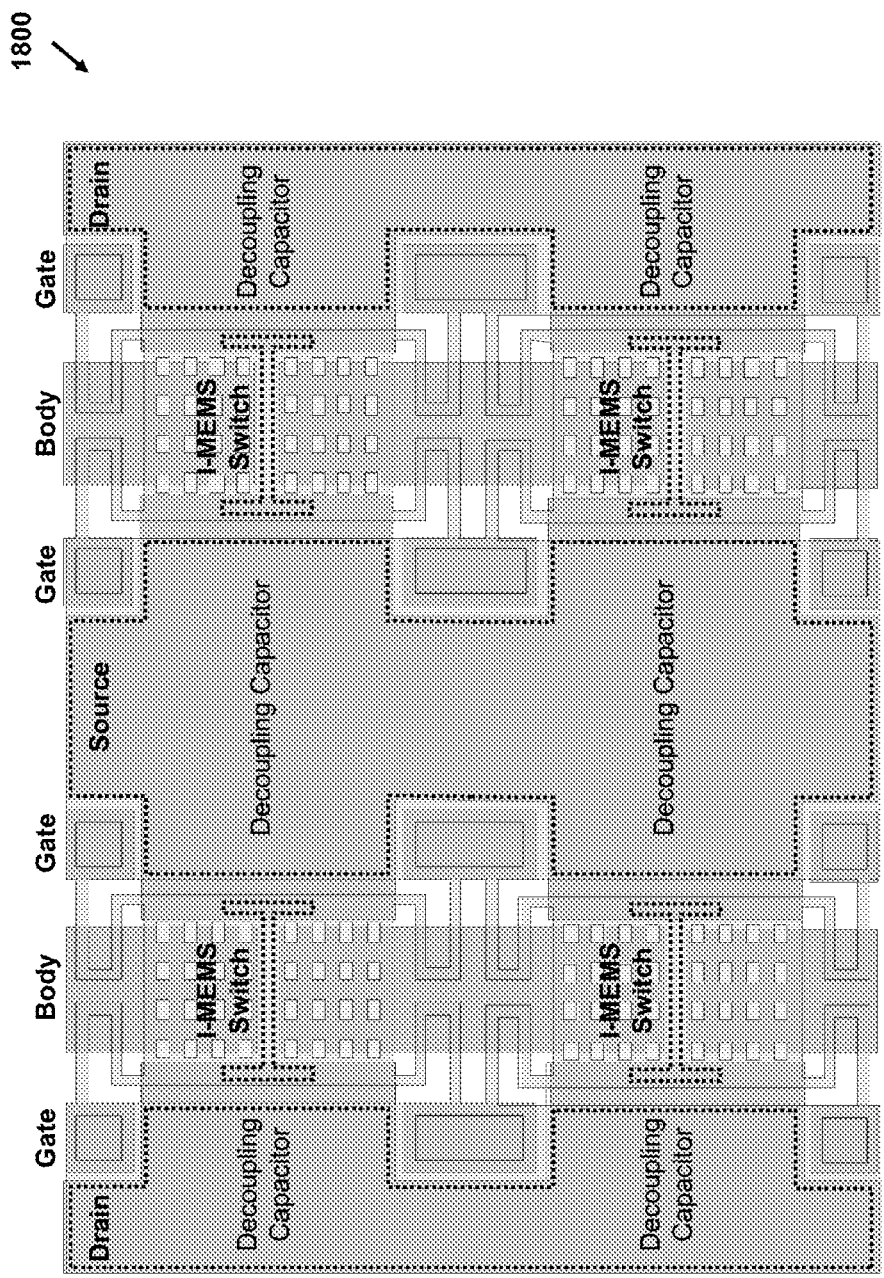
FIG. 18 shows a top-view of a device which may include an array of embedded/integrated electromechanical power switches and a plurality of integrated decoupling capacitors, including a plurality of openings/holes, according to some embodiments.

FIG. 18 shows a top-view of a device 1800 which may include an array of embedded/integrated electromechanical power switches (e.g., MEMS/NEMS device) and plurality of integrated decoupling capacitors. In various embodiments, the switches and decoupling capacitors of the device 1800 may be substantially similar to those of the device 1700 of FIGS. 17A, 17B, 17C, and 17D, which are also substantially similar to the switch 605 and the decoupling capacitors 621, 623 of FIGS. 6A, 6B, 6C, and 6D, discussed above.

Figure 19:
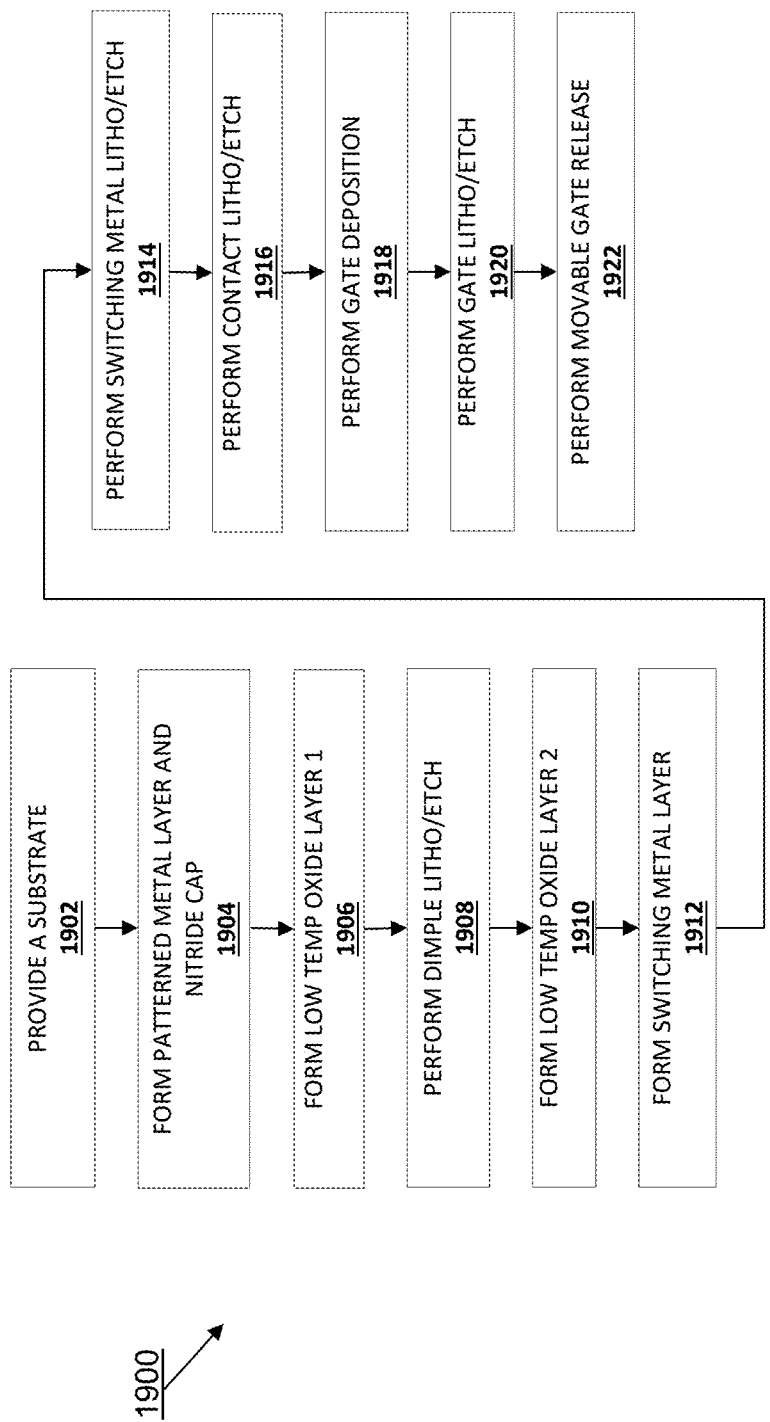
FIG. 19 is a flow chart of a method of fabricating a MEMS/NEMS device having integrated decoupling capacitors, or portion thereof, according to one or more aspects of the present disclosure.

Referring now to FIG. 19, illustrated therein is a method 1900 of semiconductor fabrication including fabrication of a MEMS/NEMS device having integrated decoupling capacitors (e.g., as illustrated in FIGS. 17A, 17B, 17C, and 17D). It is understood that the method 1900 includes steps having features of a complementary metal-oxide-semiconductor (CMOS) technology process flow and thus, are only described briefly herein. Additional steps may be performed before, after, and/or during the method 1900, and some process steps described may be replaced or eliminated in accordance with various embodiments of the method 1900. Further, the semiconductor device discussed below with reference to the method 1900 may include various other devices and features, such as other types of devices such as additional transistors, bipolar junction transistors, resistors, capacitors, inductors, diodes, fuses, static random access memory (SRAM) and/or other logic circuits, etc., but is simplified for a better understanding of the inventive concepts of the present disclosure. In some embodiments, the semiconductor device discussed below with reference to the method 1900 includes a plurality of semiconductor devices (e.g., transistors), including PFETs, NFETs, etc., which may be interconnected. Moreover, it is noted that the process steps of method 1900, including any descriptions given with reference to any of the figures, are merely exemplary and are not intended to be limiting in any way.

The method 1900 begins at block 1902 where a substrate is provided. Referring for example to FIG. 20B, in an embodiment of block 1902, a substrate is provided. As described above with reference to FIG. 6B, the substrate may be formed from and/or include any of a plurality of materials. Additionally, the substrate may include any of a plurality of IC devices, for example, formed on a front surface of the semiconductor substrate. FIG. 20A shows a top-view of a device at an intermediate stage of fabricating an embedded/integrated electromechanical power switch (e.g., MEMS/NEMS device). In particular, FIG. 20A shows sections AA' and BB', which will be referenced in the discussion of the fabrication method that follows. The method 1900 proceeds to block 1904 where a patterned metal layer and nitride capping layer are formed. Referring to the examples of sections AA' and BB' of FIG. 20B, in an embodiment of block 1904, patterned metal source, drain, body, and gate regions are formed over the substrate, where a dielectric material (e.g., such as a backend low-K dielectric material) electrically isolates the patterned metal regions from one another. Also, while not explicitly shown, a dielectric layer may also be formed over the substrate, prior to formation of the patterned metal regions, for example to electrically isolate and/or protect the IC devices within the substrate from the patterned metal of the source, drain, body, and gate regions. However, it will be understood that openings may be formed in such an isolating dielectric layer (e.g., by a patterning and etching process) in order to connect metal layers above the isolating dielectric layer to devices, circuits, and/or other metal layers or interconnects below the isolating dielectric layer. In some embodiments, the patterned metal regions may be formed from copper, but other metals may equivalently be used without departing from the scope of the present disclosure. As also shown in sections AA' and BB' of FIG. 20B, in an embodiment of block 1904, a capping layer (e.g., such as a silicon nitride capping layer) is formed over the patterned metal regions and the dielectric material.

The method 1900 proceeds to block 1906 where a first low temperature oxide layer is formed. Referring to the examples of sections AA' and BB' of FIG. 20C, in an embodiment of block 1906, a first low temperature oxide layer is formed over the capping layer (e.g., such as the silicon nitride capping layer). In some embodiments, the first low temperature oxide layer includes a PECVD oxide layer, which may be deposited at around 400° C., and which may have a thickness of about 100 nm.

The method 1900 proceeds to block 1908 where a dimple lithography and etch process is performed. Referring to the examples of sections AA' and BB' of FIG. 21B, in conjunction with the example of FIG. 21A, and in an embodiment of block 1908, the first low temperature oxide layer and the capping layer are patterned and etched (e.g., using a dry etch, wet etch, or combination of wet/dry etch) to form contact dimple patterns as well as to expose regions which will serve as the decoupling capacitors.

The method 1900 proceeds to block 1910 where a second low temperature oxide layer is formed. Referring to the examples of sections AA' and BB' of FIG. 21C, in an embodiment of block 1910, a second low temperature oxide layer is formed over the device having the dimple patterns (as shown in FIG. 21B). In some embodiments, the second low temperature oxide layer includes a PECVD oxide layer, which may be deposited at around 400° C., and which may have a thickness of about 100 nm.

The method 1900 proceeds to block 1912 where a switching metal layer is formed. Referring to the examples of sections AA' and BB' of FIG. 22A, in an embodiment of block 1912, a switching metal layer is formed over the device having the second low temperature oxide layer (as shown in FIG. 21C). In some embodiments, the switching metal layer may include any of a variety of metals such as W, Au, Mo, Ir, or others as known in the art. In some embodiments, the switching metal layer may have a thickness of about 50 nm.

The method 1900 proceeds to block 1914 where a switching metal lithography and etch process are performed. Referring to the examples of sections AA' and BB' of FIG. 22C, in conjunction with the example of FIG. 22B, and in an embodiment of block 1914, the switching metal layer is patterned and etched (e.g., using a dry etch, wet etch, or combination of wet/dry etch) to form switch contact regions.

The method 1900 proceeds to block 1916 where a contact lithography and etch process are performed. Referring to the examples of sections AA' and BB' of FIG. 23B, in conjunction with the example of FIG. 23A, and in an embodiment of block 1916, gate contact regions are patterned and etched (e.g., using a dry etch, wet etch, or combination of wet/dry etch). In some embodiments, the gate contact region pattern and etching process includes patterning and etching the first and second low temperature oxide layers in the gate contact regions, as shown in section BB' of FIG. 23B.

The method 1900 proceeds to block 1918 a gate deposition process is performed. Referring to the examples of sections AA' and BB' of FIG. 23C, in an embodiment of block 1918, a gate electrode layer is formed over the device having the patterned and etched contact regions (as shown in FIG. 23B). In some embodiments, the gate electrode layer includes a PECVD layer, which may be deposited at around 410° C., and which may have a thickness of between about 500-1000 nm. Additionally, in some embodiments, the gate electrode layer may include a polycrystalline layer. In some embodiments, the gate electrode layer may include a polycrystalline silicon layer. In some embodiments, the gate electrode layer may include an in-situ doped polycrystalline layer or an in-situ doped polycrystalline silicon layer. In some embodiments, the gate electrode layer may include a silicon germanium layer. While a few examples for materials which may be used for the gate electrode layer have been given, those of ordinary skill in the art will readily recognize other materials that may be equivalently be used without departing from the scope of the present disclosure.

The method 1900 proceeds to block 1920 where a gate lithography and etch process are performed. Referring to the examples of sections AA' and BB' of FIG. 24B, in conjunction with the example of FIG. 24A, and in an embodiment of block 1920, the gate electrode layer is patterned and etched (e.g., using a dry etch, wet etch, or combination of wet/dry etch) to define the MEMS/NEMS device movable gate (e.g., folded flexure gate) and decoupling capacitor regions. In addition, in some embodiments, the gate lithography and etch processes may also be used to pattern and etch a plurality of openings/holes that may be used to allow an etchant (e.g., a hydrofluoric acid HF etchant) to pass therethrough and etch an underlying oxide layer, thereby releasing the movable cantilever structure of the MEMS/NEMS device, as described below.

The method 1900 proceeds to block 1922 where a gate release process is performed. Referring to the examples of sections AA' and BB' of FIG. 24C, in conjunction with the example of FIG. 24A, and in an embodiment of block 1922, an oxide etch may be performed (e.g., to etch the first and second low temperature oxide layers), where for example an etchant (e.g., a hydrofluoric acid HF etchant) passes through the plurality of openings/holes to thereby release the movable MEMS/NEMS gate structure. While some examples described herein include the plurality of openings/holes to help with the oxide etching and gate release, some embodiments may not include such openings/holes but may nevertheless provide for the gate release process to be successfully performed.

Referring now to FIGS. 25A, 25B, 25C, 25D, and 25E, illustrated therein is a method of fabrication of a MEMS/NEMS device (which in some examples may also include integrated decoupling capacitors) in accordance with a 4-terminal scheme. Referring first to the example to FIG. 25A, a substrate is provided. As described above, the substrate may be formed from and/or include any of a plurality of materials, and the substrate may include any of a plurality of IC devices, for example, formed on a front surface of the semiconductor substrate. In some embodiments, the structure of the device illustrated in FIG. 25A is similar in at least some respects to that illustrated in FIG. 22A, where the switching metal layer has been formed over the device structure. Referring to the example of FIG. 25A, the illustrated switching metal layer may be patterned and etched, and a gate oxide layer may then be formed over the device structure. In some embodiments, the gate oxide layer includes a PECVD oxide layer, an ALD layer, or other oxide layer. In some embodiments, the gate oxide layer has a thickness of about 50-100 nm. In some embodiments, for example when the oxide layer includes a PECVD oxide layer, the oxide layer may be deposited at around 400° C.

Referring to the example of FIG. 25B, a gate electrode layer is formed over the device having the gate oxide layer (as shown in FIG. 25A). In some embodiments, the gate electrode layer includes a PECVD layer, which may be deposited at around 410° C., and which may have a thickness of between about 500-1000 nm. Additionally, in some embodiments, the gate electrode layer may include a polycrystalline layer. In some embodiments, the gate electrode layer may include a polycrystalline silicon layer. In some embodiments, the gate electrode layer may include an in-situ doped polycrystalline layer or an in-situ doped polycrystalline silicon layer. In some embodiments, the gate electrode layer may include a silicon germanium layer. While a few examples for materials which may be used for the gate electrode layer have been given, those of ordinary skill in the art will readily recognize other materials that may be equivalently be used without departing from the scope of the present disclosure.

Referring to the example of FIG. 25C, the gate electrode layer (of FIG. 25B) is patterned and etched (e.g., using a dry etch, wet etch, or combination of wet/dry etch) to define the MEMS/NEMS device movable gate (e.g., folded flexure gate), and in some cases also to define decoupling capacitor regions. In addition, in some embodiments, the gate lithography and etch processes may also be used to pattern and etch a plurality of openings/holes that may be used to allow an etchant (e.g., a hydrofluoric acid HF etchant) to pass therethrough and etch an underlying oxide layer, thereby releasing the movable cantilever structure of the MEMS/NEMS device, as described below.

Referring to the examples of FIGS. 25D and 25E, the patterned and etched gate electrode layer (of FIG. 25C) is released, for example, using a gate release process. FIG. 25D illustrates the BB' section, for example, as shown in FIG. 17A, and FIG. 25E illustrates the AA' section, for example, as shown in FIG. 17A. In various embodiments, the gate release process may be performed by etching underlying oxide layers (e.g., such as the first and second low temperature oxide layers), where for example an etchant (e.g., a hydrofluoric acid HF etchant) passes through the plurality of openings/holes in the gate electrode to thereby release the movable MEMS/NEMS gate structure. While some examples described herein include the plurality of openings/holes to help with the oxide etching and gate release, some embodiments may not include such openings/holes but may nevertheless provide for the gate release process to be successfully performed.

Figure 26:
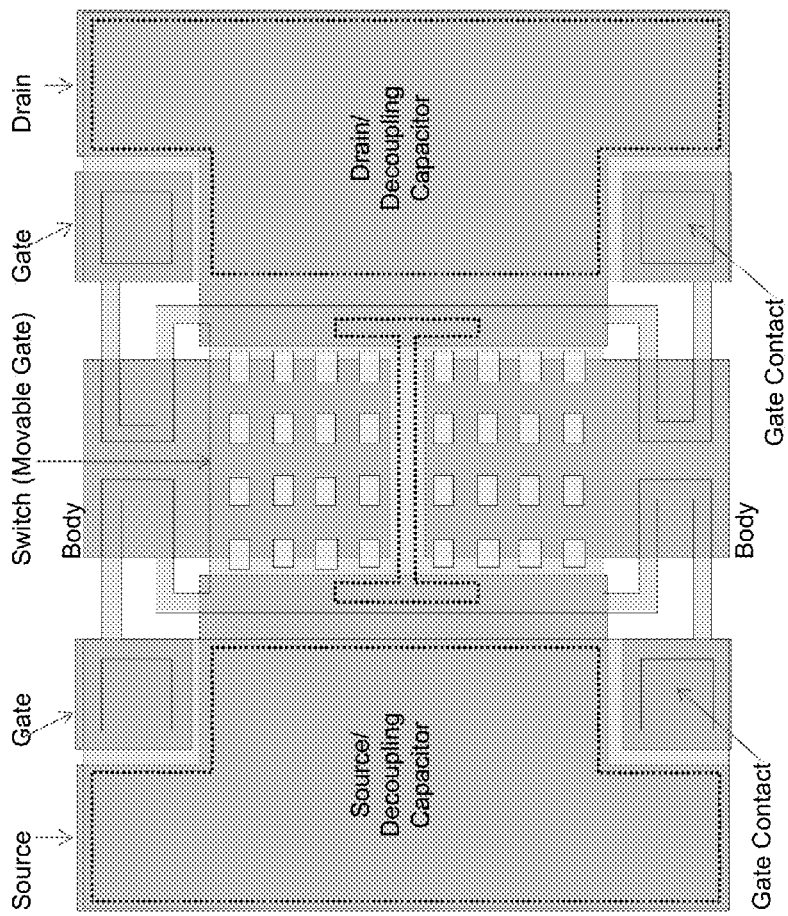
FIG. 26 illustrates an exemplary embodiment of an integrated MEMS/NEMS-decoupling capacitor cell, according to some embodiments.

FIG. 26 illustrates an exemplary embodiment of an integrated MEMS/NEMS-decoupling capacitor cell. The exemplary MEMS/NEMS-decoupling capacitor cell may be fabricated in accordance with one or more of the methods described herein. In addition, FIG. 26 provides sample dimensions for the exemplary MEMS/NEMS-decoupling capacitor cell. For example, in some embodiments, the MEMS/NEMS-decoupling capacitor cell size may be around 1800 $\mu m^2$ (e.g., around 50 $\mu m \times 36$ $\mu m$). Also, in some embodiments, a decoupling capacitor size (of the MEMS/NEMS-decoupling capacitor cell) may be around 936 $\mu m^2$ (e.g., around 468 $\mu m \times 2$ $\mu m$). It will be understood that these sample dimensions are merely exemplary, and various embodiments may include different MEMS/NEMS-decoupling capacitor cell sizes and different decoupling capacitor sizes for example as defined for a particular technology and/or device, circuit, or process requirement, without departing from the scope of this disclosure.

With reference now to FIGS. 27-30, a discussion of embodiments including a three-dimensional (3-D) coupling capacitor is provided. It will be understood and appreciated that the devices, structures, and methods including the 3-D coupling capacitor are similar to the devices, structures, and methods that have been described above. Thus, various aspects of the embodiments including the 3-D coupling capacitor are only described briefly, for clarity of understanding.

Figure 27:
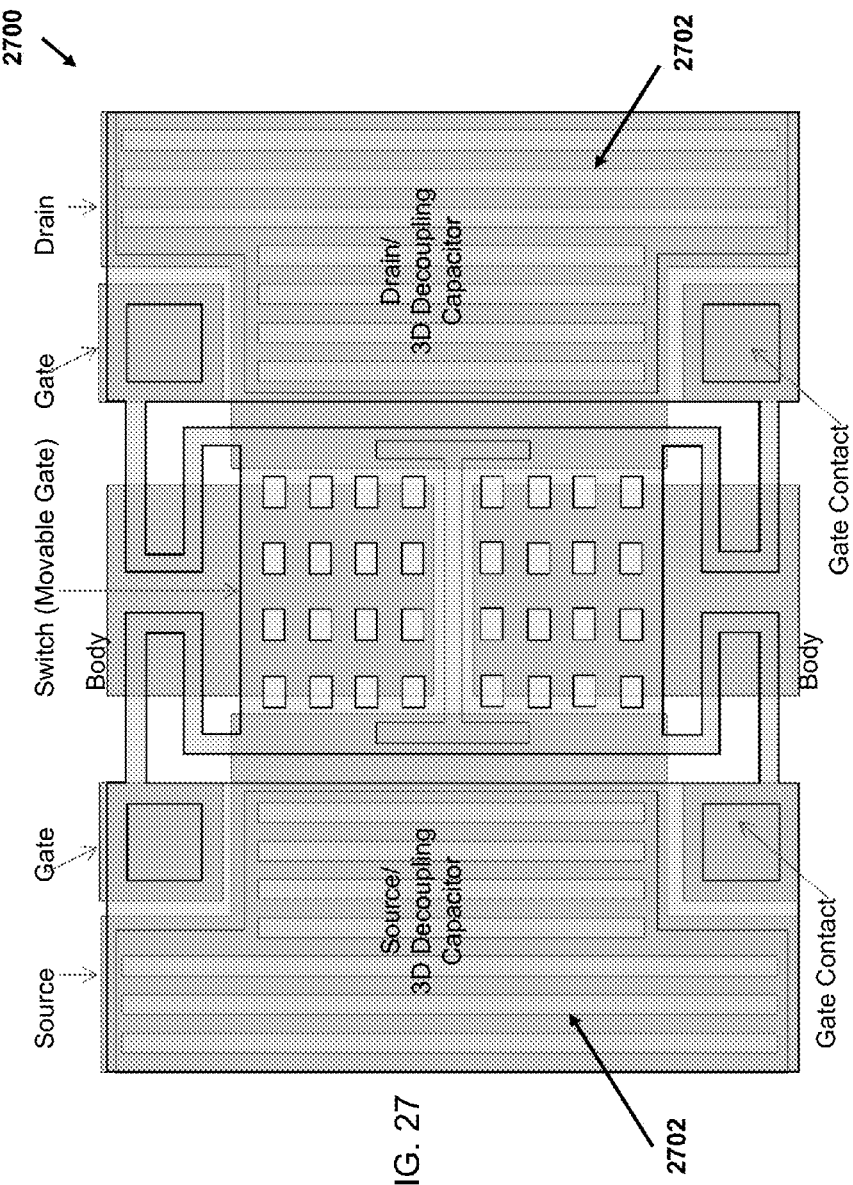
FIG. 27 illustrates a MEMS/NEMS device having integrated decoupling capacitors with a plurality of 3-D features, according to some embodiments.

Referring first to FIG. 27, illustrated therein is a device 2700 including a MEMS/NEMS device having integrated decoupling capacitors. In some embodiments, the device 2700 is very similar to the device 1700 of FIG. 17A or the device of FIG. 26. However, as shown in FIG. 27 the device 2700 may include a plurality of 3-D features 2702, which for example may include fins, ridges, valleys, mesas, and/or other 3-D features as known in the art. In various embodiments, a purpose of the plurality of 3-D features 2702 includes increasing a surface area of the integrated decoupling capacitors and thus increasing a capacitance value of the integrated decoupling capacitors. As shown in the example of FIG. 27, the decoupling capacitor area may be around 936 $\mu m^2$ (e.g., including the planar area, as shown in FIG. 26) plus around 780 $\mu m^2$ (e.g., including the vertical area and assuming around a 1 $\mu m$ metal thickness, as shown in FIG. 27), for a total capacitor area of around 1716 $\mu m^2$, which in the example of FIG. 27 is around 95% of the entire cell area.

Figure 28:
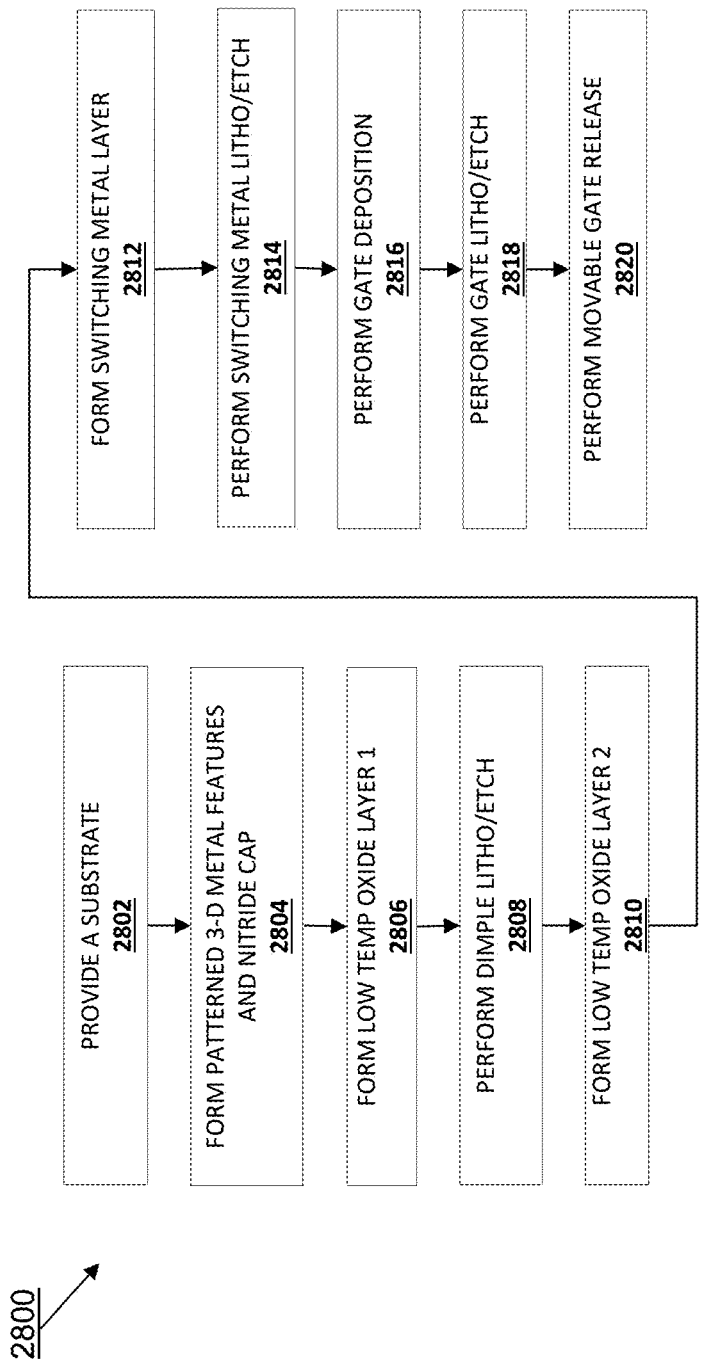
FIG. 28 is a flow chart of a method of fabricating a MEMS/NEMS device having integrated decoupling capacitors with a plurality of 3-D features, or portion thereof, according to one or more aspects of the present disclosure.

Referring now to FIG. 28, illustrated therein is a method 2800 of semiconductor fabrication including fabrication of a MEMS/NEMS device having integrated decoupling capacitors and a plurality of 3-D features. It is understood that the method 2800 is very similar to the method 1900 described above and thus some of the discussion below may be abbreviated for clarity of understanding. It is further understood that the method 2800 includes steps having features of a complementary metal-oxide-semiconductor (CMOS) technology process flow and thus, are only described briefly herein. Additional steps may be performed before, after, and/or during the method 2800, and some process steps described may be replaced or eliminated in accordance with various embodiments of the method 2800. Further, the semiconductor device discussed below with reference to the method 2800 may include various other devices and features, such as other types of devices such as additional transistors, bipolar junction transistors, resistors, capacitors, inductors, diodes, fuses, static random access memory (SRAM) and/or other logic circuits, etc., but is simplified for a better understanding of the inventive concepts of the present disclosure. In some embodiments, the semiconductor device discussed below with reference to the method 2800 includes a plurality of semiconductor devices (e.g., transistors), including PFETs, NFETs, etc., which may be interconnected. Moreover, it is noted that the process steps of method 2800, including any descriptions given with reference to any of the figures, are merely exemplary and are not intended to be limiting in any way.

The method 2800 begins at block 2802 where a substrate is provided. Referring for example to FIG. 29B, in an embodiment of block 2802, a substrate is provided. As described above, the substrate may be formed from and/or include any of a plurality of materials. Additionally, the substrate may include any of a plurality of IC devices, for example, formed on a front surface of the semiconductor substrate. FIG. 29A shows a top-view of a device at an intermediate stage of fabricating an embedded/integrated electromechanical power switch (e.g., MEMS/NEMS device). FIG. 29A also shows section AA', which will be referenced in the discussion of the fabrication method that follows. The method 2800 proceeds to block 2804 where a patterned 3-D metal features and nitride capping layer are formed. Referring to the example of section AA' of FIG. 29B, in conjunction with the example of FIG. 29A, a plurality of 3-D features 2902 are shown. Such 3-D features may include fins, ridges, valleys, mesas, and/or other 3-D features as known in the art. In some embodiments, a patterned metal layer (VIAx) is first formed, and then the plurality of 3-D features 2902 are formed, for example using the metal (Mx) layer. In various embodiments, the VIAx metal layer, under the metal layer Mx, is used to connect the metal layer Mx to the circuits, devices, etc. below (e.g., in the semiconductor substrate). In some embodiments, the plurality of 3-D features 2902 may be formed directly within the initially deposited patterned metal layer. As described above, while not explicitly shown, a dielectric layer may also be formed over the substrate, prior to formation of the patterned metal and 3-D features, for example to electrically isolate and/or protect the IC devices within the substrate from the patterned metal of the source, drain, body, and gate regions. However, it will be understood that openings may be formed in such an isolating dielectric layer (e.g., by a patterning and etching process) in order to connect metal layers above the isolating dielectric layer to devices, circuits, and/or other metal layers or interconnects below the isolating dielectric layer. As also shown in FIG. 29B, in an embodiment of block 2804, a capping layer (e.g., such as a silicon nitride capping layer) is formed over the patterned metal an 3-D features, as well as the dielectric material.

Figure 30A:
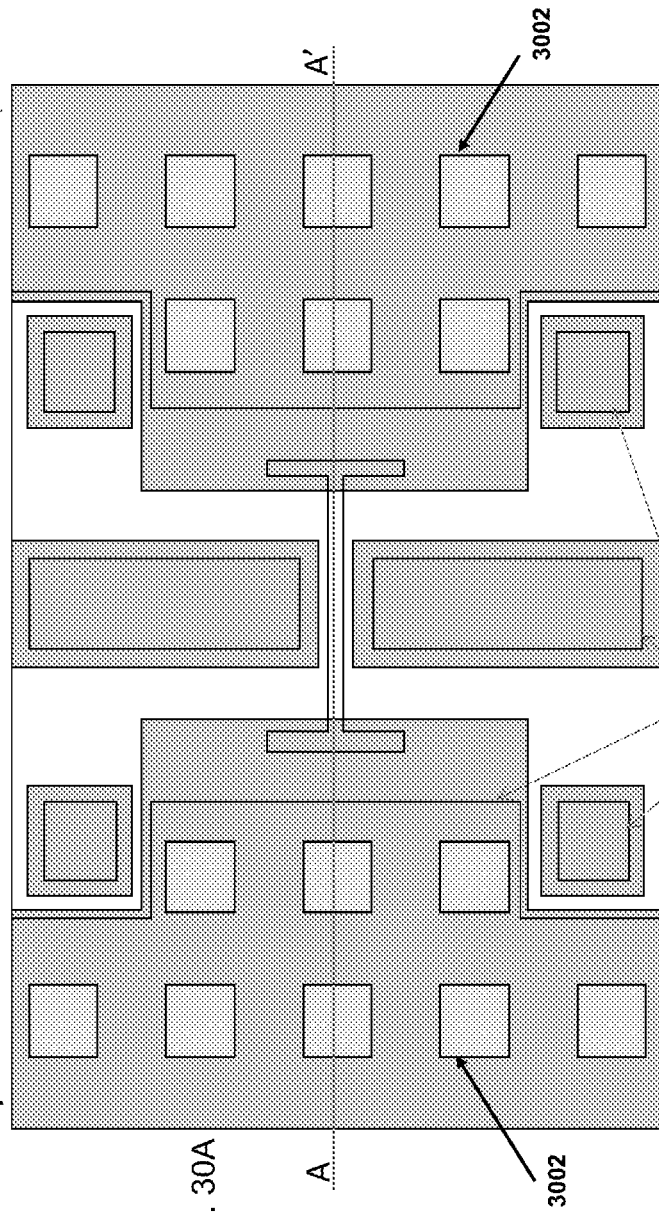
Figure 30B:
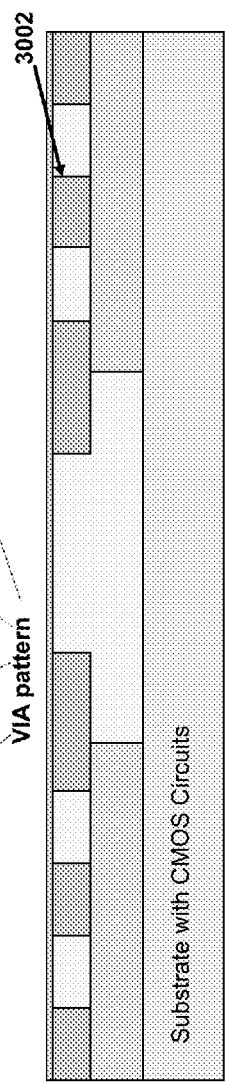
Figure 30F:
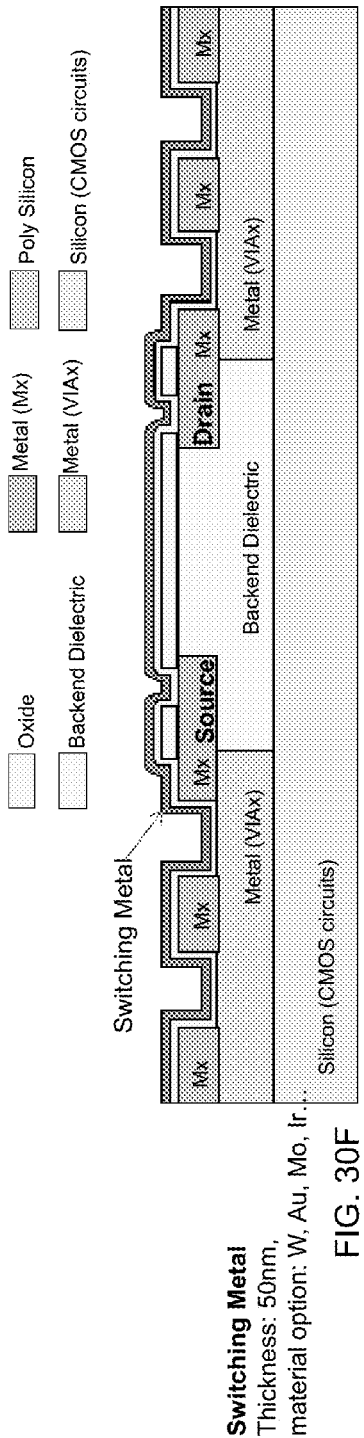

FIGS. 30A and 30B are substantially similar to FIGS. 29A and 29B; however, a plurality of 3-D features 3002 of FIGS. 30A and 30B may have a different configuration than the 3-D features 2902 of FIGS. 29A and 29B. For example, the 3-D features 3002 of FIGS. 30A and 30B may include mesas formed in the metal layer (Mx), disposed over the pattern metal (VIAx) layer. However, as discussed above, various embodiments may include 3-D features such as fins, ridges, valleys, mesas, and/or other 3-D features as known in the art.

The method 2800 proceeds to block 2806 where a first low temperature oxide layer is formed. Referring to the example of section AA' of FIG. 30C, in an embodiment of block 2806, a first low temperature oxide layer is formed over the capping layer (e.g., such as the silicon nitride capping layer). In some embodiments, the first low temperature oxide layer includes a PECVD oxide layer, which may be deposited at around 400° C., and which may have a thickness of about 100 nm.

The method 2800 proceeds to block 2808 where a dimple lithography and etch process is performed. Referring to the example of section AA' of FIG. 30D, in an embodiment of block 2808, the first low temperature oxide layer, the capping layer, and the backend low-K dielectric are patterned and etched (e.g., using a dry etch, wet etch, or combination of wet/dry etch) to form contact dimple patterns as well as to expose regions which will serve as the decoupling capacitors.

The method 2800 proceeds to block 2810 where a second low temperature oxide layer is formed. Referring to the example of section AA' of FIG. 30E, in an embodiment of block 2810, a second low temperature oxide layer is formed over the device having the dimple patterns (as shown in FIG. 30D). In some embodiments, the second low temperature oxide layer includes a PECVD oxide layer, which may be deposited at around 400° C., and which may have a thickness of about 100 nm.

The method 2800 proceeds to block 2812 where a switching metal layer is formed. Referring to the example of section AA' of FIG. 30F, in an embodiment of block 2812, a switching metal layer is formed over the device having the second low temperature oxide layer (as shown in FIG. 30E). In some embodiments, the switching metal layer may include any of a variety of metals such as W, Au, Mo, Ir, or others as known in the art. In some embodiments, the switching metal layer may have a thickness of about 50 nm.

The method 2800 proceeds to block 2814 where a switching metal lithography and etch process are performed. Referring to the example of section AA' of FIG. 30G, in an embodiment of block 2814, the switching metal layer is patterned and etched (e.g., using a dry etch, wet etch, or combination of wet/dry etch).

While not explicitly illustrated, the method 2800 may also include contact lithography and etch processes, as described above with reference to the method 1900.

Figure 30G:
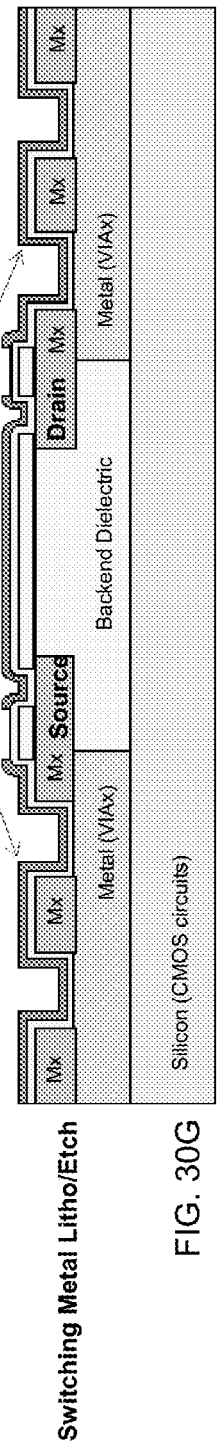
Figure 30H:
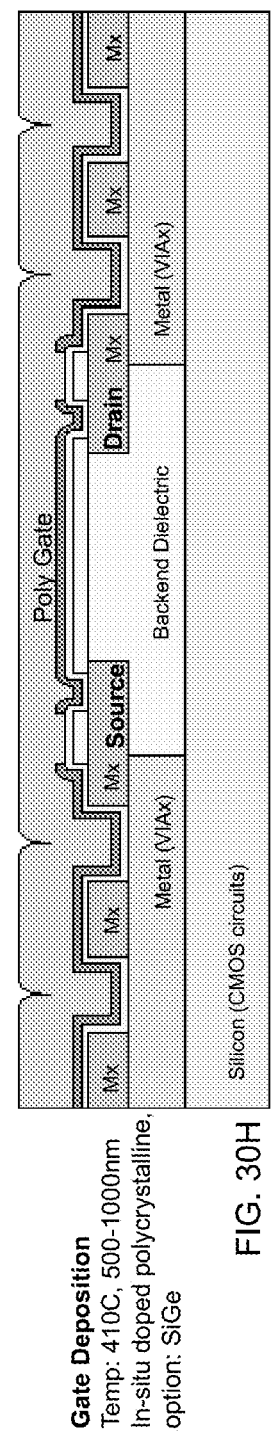
Figure 30J:
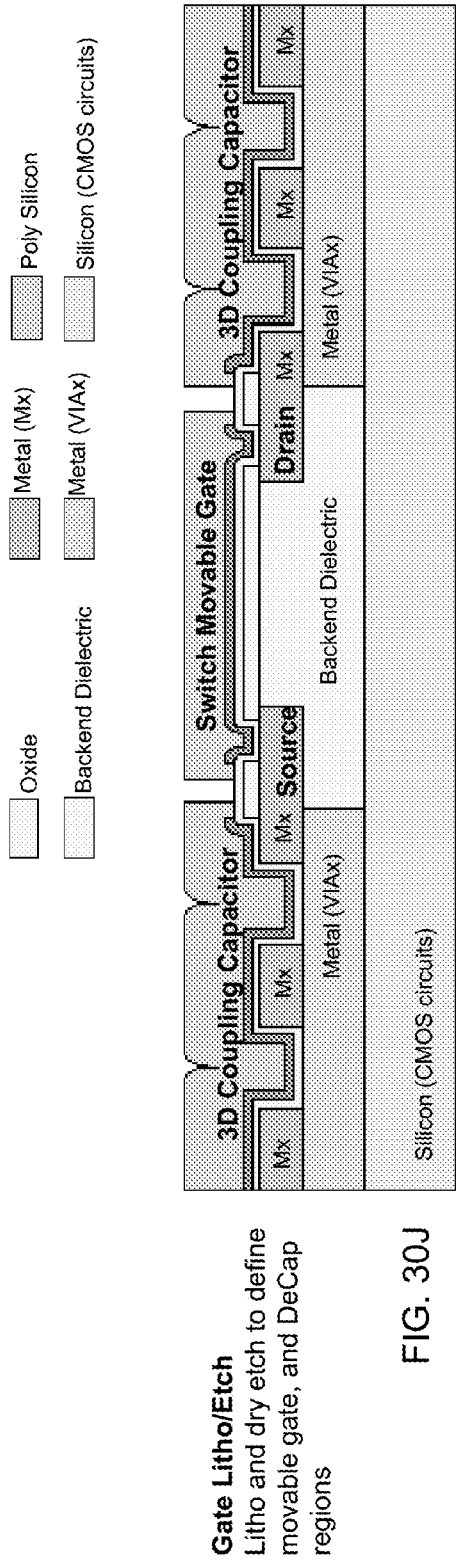
Figure 30K:
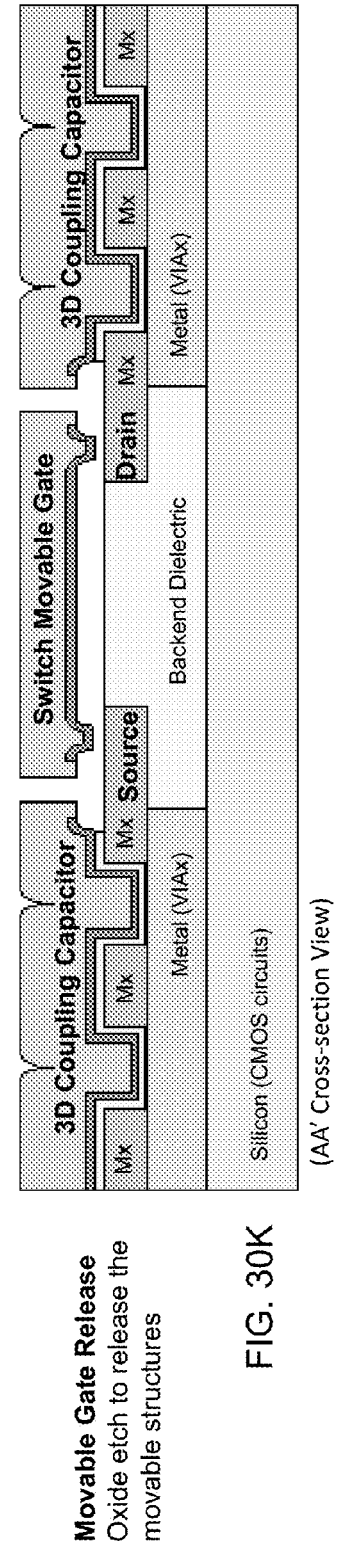

The method 2800 proceeds to block 2816 where a gate deposition process is performed. Referring to the example of section AA' of FIG. 30H, in an embodiment of block 2816, a gate electrode layer is formed over the device having the patterned and etched switching metal layer (as shown in FIG. 30G). In some embodiments, the gate electrode layer includes a PECVD layer, which may be deposited at around 410° C., and which may have a thickness of between about 500-1000 nm. Additionally, in some embodiments, the gate electrode layer may include a polycrystalline layer. In some embodiments, the gate electrode layer may include a polycrystalline silicon layer. In some embodiments, the gate electrode layer may include an in-situ doped polycrystalline layer or an in-situ doped polycrystalline silicon layer. In some embodiments, the gate electrode layer may include a silicon germanium layer. While a few examples for materials which may be used for the gate electrode layer have been given, those of ordinary skill in the art will readily recognize other materials that may be equivalently be used without departing from the scope of the present disclosure.

The method 2800 proceeds to block 2818 where a gate lithography and etch process are performed. Referring to the example of section AA' of FIG. 30J, in an embodiment of block 2818, the gate electrode layer is patterned and etched (e.g., using a dry etch, wet etch, or combination of wet/dry etch) to define the MEMS/NEMS device movable gate (e.g., folded flexure gate) and 3-D decoupling capacitor regions. In addition, in some embodiments, the gate lithography and etch processes may also be used to pattern and etch a plurality of openings/holes that may be used to allow an etchant (e.g., a hydrofluoric acid HF etchant) to pass therethrough and etch an underlying oxide layer, thereby releasing the movable cantilever structure of the MEMS/NEMS device, as described below.

The method 2800 proceeds to block 2820 where a gate release process is performed. Referring to the example of section AA' of FIG. 30K, in an embodiment of block 2820, an oxide etch may be performed (e.g., to etch the first and second low temperature oxide layers underneath the switch movable gate), where for example an etchant (e.g., a hydrofluoric acid HF etchant) passes through the plurality of openings/holes to thereby release the movable MEMS/NEMS gate structure. While some examples described herein include the plurality of openings/holes to help with the oxide etching and gate release, some embodiments may not include such openings/holes but may nevertheless provide for the gate release process to be successfully performed.

Figure 32:
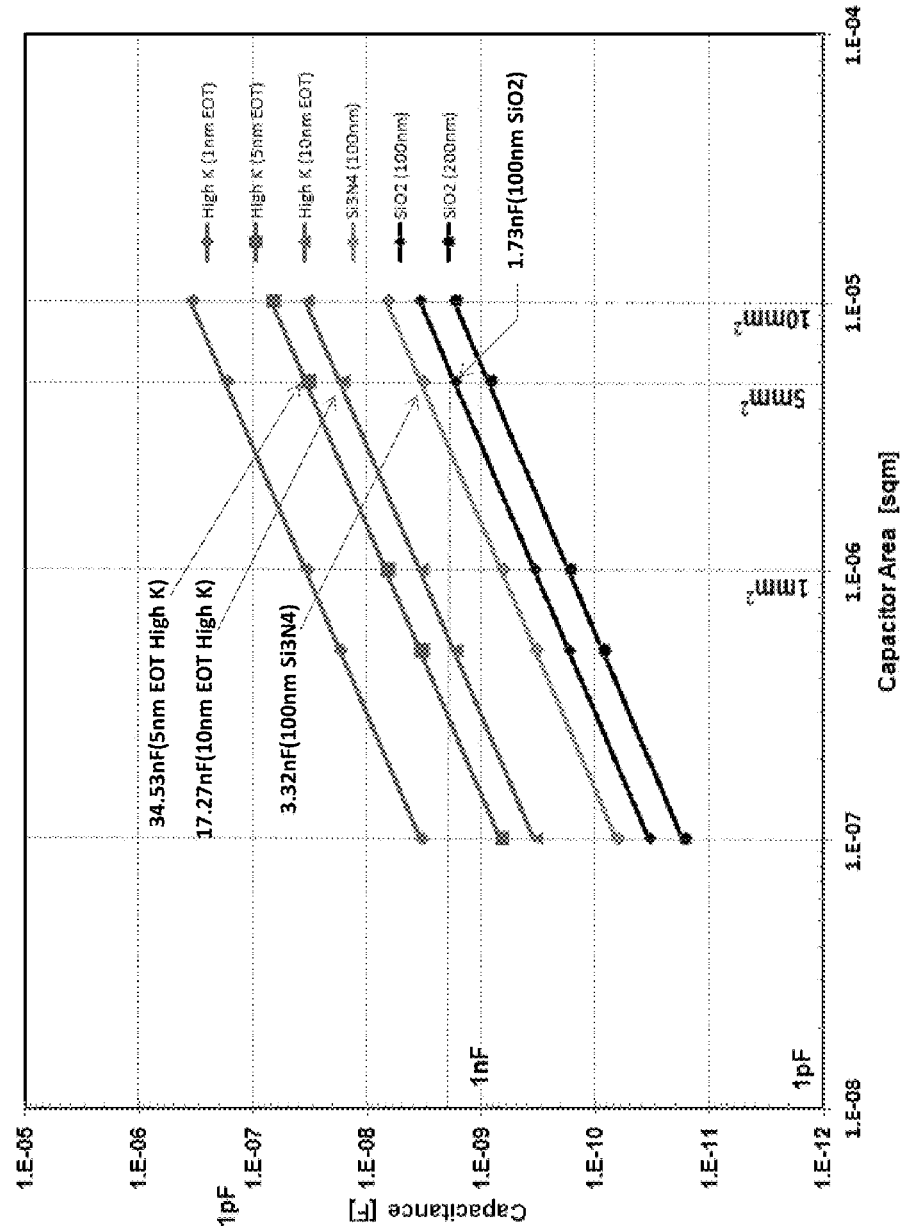

Referring to FIGS. 31 and 32, illustrated therein are figures showing capacitance values versus capacitor area, for capacitors having a variety of oxide thickness and a variety of dielectric materials. In various embodiments, any of options presented in FIGS. 31 and 32 may be used to implement any of the decoupling capacitors, whether planar or 3-D, as described above. It is also noted that since embodiments of the present disclosure provide for the decoupling capacitor(s) to be disposed immediately adjacent to the MEMS/NEMS switch, parasitic resistance and/or inductance is very small, thereby enabling the decoupling capacitor(s), as disclosed herein, to respond faster to any voltage demand than a conventional CMOS bypass/decoupling capacitor. FIG. 33 provides a table showing some basic properties of $SiO_2$ and $Si_3N_4$, as known in the art, and which may be useful for implementation of one or more of the embodiments disclosed herein.

FIGS. 34-50 illustrate some additional embodiments within the scope of the present disclosure. Referring first to FIGS. 34A/34B, illustrated therein is an embodiment of a MEMS/NEMS device 3400 having integrated decoupling capacitors. The embodiments illustrated in FIGS. 34A/34B are substantially similar to the examples illustrated in FIGS. 17A/17B. However, as shown in the examples of FIGS. 34A/34B, the device 3400 may include an input decoupling capacitor (e.g., DeCap on VDDin) having a larger area than an output decoupling capacitor (e.g., DeCap on VDDout). Thus, in some examples for the device 3400, a capacitance of the input decoupling capacitor (e.g., DeCap on VDDin) is larger than a capacitance of the output decoupling capacitor (e.g., DeCap on VDDout). In addition, FIGS. 34A/34B provide sample dimensions. For example, in some embodiments, the MEMS/NEMS-decoupling capacitor cell size may be around 500 $\mu m^2$, and the decoupling capacitor size (of the MEMS/NEMS-decoupling capacitor cell) may be around 300 $\mu m^2$. It will be understood that these sample dimensions are merely exemplary, and various embodiments may include different MEMS/NEMS-decoupling capacitor cell sizes and different decoupling capacitor sizes for example as defined for a particular technology and/or device, circuit, or process requirement, without departing from the scope of this disclosure.

FIG. 35 shows a top-view of a device 3500 which may include an array of embedded/integrated electromechanical power switches (e.g., MEMS/NEMS device) and plurality of integrated decoupling capacitors. In various embodiments, the array of the device 3500 may be similar to the array of the device 1800, and the switches and decoupling capacitors of the device 3500 may be similar to those of the device 1700, which are also substantially similar to the switch 605 and the decoupling capacitors 621, 623 of FIGS. 6A, 6B, 6C, and 6D, discussed above. However, at least some of the embedded/integrated electromechanical power switches (e.g., MEMS/NEMS device) and plurality of integrated decoupling capacitors of the device 3500 also includes one or more input decoupling capacitors (e.g., DeCap on VDDin) having a larger area than one or more output decoupling capacitors (e.g., DeCap on VDDout), such as shown in FIGS. 34A/34B. Thus, in some examples for the device 3500, a capacitance of one or more input decoupling capacitors (e.g., DeCap on VDDin) of the array of the device 3500 is larger than a capacitance of one or more output decoupling capacitor (e.g., DeCap on VDDout) connected to the same device of the array to which the input decoupling capacitor is connected.

FIGS. 36A/36B illustrates an embodiment of a MEMS/NEMS device 3600 having integrated decoupling capacitors. The embodiments illustrated in FIGS. 36A/36B are substantially similar to the examples illustrated in FIGS. 17A/17B and 34A/34B. However, as shown in the examples of FIGS. 36A/36B, the device 3600 may include an input decoupling capacitor (e.g., DeCap on VDDin) while not including an output decoupling capacitor.

Referring now to FIGS. 37-50, and with reference first to FIGS. 37/38, illustrated therein is a top-view and cross-section view, respectively, of an embodiment of a 3D (e.g., vertical) multi-layer capacitor 3700 which may for example be implemented in and/or used in conjunction with the various MEMS/NEMS devices discussed above. FIGS. 39/40 illustrates an array 3900 (e.g., a 2×2 array), which may include an array of multi-layer capacitors (e.g., such as the multi-layer capacitor 3700), where the array 3900 may be implemented in and/or used in conjunction with the various MEMS/NEMS devices discussed above. It will understood that in various embodiments, the array 3900 may include any other number of devices to form an array of any of a variety of sizes (e.g., 3×3, 4×4, etc.), as desired for a particular application.

Figure 43:
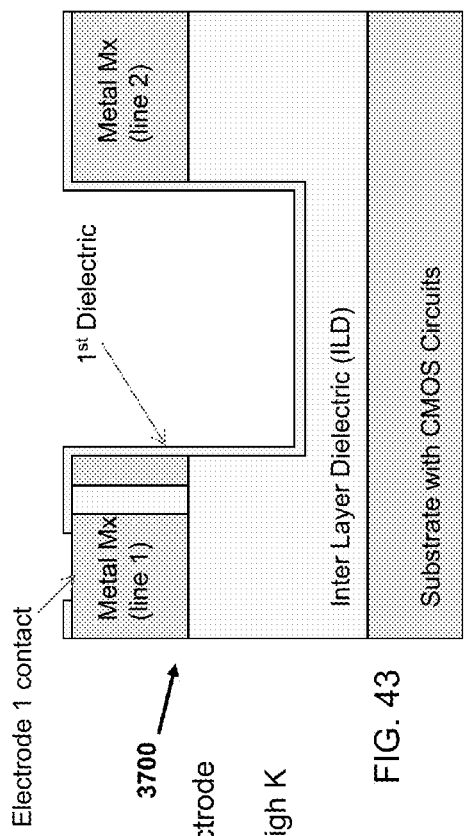
Figure 44:
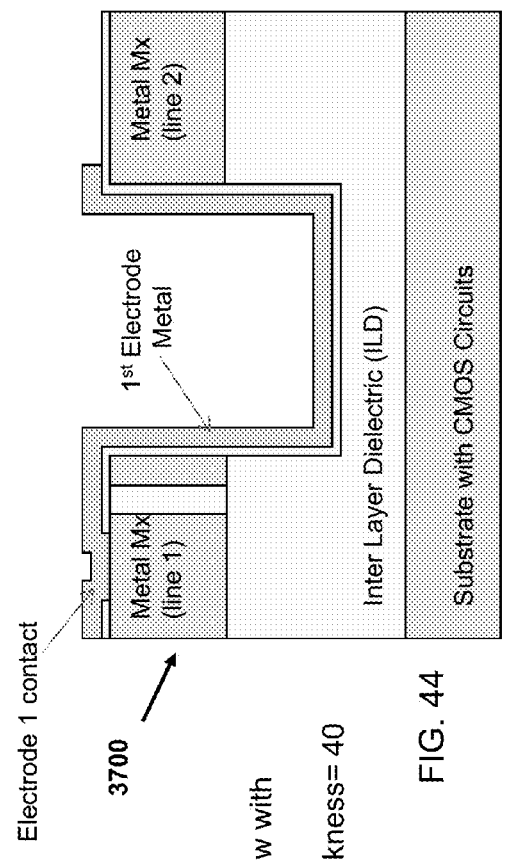
Figure 45:
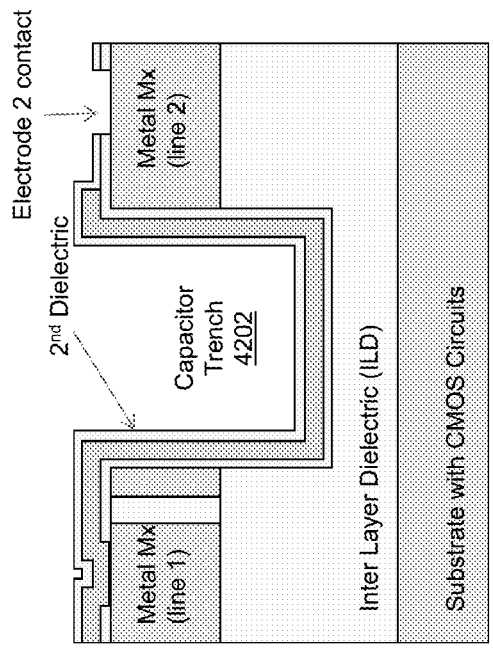
Figure 46:
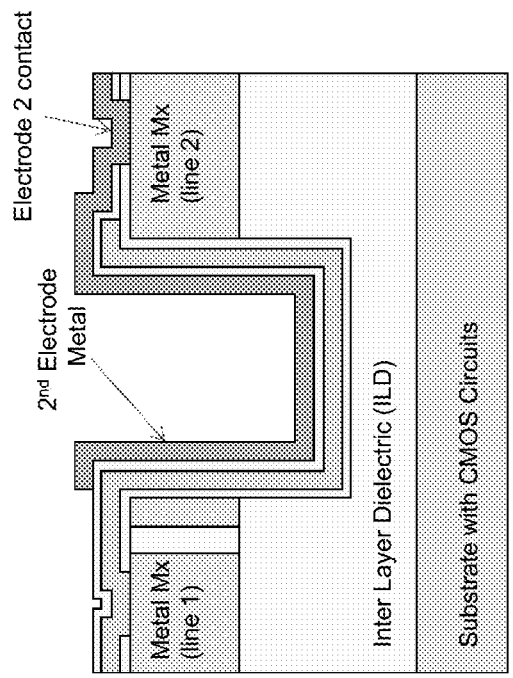
Figure 49:
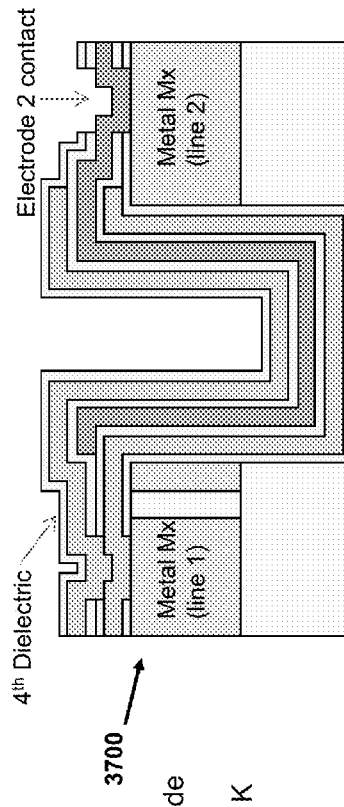
Figure 50:
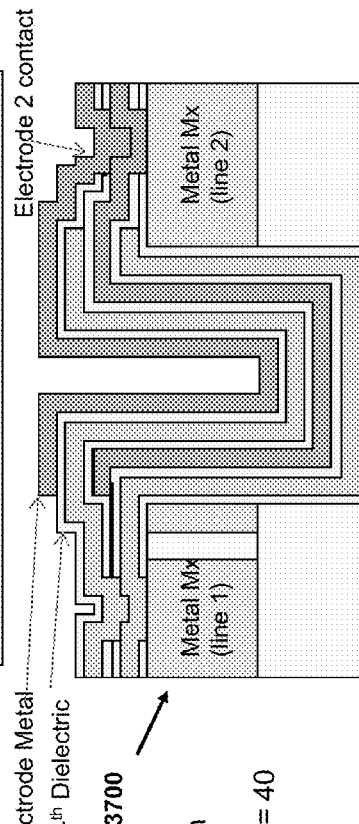

With reference to FIGS. 41-50, illustrated therein is a process flow which may be used to fabricate a multi-layer capacitor, for example, such as the multi-layer capacitors 3700. As shown in FIG. 41, illustrated therein is the device 3700 at an intermediate stage of processing. In particular and by way of example, FIG. 41 shows a CMOS wafer at a post-Mx processing stage. As shown in FIG. 42, a lithography patterning process and etching process may be performed to fabricate a capacitor trench 4202. Then, as shown in FIG. 43, a first dielectric may be deposited over the device 3700 and within the trench 4202. A first electrode (e.g., 'Electrode 1') contact may also be patterned and the first dielectric etched, so as to expose the Mx metal for the first electrode contact. Thereafter, as shown in FIG. 44, a first electrode metal layer may be deposited, followed by a lithography and etch process (e.g., to expose the first dielectric over a second electrode contact region). In FIG. 45, a second dielectric may be deposited over the device 3700 and within the trench 4202. A second electrode (e.g., 'Electrode 2') contact may also be patterned and the underlying first and second dielectric etched, so as to expose the Mx metal for the second electrode contact. Thereafter, as shown in FIG. 46, a second electrode metal layer may be deposited, followed by a lithography and etch process (e.g., to remove the second electrode metal layer over the first electrode contact region). FIGS. 47, 48, 49, and 50 illustrate an example of repeating the steps of FIGS. 43, 44, 45, and 46, for example, to build up a capacitance of the device 3700. In various embodiments, the repetition of the steps of FIGS. 43, 44, 45, and 46, as shown in FIGS. 47, 48, 49, and 50, may be repeated as many times as desired in order to achieve a target capacitance value for the device 3700.

Figure 51:
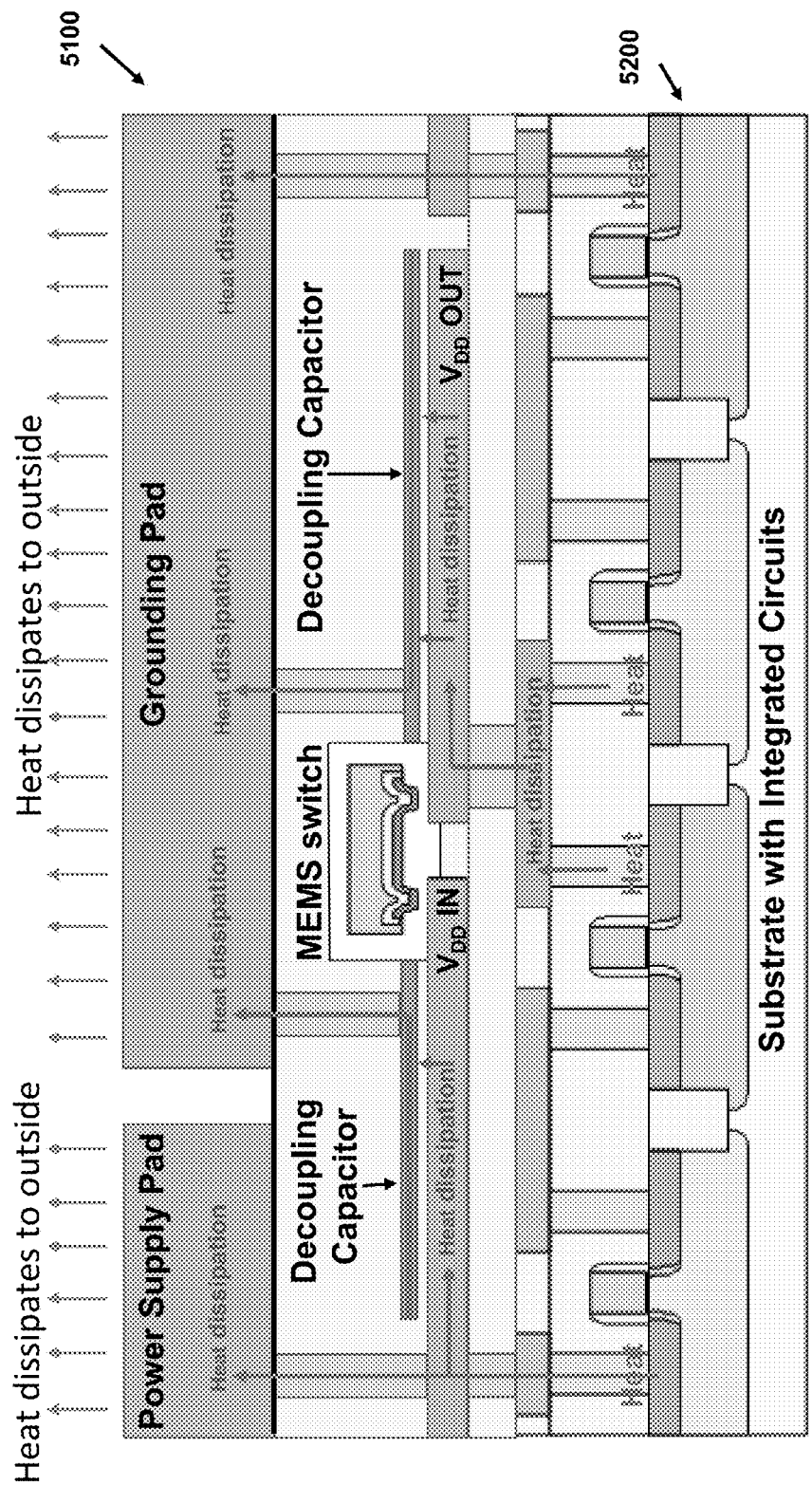
FIG. 51 illustrates a heat dissipation method using a MEMS/NEMS device having integrated decoupling capacitors, according to some embodiments.

With reference to FIG. 51, illustrated therein is a method of dissipating heat (transferring heat) using a MEMS/NEMS device 5100 having integrated decoupling capacitors, according to some embodiments. It is understood that the method of dissipating heat illustrated with reference to FIG. 51 may be applied to (used in conjunction with) various other embodiments of MEMS/NEMS devices discussed herein, for example, with reference to other figures of this disclosure. In some examples, the heat generated by high current flow (e.g., Joule heating) within the device 5100 may be dissipated through the electrode's materials of the decoupling capacitors. In some embodiments, heat may be generated by IC devices within an IC device layer 5200 of the substrate and channeled through one or more contacts, vias, metal interconnect layers, through electrodes of the decoupling capacitor(s), and through the power supply pad and/or grounding pad, such that the heat is dissipated outside of (away from) the device 5100, for example, to the surrounding ambient, to a coupled heatsink, or other convenient heat dissipation pathway. In some embodiments, larger decoupling capacitor electrode sizes (e.g., including area and thickness) provide for increased decoupling capacitance, as well as for quicker heat dissipation, thereby more quickly reducing an IC operating temperature, resulting in lower leakage current, better performance, and improved reliability.

Figure 52:
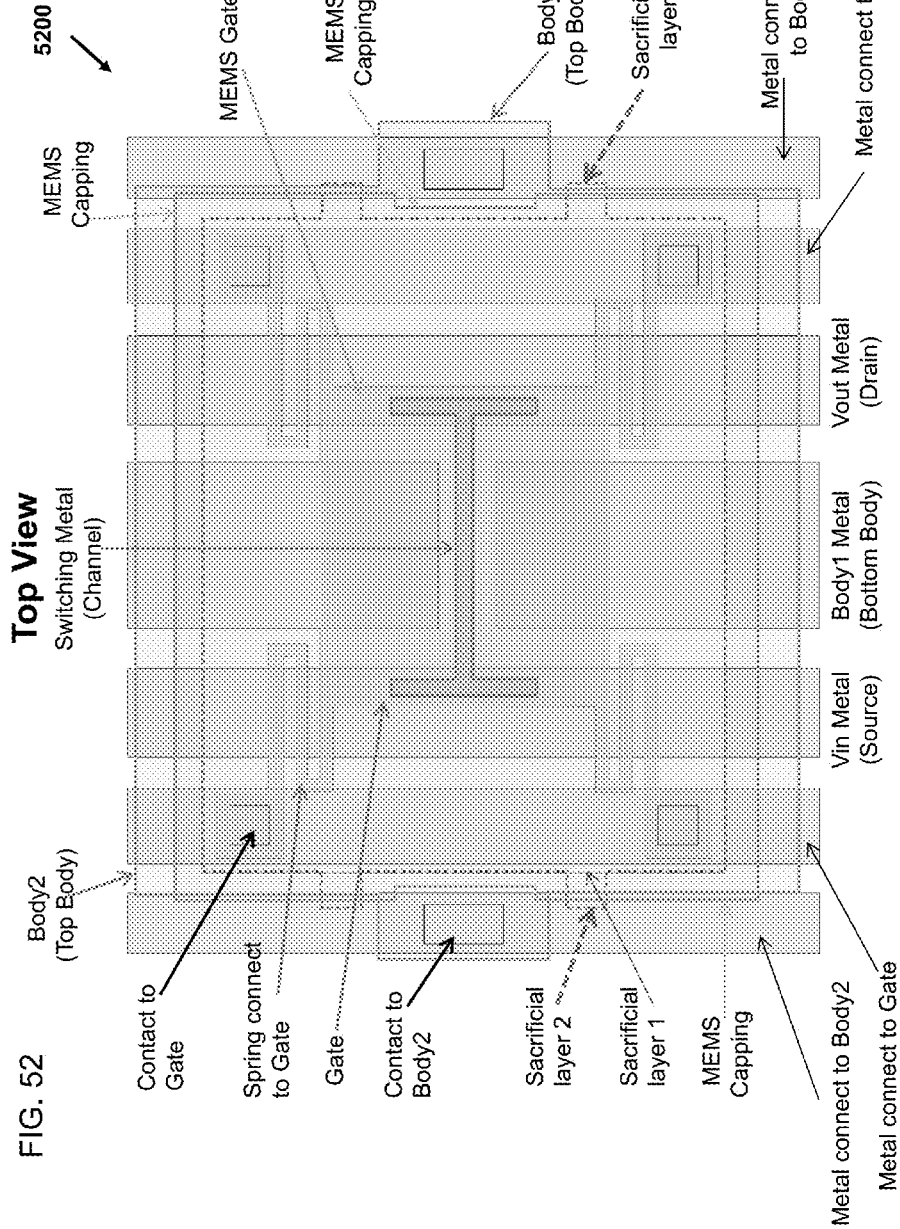
Figure 53:
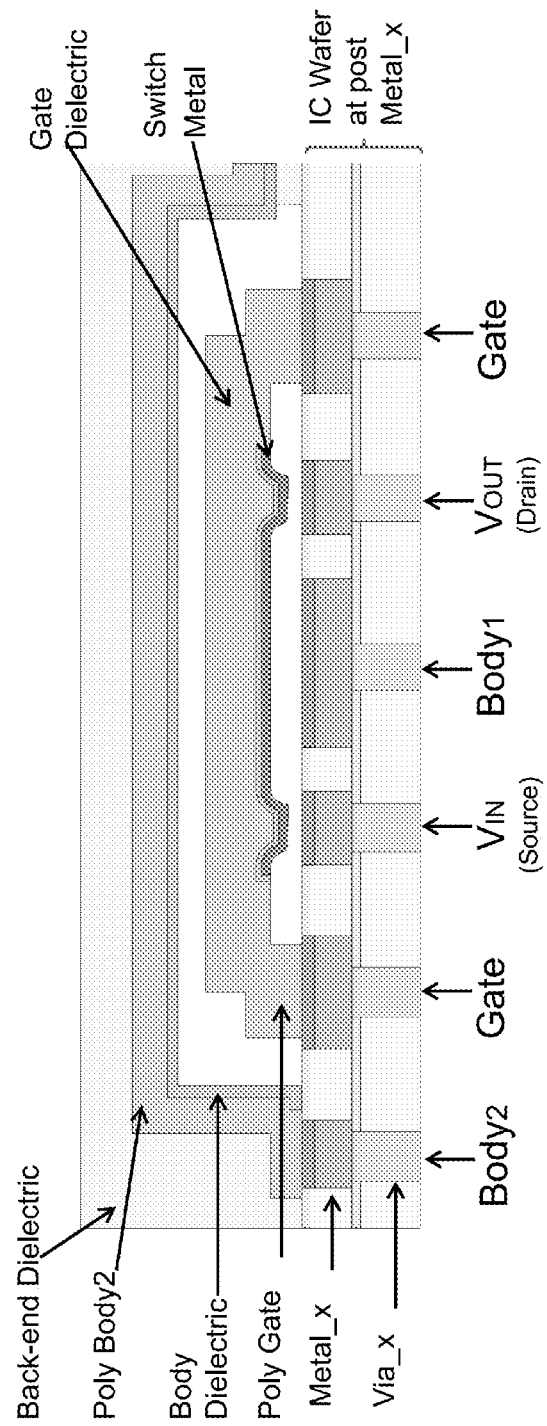

FIGS. 52, 53, 54, 55, 56, 57, and 58 illustrate some additional embodiments within the scope of the present disclosure. In particular, FIGS. 52, 53, 54, 55, 56, 57, and 58 illustrate the structure and operation of various embodiments of a MEMS/NEMS device useful for implementing a dual electrostatic forces (e.g., dual eForces) I-MEMS/I-NEMS structure. In some aspects, the embodiments discussed with respect to FIGS. 52, 53, 54, 55, 56, 57, and 58 may provide an alternative anti-stiction switching solution. Referring first to FIGS. 52 and 53, illustrated therein is a top view and a cross-section view, respectively, of an embodiment of a dual eForces MEMS/NEMS device 5200. In some examples, when an applied voltage at the bottom body (V_Body1) is equal to about Vdd (e.g., around 1V) and an applied voltage at the top body (V_Body2) is equal to about Vss (e.g., Ground or around 0V), then the dual eForces MEMS/NEMS device 5200 may function as a PMOS transistor. In some cases, when the applied voltage at the bottom body (V_Body1) is equal to about Vss (e.g., Ground or around 0V) and the applied voltage at the top body (V_Body2) is equal to about Vdd (e.g., around 1V), then the dual eForces MEMS/NEMS device 5200 may function as an NMOS transistor.

The operation of an embodiment of a dual eForces I-MEMS/I-NEMS structure is discussed in more detail with reference to FIGS. 54, 55, 56, and 57. For example, FIG. 54 illustrates an embodiment of a dual eForces MEMS/NEMS device 5400 turning on/switching on, or turned on/switched on, and functioning as a PMOS transistor. By way of example, the applied voltage between the bottom body (Body1) and the Gate may create an electrostatic force (Felec) that pushes the movable gate downward, turning on the device. The electrostatic force turning on the device may be greater than the spring force, as shown. FIG. 55 illustrates an embodiment of the dual eForces MEMS/NEMS device 5400 turning off/switching off, or turned off/switched off, and functioning as a PMOS transistor. By way of example, the applied voltage between the top body (Body2) and the Gate may create a reverse electrostatic force (Felec) that pulls the movable gate upward, turning off the device. The electrostatic force turning off the device, plus the spring force, may be greater than the stiction force, as shown. In some embodiments, the dual eForces MEMS/NEMS device 5400 provides a substantially (about 100%) stiction free solution.

Figure 58:
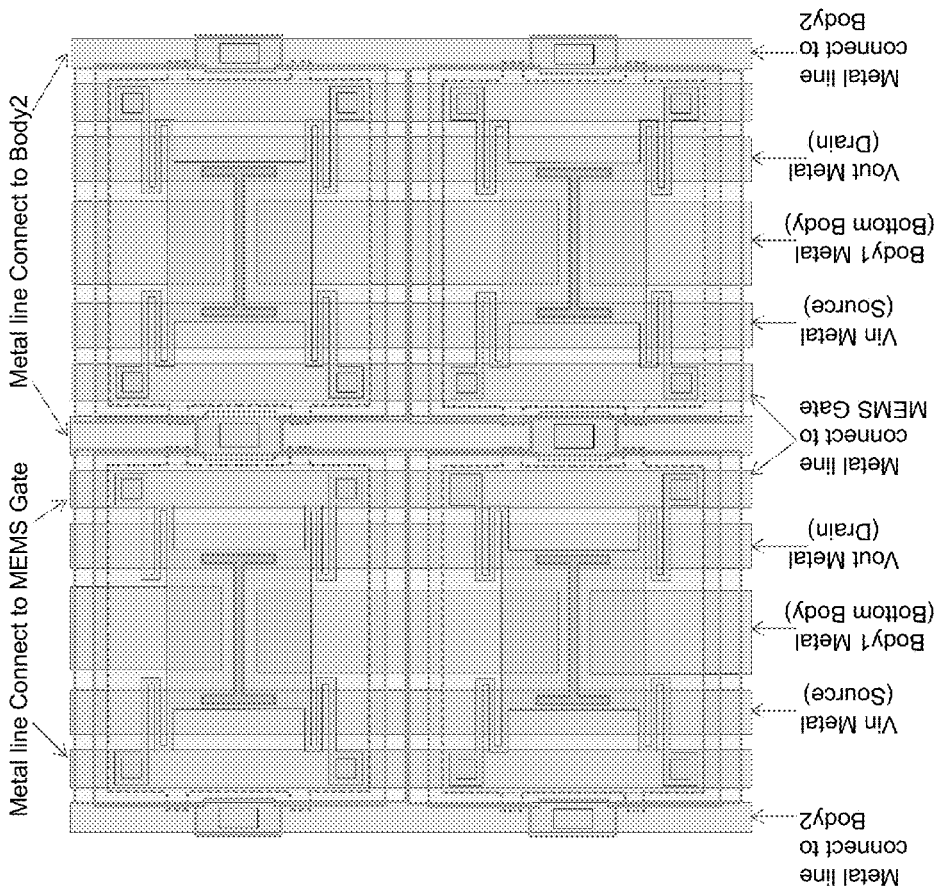

Referring now to FIG. 56, illustrated therein is an embodiment of the dual eForces MEMS/NEMS device 5400 turning on/switching on, or turned on/switched on, and functioning as an NMOS transistor. As discussed above, the polarity of voltages applied to the bottom body and top body (Body 1/Body 2) may be reversed in order to switch operation between PMOS and NMOS transistor types. By way of example, and as shown in FIG. 56, the applied voltage between the bottom body (Body1) and the Gate may create an electrostatic force (Felec) that pushes the movable gate downward, turning on the device. The electrostatic force turning on the device may be greater than the spring force, as shown. FIG. 57 illustrates an embodiment of the dual eForces MEMS/NEMS device 5400 turning off/switching off, or turned off/switched off, and functioning as an NMOS transistor. By way of example, the applied voltage between the top body (Body2) and the Gate may create a reverse electrostatic force (Felec) that pulls the movable gate upward, turning off the device. The electrostatic force turning off the device, plus the spring force, may be greater than the stiction force, as shown. It will be understood that the above structures are merely exemplary, and various embodiments may include different MEMS/NEMS devices or circuit implementations, for example having different dimensions and/or configurations, as defined for a particular technology and/or device, circuit, or process requirement, without departing from the scope of this disclosure. As merely one example, FIG. 58 illustrates a top view of an embodiment of a dual eForces MEMS/NEMS circuit 5800 including a plurality of dual eForces MEMS/NEMS devices. It will understood that in various embodiments, the circuit 5800 may include any other number of devices to form an array of any of devices of a variety of sizes (e.g., 3×3, 4×4, etc.), as desired for a particular application.

Figure 67:
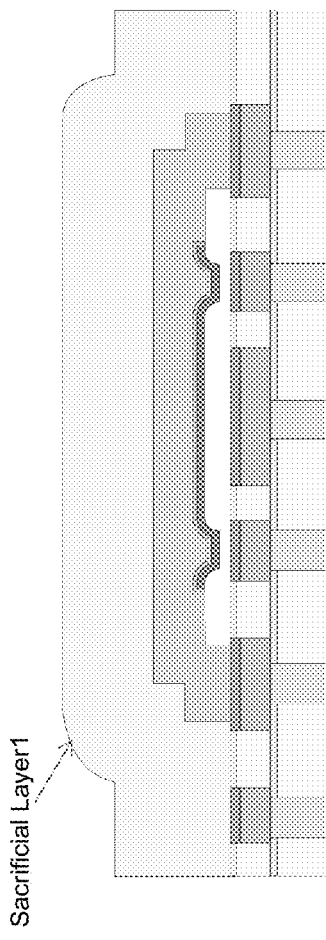
Figure 68:
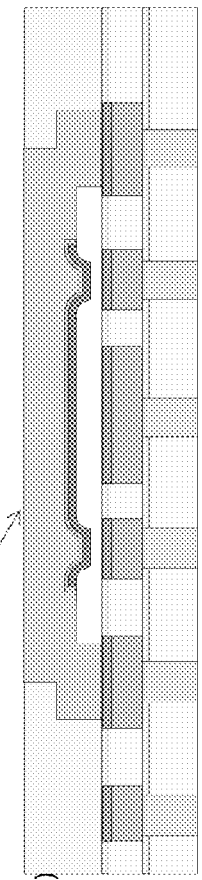
Figure 69:
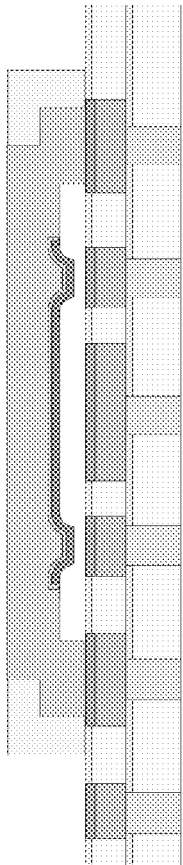
Figure 70:
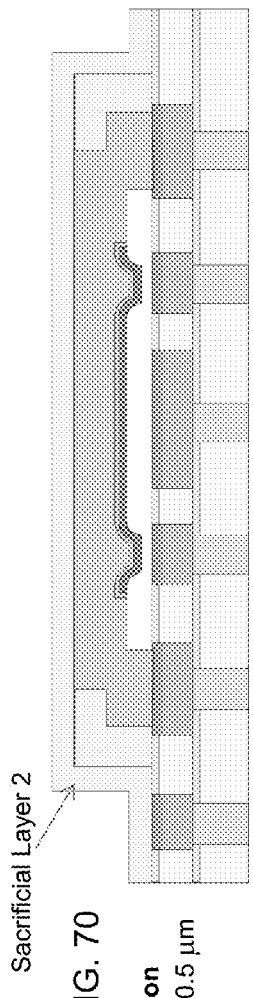
Figure 71:
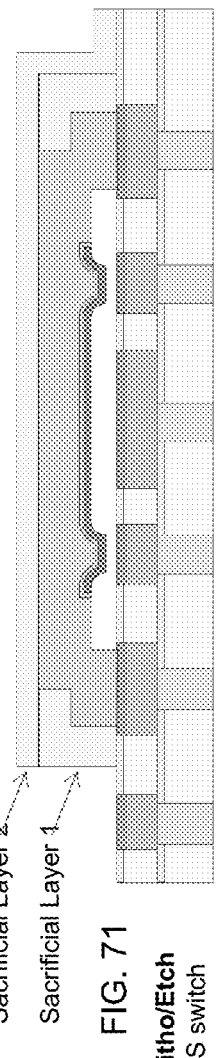
Figure 72:
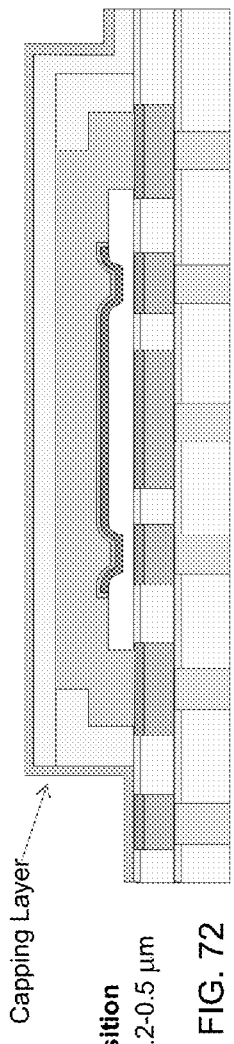
Figure 73:
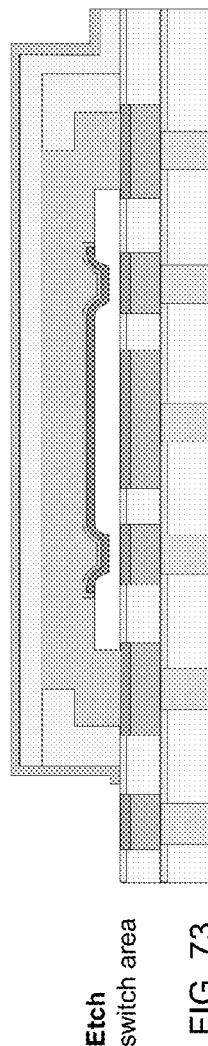
Figure 74:
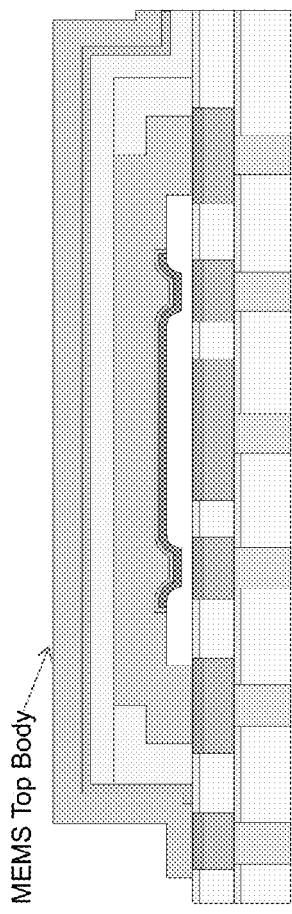
Figure 75:
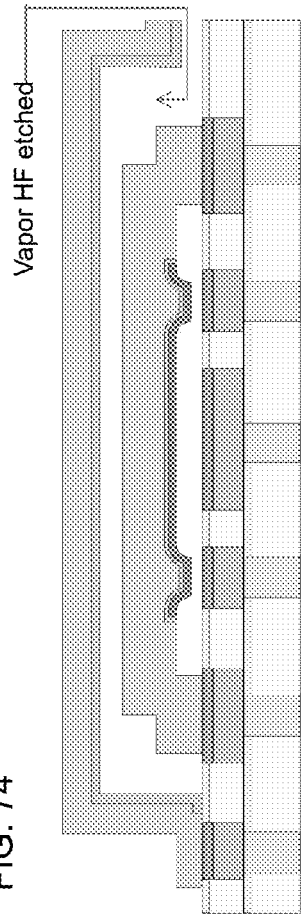
Figure 76:
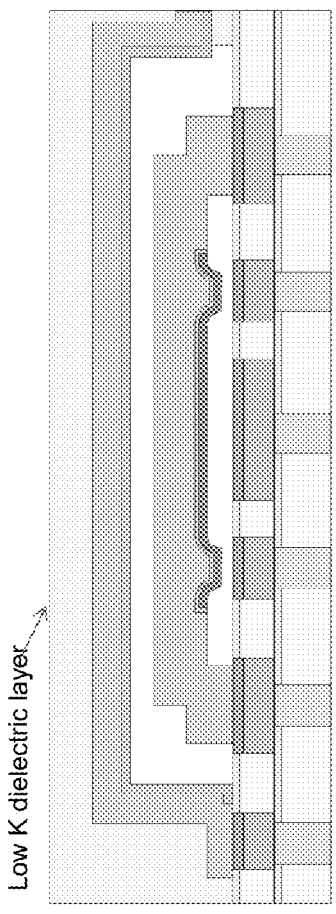

With reference to FIGS. 59-76, illustrated therein is a process flow which may be used to fabricate dual eForces MEMS/NEMS devices and/or circuits, for example such as the dual eForces MEMS/NEMS device 5200, the dual eForces MEMS/NEMS device 5400, and the dual eForces MEMS/NEMS circuit 5800. As shown in FIG. 59, illustrated therein is the device 5900 at an intermediate stage of processing. In particular and by way of example, FIG. 59 shows a CMOS wafer at a post-Mx processing stage. As shown in FIG. 60, a first low temperature oxide is deposited and subsequently patterned and etched at contact dimples and decoupling capacitor (DeCap) areas. Thereafter, as shown in FIGS. 61 and 62, a second low temperature oxide and switching metal are deposited, and the switching metal is patterned and etched to form the switch contact and DeCap electrode regions. As shown in FIG. 63, a MEMS/NEMS gate dielectric may then be deposited. Following that, a contact lithography and etch process may be performed to define a MEMS/NEMS gate contact region (FIG. 64). Referring to FIG. 65, the MEMS/NEMS gate material is deposited (e.g., such as polysilicon), and a MEMS/NEMS gate lithography and etch process is performed to define the movable gate and DeCap regions. As shown in FIG. 66, a movable MEMS/NEMS gate release process is performed, which may include an oxide etching process to release the movable structures. Referring to FIGS. 67 and 68, a first sacrificial layer may be deposited and a CMP process performed, where the CMP process may be designed to stop at the MEMS/NEMS gate (e.g., polysilicon MEMS/NEMS gate). As shown in FIG. 69, a first sacrificial layer lithography and etching process may be performed to define an area for MEMS/NEMS switch capping. With reference to FIGS. 70 and 71, a second sacrificial layer is deposited and a second sacrificial layer lithography and etching process may be performed to define an area for the MEMS/NEMS switch. As shown in FIGS. 72 and 73, a capping layer is then deposited, and a capping layer lithography and etching process is performed to protect the area of the MEMS/NEMS switch. FIG. 74 illustrates deposition of a top body layer, followed by a top body lithography and etching process to define the top body pattern. As shown in FIG. 75, the sacrificial layers (e.g., the first and second sacrificial layers) may be etched, for example, using a vapor HF etching process or other appropriate process. Thereafter, as shown in FIG. 76, a back-end dielectric may be deposited. While FIGS. 59-76 provide some examples of materials and processes that may be used to perform a given step and/or to form a given layer, it will be understood that such examples are merely exemplary, and other appropriate materials and/or processes may equivalently be used without departing from the scope of the present disclosure. As one example, various materials, processes, and technologies which may be implemented in various embodiments throughout the present disclosure are described by Hongwei Qu, "CMOS MEMS Fabrication Technologies and Devices", *Micromachines*, 2016, 7, 14, the contents of which are hereby incorporated by reference in their entirety.

While the invention has been described with reference to exemplary embodiments, it will be understood by those skilled in the art that various changes may be made and equivalents may be substituted for elements thereof without departing from the scope of the invention. For example, Appendix A, which includes an appendix to the present specification, includes a slide deck illustrating various additional embodiments, in accordance with one or more embodiments described herein. The contents of Appendix A are incorporated by reference herein in their entirety. In addition, many modifications may be made to adapt a particular system, device or component thereof to the teachings of the invention without departing from the essential scope thereof. Therefore, it is intended that the invention not be limited to the particular embodiments disclosed for carrying out this invention, but that the invention will include all embodiments falling within the scope of the appended claims. Moreover, the use of the terms first, second, etc. do not denote any order or importance, but rather the terms first, second, etc. are used to distinguish one element from another.

Furthermore, while the above discussion is meant to be illustrative of the principles and various embodiments of the present invention, numerous variations and modifications will become apparent to those skilled in the art once the above disclosure is fully appreciated. For example, unless otherwise indicated, any one or more of the layers set forth herein can be formed in any number of suitable ways (e.g., with spin-on techniques, sputtering techniques (e.g., magnetron and/or ion beam sputtering), thermal growth techniques, deposition techniques such as chemical vapor deposition (CVD), physical vapor deposition (PVD) and/or plasma enhanced chemical vapor deposition (PECVD), or atomic layer deposition (ALD)). Also, unless otherwise indicated, any one or more of the layers can be patterned in any suitable manner (e.g., via lithographic and/or etching techniques). It is intended that the following claims be interpreted to embrace all such variations and modifications.

What is claimed is:

1. A semiconductor device comprising:
   a semiconductor substrate;
   at least one integrated circuit device on a front surface of the semiconductor substrate;
   an insulating layer on the at least one integrated circuit device; and
   an electromechanical power switch on the insulating layer, the electromechanical power switch including:
      a source and a drain;
      a body region disposed between the source and the drain, wherein the body region includes a first body portion and a second body portion spaced a distance from the first body portion and defining a body discontinuity therebetween; and
      a gate including a switching metal layer, wherein the switching metal layer is disposed over the body discontinuity.

2. The semiconductor device of claim 1, wherein the switching metal layer has a width less than the distance between the first and second body portions.

3. The semiconductor device of claim 1, further comprising:
   a first decoupling capacitor including a first dielectric layer formed over at least one of the source and the drain and a first electrode formed over the first dielectric layer.

4. The semiconductor device of claim 3, further comprising:
   a second decoupling capacitor including a second dielectric layer formed over the other of the at least one of the source and the drain and a second electrode formed over the second dielectric layer.

5. The semiconductor device of claim 4, wherein the first and second dielectric layers include a low-temperature oxide layer.

6. The semiconductor device of claim 1, further comprising:
   another electromechanical power switch formed over at least one of the source and the drain and adjacent to the electromechanical power switch, wherein the another electromechanical power switch is operable, while in an actuated configuration, to operate as a first decoupling capacitor.

7. The semiconductor device of claim 1, wherein the body discontinuity includes a low-K dielectric layer, and wherein the switching metal layer is disposed over the low-K dielectric layer.

8. The semiconductor device of claim 1, further comprising:
   an opening in the insulating layer; and
   a metal layer formed within the opening, wherein the metal layer electrically couples the electromechanical power switch to the at least one integrated circuit device.

9. The semiconductor device of claim 1, wherein the gate of the electromechanical power switch includes a polysilicon layer coupled to the switching metal layer, wherein the polysilicon layer includes a plurality of openings, and wherein the plurality of openings expose an underlying layer.

10. An electromechanical power switch comprising:
    a source and a drain;
    a body region disposed between the source and the drain, wherein the body region includes a discontinuity that exposes an underlying layer; and
    a gate including a switching metal layer, wherein the switching metal layer overlaps the underlying layer.

11. The electromechanical power switch of claim 10, wherein the underlying layer includes a semiconductor layer.

12. The electromechanical power switch of claim 10, wherein the underlying layer includes an integrated circuit (IC) device layer of a substrate.

13. The electromechanical power switch of claim 10, wherein the switching metal layer is operable to connect the source and the drain to each other in response to an applied electrostatic force.

14. The electromechanical power switch of claim 10, wherein the underlying layer includes a dielectric layer formed over an integrated circuit (IC) device layer of a substrate.

15. The electromechanical power switch of claim 10, wherein the discontinuity defines a spacing between first and second body portions, and wherein the switching metal layer has a width that is substantially equal to or less than the spacing between the first and second body portions at least over the discontinuity.

16. The electromechanical power switch of claim 10, further comprising a first integrated decoupling capacitor including a first electrode, a second electrode, and a first dielectric layer interposing the first and second electrodes, wherein the first electrode includes one of the source and the drain.

17. The electromechanical power switch of claim 16, further comprising a second integrated decoupling capacitor including a third electrode, a fourth electrode, and a second dielectric layer interposing the third and fourth electrodes, wherein the third electrode includes the other of the source and the drain.

18. A semiconductor device comprising:
a semiconductor substrate;
at least one integrated circuit device on a front surface of the semiconductor substrate, wherein the at least one integrated circuit device includes at least one circuit block;
a dielectric layer on the at least one integrated circuit device; and
a first electromechanical power switch on the dielectric layer, wherein the first electromechanical power switch gates a voltage supply to the at least one circuit block, and wherein the first electromechanical power switch includes:
  a first discontinuous body region, wherein the first discontinuous body region includes a first body portion spaced a first distance from a second body portion and defining a first body spacing therebetween;
  first source and drain regions formed adjacent to and on either side of the first discontinuous body region; and
  a first gate electrode including a first switching metal layer, wherein the first switching metal layer is operable to connect the first source and drain regions to each other while the first switching metal layer remains disposed over the first body spacing.

19. The semiconductor device of claim 18, wherein the at least one integrated circuit device further includes at least one power switch circuit, wherein the first electromechanical power switch is actuated using the at least one power switch circuit, and wherein the at least one circuit block is alternately switched between an on-state and an off-state in response to actuation of the first electromechanical power switch.

20. The semiconductor device of claim 18, further comprising:
a second electromechanical power switch on the dielectric layer, wherein the second electromechanical power switch gates a voltage supply to the at least one integrated circuit device, and wherein the second electromechanical power switch includes:
  a second discontinuous body region, wherein the second discontinuous body region includes a third body portion spaced a second distance from a fourth body portion and defining a second body spacing therebetween;
  second source and drain regions formed adjacent to and on either side of the second discontinuous body region; and
  a second gate electrode including a second switching metal layer, wherein the second switching metal layer is operable to connect the second source and drain regions to each other while the second switching metal layer remains disposed over the second body spacing.

21. The semiconductor device of claim 20, wherein the at least one integrated circuit device further includes at least one power switch circuit, wherein the second electromechanical power switch is actuated using the at least one power switch circuit, and wherein the at least one integrated circuit is alternately switched between an on-state and an off-state in response to actuation of the second electromechanical power switch.

22. The semiconductor device of claim 20, wherein the second switching metal layer has a second width less than a width of the second body spacing.

23. The semiconductor device of claim 20, wherein the second electromechanical power switch includes at least one integrated decoupling capacitor including a first electrode, a second electrode, and a capacitor dielectric layer interposing the first and second electrodes, wherein the first electrode includes one of the second source and the drain regions.

24. The semiconductor device of claim 18, wherein the first switching metal layer has a first width less than a width of the first body spacing.

25. The semiconductor device of claim 18, wherein the first electromechanical power switch includes at least one integrated decoupling capacitor including a first electrode, a second electrode, and a capacitor dielectric layer interposing the first and second electrodes, wherein the first electrode includes one of the first source and the drain regions.

26. An electromechanical power switch comprising:
a source and a drain;
a bottom body region disposed between the source and the drain;
a gate including a switching metal layer, wherein the switching metal layer is operable to connect the source and the drain to each other in response to an applied electrostatic force; and
a top body region disposed over the gate;
wherein the electromechanical power switch is configured for application of a first voltage by way of the bottom body, a second voltage by way of the top body, and a third voltage by way of the gate; and
wherein a first voltage difference between the first and third voltages is operable to provide a first electrostatic force, a second voltage difference between the second and third voltages is operable to provide a second electrostatic force, and the first and second electrostatic forces are operable to provide the applied electrostatic force.

27. The electromechanical power switch of claim 26, wherein the bottom body region includes a discontinuity that exposes an underlying layer, and wherein the switching metal layer overlaps the underlying layer.

28. The electromechanical power switch of claim 26, wherein the electromechanical power switch is operable as one of (i) a p-type transistor, when the first voltage is greater than the second voltage; and (ii) an n-type transistor, when the first voltage is less than the second voltage.

29. The electromechanical power switch of claim 28, wherein while the electromechanical power switch is operable as the p-type transistor and when the third voltage is equal to about the second voltage, the applied electrostatic force moves the gate toward the bottom body region, thereby connecting the source and the drain to each other by way of the switching metal layer, and when the third voltage is equal to about the first voltage, the applied electrostatic force moves the gate away from the bottom body region, thereby disconnecting the source and the drain from each other.

30. The electromechanical power switch of claim 28, wherein while the electromechanical power switch is operable as the n-type transistor and when the third voltage is equal to about the second voltage, the applied electrostatic force moves the gate toward the bottom body region, thereby connecting the source and the drain to each other by way of the switching metal layer, and when the third voltage is equal to about the first voltage, the applied electrostatic force moves the gate away from the bottom body region, thereby disconnecting the source and the drain from each other.

* * * * *